(12) United States Patent
Itonaga et al.

(10) Patent No.: US 9,087,760 B2
(45) Date of Patent: *Jul. 21, 2015

(54) SEMICONDUCTOR DEVICE AND METHOD OF MANUFACTURING THE SAME, AND ELECTRONIC APPARATUS

(71) Applicant: Sony Corporation, Tokyo (JP)

(72) Inventors: Kazuichiro Itonaga, Tokyo (JP); Machiko Horiike, Kanagawa (JP)

(73) Assignee: SONY CORPORATION (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/926,906

(22) Filed: Jun. 25, 2013

(65) Prior Publication Data

US 2013/0285186 A1 Oct. 31, 2013

Related U.S. Application Data

(63) Continuation of application No. 12/962,854, filed on Dec. 8, 2010, now Pat. No. 8,514,308.

(30) Foreign Application Priority Data

Dec. 25, 2009 (JP) .................................. 2009-294698

(51) Int. Cl.
*H04N 3/14* (2006.01)
*H01L 23/52* (2006.01)
(Continued)

(52) U.S. Cl.
CPC .... *H01L 27/14647* (2013.01); *H01L 21/76898* (2013.01); *H01L 23/481* (2013.01); *H01L 23/552* (2013.01); *H01L 27/1464* (2013.01); *H01L 27/1469* (2013.01); *H01L 27/14603* (2013.01); *H01L 27/14634* (2013.01);
(Continued)

(58) Field of Classification Search
USPC ........................................ 348/294, 340, 308
See application file for complete search history.

(56) References Cited

U.S. PATENT DOCUMENTS

2009/0206337 A1 8/2009 Jun
2009/0294814 A1* 12/2009 Assefa et al. ................. 257/292
(Continued)

FOREIGN PATENT DOCUMENTS

CN 101228631 7/2008
CN 101840925 9/2010
(Continued)

OTHER PUBLICATIONS

Official Action (no English translation available) for Japanese Patent Application No. 2010279833 mailed Jul. 22, 2014, 5 pages.
Official Action (with English translation) for Chinese Patent Application No. 201110404627.X dated Apr. 1, 2015, 27 pages.

*Primary Examiner* — Sinh Tran
*Assistant Examiner* — Shahbaz Nazrul
(74) *Attorney, Agent, or Firm* — Sheridan Ross P.C.

(57) ABSTRACT

A semiconductor device comprising a first semiconductor section including a first wiring layer at one side thereof, a second semiconductor section including a second wiring layer at one side thereof, the first and second semiconductor sections being secured together with the respective first and second wiring layer sides of the first and second semiconductor sections facing each other, a conductive material extending through the first semiconductor section to the second wiring layer of the second semiconductor section and by means of which the first and second wiring layers are in electrical communication.

22 Claims, 47 Drawing Sheets

(51) Int. Cl.
*H01L 27/146* (2006.01)
*H04N 5/374* (2011.01)
*H01L 21/768* (2006.01)
*H01L 23/48* (2006.01)
*H01L 23/552* (2006.01)
*H01L 31/02* (2006.01)

(52) U.S. Cl.
CPC .... *H01L27/14636* (2013.01); *H01L 27/14638* (2013.01); *H01L 27/14687* (2013.01); *H04N 5/374* (2013.01); *H01L 31/02002* (2013.01); *H01L 2224/45147* (2013.01); *H01L 2924/00014* (2013.01); *H01L 2924/01015* (2013.01); *H01L 2924/01047* (2013.01); *H01L 2924/3011* (2013.01)

(56) References Cited

U.S. PATENT DOCUMENTS

| | | |
|---|---|---|
| 2010/0238331 A1 | 9/2010 | Umebayashi et al. |
| 2010/0276572 A1 | 11/2010 | Iwabuchi et al. |
| 2010/0285655 A1 | 11/2010 | Sakai |

FOREIGN PATENT DOCUMENTS

| | | |
|---|---|---|
| JP | 2005-322745 | 11/2005 |
| JP | 2006-019653 | 1/2006 |
| JP | 2006-049361 | 2/2006 |
| JP | 2007-180363 | 7/2007 |
| WO | WO 2006/129762 | 12/2006 |
| WO | WO 2008/074688 | 6/2008 |

* cited by examiner

SEMICONDUCTOR DEVICE AND METHOD OF MANUFACTURING THE SAME, AND ELECTRONIC APPARATUS

CROSS REFERENCE TO RELATED APPLICATION

The present application is a continuation of U.S. patent application Ser. No. 12/962,854 filed Dec. 8, 2010, and claims the benefit of Japanese Patent Application JP 2009-294698 filed in the Japanese Patent Office on Dec. 25, 2009, the entire contents of which are incorporated herein by reference.

BACKGROUND OF THE INVENTION

The present invention relates to a semiconductor device such as a solid-state imaging device, a method of manufacturing the same, and an electronic apparatus such as a camera with the solid-state imaging device.

Solid-state imaging devices include an amplification type solid-state imaging device of which an illustrative example is a MOS image sensor such as a CMOS (Complementary Metal Oxide Semiconductor). In addition, solid-state imaging devices include a charge-transfer type solid-state imaging device of which an illustrative example is a CCD (Charge Coupled Device) image sensor. These solid-state imaging devices are widely used in digital still cameras, digital video cameras, and the like. In recent years, MOS image sensors have widely been used as solid-state imaging devices mounted on mobile apparatuses such as portable phones with an attached camera or PDAs (Personal Digital Assistant), in terms of low power voltage, power consumption, and the like.

A MOS solid-state imaging device includes a pixel array (pixel region), where a plurality of unit pixels each including a photodiode serving as a photoelectric conversion unit and a plurality of pixel transistors are arranged in the form of a two-dimensional array, and a peripheral circuit region. The plurality of pixel transistors are formed as MOS transistors and include three transistors of a transfer transistor, a reset transistor, and an amplification transistor, or include four transistors, including a selection transistor.

In the past, various MOS solid-state imaging devices were suggested in which a semiconductor chip in which a pixel array arranging a plurality of pixels is formed and a semiconductor chip in which a logic circuit performing a signal process is formed are electrically connected to each other to form one device. Japanese Unexamined Patent Application Publication No. 2006-49361 discloses a semiconductor module in which a back-illuminated image sensor chip including a micropad in each pixel cell and a signal processing chip including a signal processing circuit and micropads are connected to each other by a microbump.

International Publication No. WO 2006/129762 discloses a semiconductor image sensor module in which a first semiconductor chip including an image sensor, a second semiconductor chip including an analog/digital converter array, and a third semiconductor chip including a memory element array are stacked. The first and second semiconductor chips are connected to each other by a bump which is a conductive connection conductor. The second and third semiconductor chips are connected to each other by a through contact penetrated through the second semiconductor chip.

As disclosed in Japanese Unexamined Patent Application Publication No. 2006-49361, various techniques for combining different kinds of circuit chips such as an image sensor chip and a logic circuit performing signal processing have been suggested. In techniques according to a related art, functional chips in a nearly completed state are connected to each other by forming a through connection hole or via a bump.

The inventors have recognized a problem with bonded semiconductor chip sections where pair ground capacitance and adjacent coupling capacitance occur as parasitic capacitance. The pair ground capacitance is parasitic capacitance occurring between a wiring and a semiconductor substrate, for example, with a ground potential. The adjacent coupling capacitance is parasitic capacitance between adjacent laying wirings or adjacent conductors. While the counter ground capacitance may be cleared when a power source is enhanced or a buffer circuit is provided to allow current to flow, the adjacent coupling capacitance may not be cleared due to interference between adjacent lines.

This problem with the parasitic capacitance may also arise in a semiconductor device in which semiconductor chip sections each including a semiconductor integrated circuit are bonded to each other and both the semiconductor chip sections are connected by a connection conductor and a through connection conductor.

It is desirable to provide a semiconductor device such as a solid-state imaging device reducing parasitic capacitance to achieve high performance and a method of manufacturing the semiconductor device. It is desirable to provide an electronic apparatus, such as a camera, which includes the solid-state imaging device.

SUMMARY OF THE INVENTION

One embodiment consistent with the present invention provides a semiconductor device comprising a first semiconductor section including a first wiring layer at one side thereof, a second semiconductor section including a second wiring layer at one side thereof, the first and second semiconductor sections being secured together with the respective first and second wiring layer sides of the first and second semiconductor sections facing each other, and a conductive material extending through the first semiconductor section to the second wiring layer of the second semiconductor section and by means of which the first and second wiring layers are in electrical communication.

In another embodiment consistent with the present invention, the first semiconductor section and the second semiconductor section are secured by plasma bonding.

In another embodiment consistent with the present invention, the first semiconductor section and the second semiconductor section are secured by an adhesive.

In another embodiment consistent with the present invention, the semiconductor device includes a control region between a pixel array region and a removal region.

In another embodiment consistent with the present invention, the conductive material is formed in the removal region of the semiconductor device.

In another embodiment consistent with the present invention, a portion of the first semiconductor in the removal region is removed.

In another embodiment consistent with the present invention, the semiconductor device further comprises a light shielding film formed over the first semiconductor section in the control region of the semiconductor device.

Another embodiment consistent with the present invention provides, a method of manufacturing a semiconductor device including the steps of forming a first semiconductor section including a first wiring layer at one side thereof, forming a second semiconductor section including a second wiring layer at one side thereof, bonding the first semiconductor section to the second semiconductor section with the respective first and second wiring layer sides of the first and second semiconductor sections facing each other, and providing a conductive material extending through the first semiconductor section to the second wiring layer of the second semiconductor section so that the first and second wiring layers are in electrical communication.

In another embodiment consistent with the present invention, the first semiconductor section and the second semiconductor section are secured by plasma bonding.

In another embodiment consistent with the present invention, the first semiconductor section and the second semiconductor section are secured by an adhesive.

In another embodiment consistent with the present invention, the semiconductor device includes a control region between a pixel array region and a removal region.

In another embodiment consistent with the present invention, the conductive material is formed in the removal region of the semiconductor device.

In another embodiment consistent with the present invention, a portion of the first semiconductor in the removal region is removed.

In another embodiment consistent with the present invention, the method includes the step of forming a light shielding film formed over the first semiconductor section in the control region of the semiconductor device.

Another embodiment consistent with the present invention includes a semiconductor device comprising a first semiconductor section including a first wiring layer on one side and a device layer on the opposite side of the first wiring layer, a second semiconductor section including a second wiring layer at one side thereof, the first and second semiconductor sections being secured together with the respective first and second wiring layer sides of the first and second semiconductor sections facing each other, a first conductive material which extends through the device layer of the first semiconductor section to a connection point in the first wiring layer of the first semiconductor section, and a second conductive material which extends through the first semiconductor section to a connection point in the second wiring layer of the second semiconductor section such that the first and second wiring layers are in electrical communication.

In another embodiment consistent with the present invention, the first semiconductor section and the second semiconductor section are secured by plasma bonding.

In another embodiment consistent with the present invention, the first semiconductor section and the second semiconductor section are secured by an adhesive.

In another embodiment consistent with the present invention, the semiconductor device includes a control region between a pixel array region and a removal region.

In another embodiment consistent with the present invention, the conductive material is formed in the removal region of the semiconductor device.

In another embodiment consistent with the present invention, a portion of the first semiconductor in the removal region is removed.

In another embodiment consistent with the present invention, the semiconductor device includes a light shielding film is formed over the first semiconductor section in the control region of the semiconductor device.

In another embodiment consistent with the present invention, the semiconductor device includes a connection point which connects an end portion of the first connecting material on the first semiconductor side of the semiconductor device to an end portion of the second semiconductor material on the first semiconductor side of the semiconductor device.

Another embodiment consistent with the present invention provides a method of manufacturing a semiconductor device including the steps of forming a first semiconductor section including a first wiring layer on one side and a device layer on the opposite side of the first wiring layer, forming a second semiconductor section including a second wiring layer at one side thereof, bonding the first semiconductor section to the second semiconductor section with the respective first and second wiring layer sides of the first and second semiconductor sections facing each other, providing a first conductive material which extends through the device layer of the first semiconductor section to a connection point in the first wiring layer of the first semiconductor section, providing a second conductive material parallel which extends through the first semiconductor section to a connection point in the second wiring layer of the second semiconductor section such that the first and second wiring layers are in electrical communication.

In another embodiment consistent with the present invention, the first semiconductor section and the second semiconductor section are secured by plasma bonding.

In another embodiment consistent with the present invention, the first semiconductor section and the second semiconductor section are secured by an adhesive.

In another embodiment consistent with the present invention, the semiconductor device includes a control region between a pixel array region and a removal region.

In another embodiment consistent with the present invention, the conductive material is formed in the removal region of the semiconductor device.

In another embodiment consistent with the present invention, a portion of the first semiconductor in the removal region is removed.

In another embodiment consistent with the present invention, the semiconductor device includes a light shielding film formed over the first semiconductor section in the control region of the semiconductor device.

Another embodiment consistent with the present invention provides an electronic apparatus including an optical unit and an imaging unit including (a) a first semiconductor section including a first wiring layer and a device layer on the first wiring layer, (b) a second semiconductor section including a second wiring layer at one side thereof, the first and second semiconductor sections being secured together with the respective first and second wiring layer sides of the first and second semiconductor sections facing each other, (c) a first conductive material which extends through the device layer of the first semiconductor section to a connection point in the first wiring layer of the first semiconductor section, and (d) a second conductive material which extends through the first semiconductor section to a connection point in the second wiring layer of the second semiconductor section such that the first and second wiring layers are in electrical communication.

In another embodiment consistent with the present invention, the apparatus includes a shutter device between the optical unit and the imaging unit.

Another embodiment consistent with the present invention provides an electronic apparatus including an optical unit and an imaging unit including (a) a first semiconductor section including a first wiring layer on one side and a device layer on the opposite side of the first wiring layer, (b) a second semiconductor section including a second wiring layer at one side thereof, the first and second semiconductor sections being secured together with the respective first and second wiring layer sides of the first and second semiconductor sections facing each other, (c) a first conductive material which extends through the device layer of the first semiconductor section to a connection point in the first wiring layer of the first semiconductor section, and (d) a second conductive material which extends through the first semiconductor section to a connection point in the second wiring layer of the second semiconductor section such that the first and second wiring layers are in electrical communication.

In another embodiment consistent with the present invention, the apparatus includes a shutter device between the optical unit and the imaging unit.

Other systems, methods, features, and advantages of the present invention will be or will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings.

DESCRIPTION OF THE PREFERRED EMBODIMENTS

Figure 1:
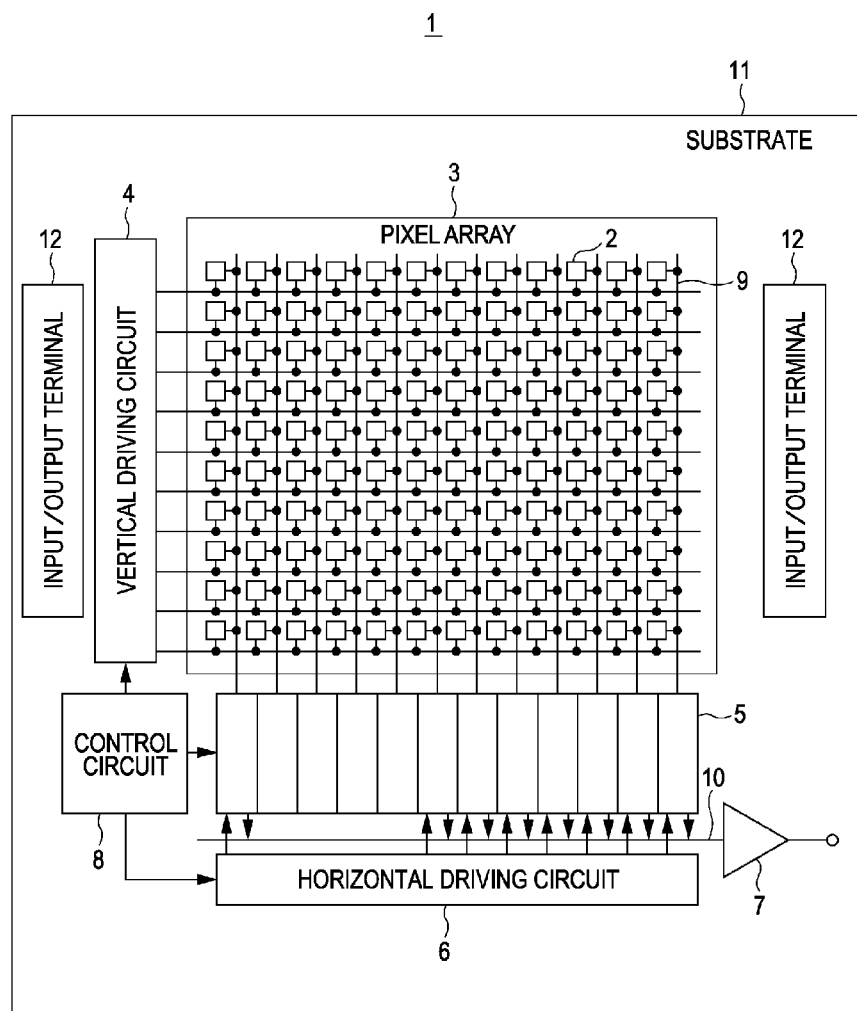
FIG. 1 is a diagram illustrating an exemplary overall configuration of a MOS solid-state imaging device that is consistent with the present invention.

FIG. 1 is a diagram illustrating the overall configuration of a MOS solid-state imaging device consistent with the present invention. As shown in FIG. 1, a solid-state imaging device 1 according to a first embodiment includes a pixel array (so-called pixel region) 3, in which a plurality of pixels 2 including a photoelectric conversion unit are regularly arranged in the form of a two-dimensional array on a semiconductor substrate 11 such as a silicon substrate, and a peripheral circuit section. The pixel 2 includes a photodiode serving as the photoelectric conversion unit and a plurality of pixel transistors (so-called MOS transistors). The plurality of pixel transistors includes three transistors, for example, a transfer transistor, a reset transistor, and an amplification transistor. Alternatively, the plurality of pixel transistors may include four transistors, including a selection transistor. Since the equivalent circuit of a unit pixel is the same as a general circuit, a detailed description thereof is omitted. The pixel 2 may be configured as one unit pixel. Alternatively, the pixel 2 may have a shared pixel structure. The shared pixel structure includes one floating diffusion and each different pixel transistor shared by a plurality of photodiodes and a plurality of transfer transistors. That is, in the shared pixel, the photodiodes and the transfer transistors forming the plurality of unit pixels each share other pixel transistors, respectively.

The peripheral circuit section includes a vertical driving circuit 4, column signal processing circuits 5, a horizontal driving circuit 6, an output circuit 7, and a control circuit 8.

The control circuit 8 receives data instructing an input clock, an operation mode, or the like and outputs data such as internal information regarding the solid-state imaging device. That is, based on a vertical synchronization signal, a horizontal synchronization signal, and a master clock, the control circuit 8 generates a clock signal and a control signal which are the references of the operations of the vertical driving circuit 4, the column signal processing circuits 5, the horizontal driving circuit 6, and the like. The control circuit 8 inputs these signals to the vertical driving circuit 4, the column signal processing circuits 5, the horizontal driving circuit 6, and the like.

The vertical driving circuit 4 formed by a shift register selects pixel driving wirings and supplies pulses for driving the pixel to the selected pixel driving wirings to drive the pixels in a column unit. That is, the vertical driving circuit 4 selectively scans the pixels 2 of the pixel array 3 sequentially in a vertical direction in a column unit and supplies the column signal processing circuits 5 with pixel signals corresponding to signal charges, which are generated in accordance with the amount of light received by the photodiodes serving as the photoelectric conversion units of the respective pixels 2, via the vertical signal lines 9.

The column signal processing circuit 5 is disposed in each column of the pixels and performs signal processing, such as noise removal, on the signals output from the pixels 2 of one column for each pixel column. That is, the column signal processing circuit 5 performs CDS to remove a specific fixed pattern noise of the pixels 2 or performs signal processing such as signal amplification or AD conversion. In the output stage of the column signal processing circuit 5, a horizontal selection switch (not shown) is connected to the horizontal signal line 10.

The horizontal driving circuit 6 formed by a shift register sequentially outputs horizontal scanning pulses, sequentially selects the respective column signal processing circuits 5, and outputs the pixel signals output from the column signal processing circuit 5 to the horizontal signal line 10.

The output circuit 7 processes the signals sequentially supplied from the column signal processing circuits 5 via the horizontal signal line 10 and outputs the processed signals. The signals are only buffered in some cases, or the signals are subjected to black level adjustment, line-variation correction, or various kinds of digital signal processing in some cases. The input/output terminals 12 exchange signals with the outside.

Figure 2A:
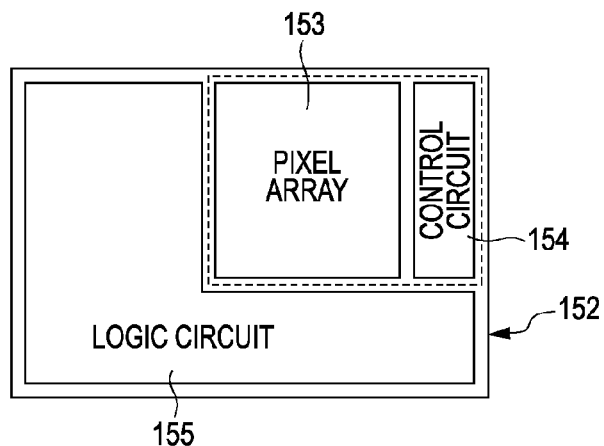
FIGS. 2A to 2C are schematic diagram illustrating a solid-state imaging device that is consistent with the present invention and a solid-state imaging device according to a related art.
Figure 2B:
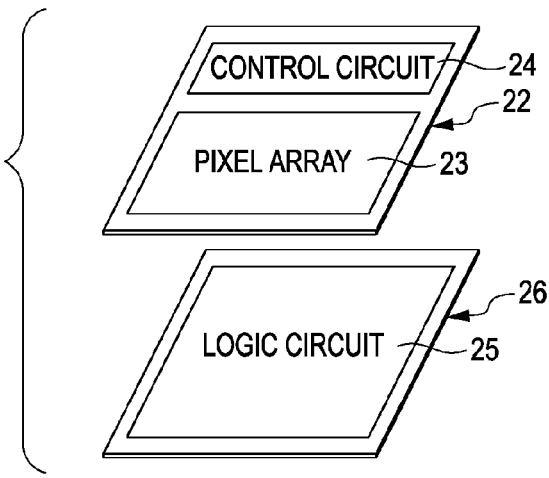
Figure 2C:
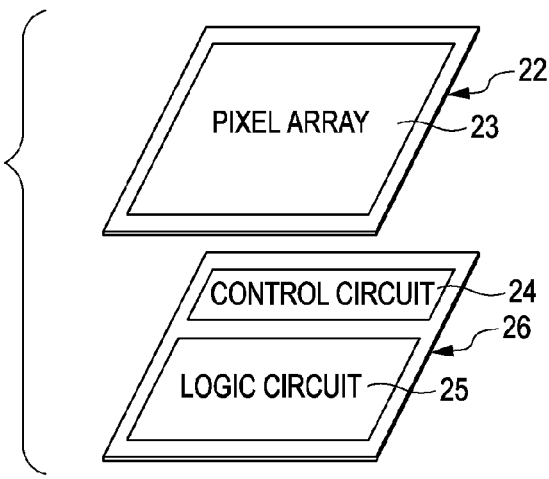

FIGS. 2A to 2C are diagrams illustrating the basic overall configuration of a MOS solid-state imaging device according to embodiments of the invention. In a MOS solid-state imaging device 151 according to a related art, as shown in FIG. 2A, a pixel array 153, a control circuit 154, and a logic circuit 155 performing signal processing are mounted on one semiconductor chip 152. In general, the pixel array 153 and the control circuit 154 form an image sensor 156. In a MOS solid-state imaging device 21 according to an embodiment of the invention, however, as shown in FIG. 2B, a pixel array 23 and a control circuit 24 are mounted on a first semiconductor chip section 22, and a logic circuit 25 including a signal processing circuit which performs signal processing is mounted in a second semiconductor chip section 26. The MOS solid-state imaging device 21 is formed by electrically connecting the first semiconductor chip section 22 and the second semiconductor chip section 26 to each other to form one semiconductor chip. In a MOS solid-state imaging device 28 according to another embodiment of the invention, as shown in FIG. 2C, the pixel array 23 is mounted on the first semiconductor chip section 22, and the control circuit 24 and the logic circuit 25 including a signal processing circuit are mounted on the second semiconductor chip section 26. The MOS solid-state imaging device 28 is formed by electrically connecting the first semiconductor chip section 22 and the second semiconductor chip section 26 to each other to form one semiconductor chip.

Although not illustrated, two or more semiconductor chip sections may be bonded to each other to form a MOS solid-state imaging device. A MOS solid-state imaging device may be configured in such a manner that three or more semiconductor chip sections including the first and second semiconductor chip sections and a semiconductor chip section with a memory element array or a semiconductor chip section with another circuit element are bonded to each other to form one chip.

Figure 3:
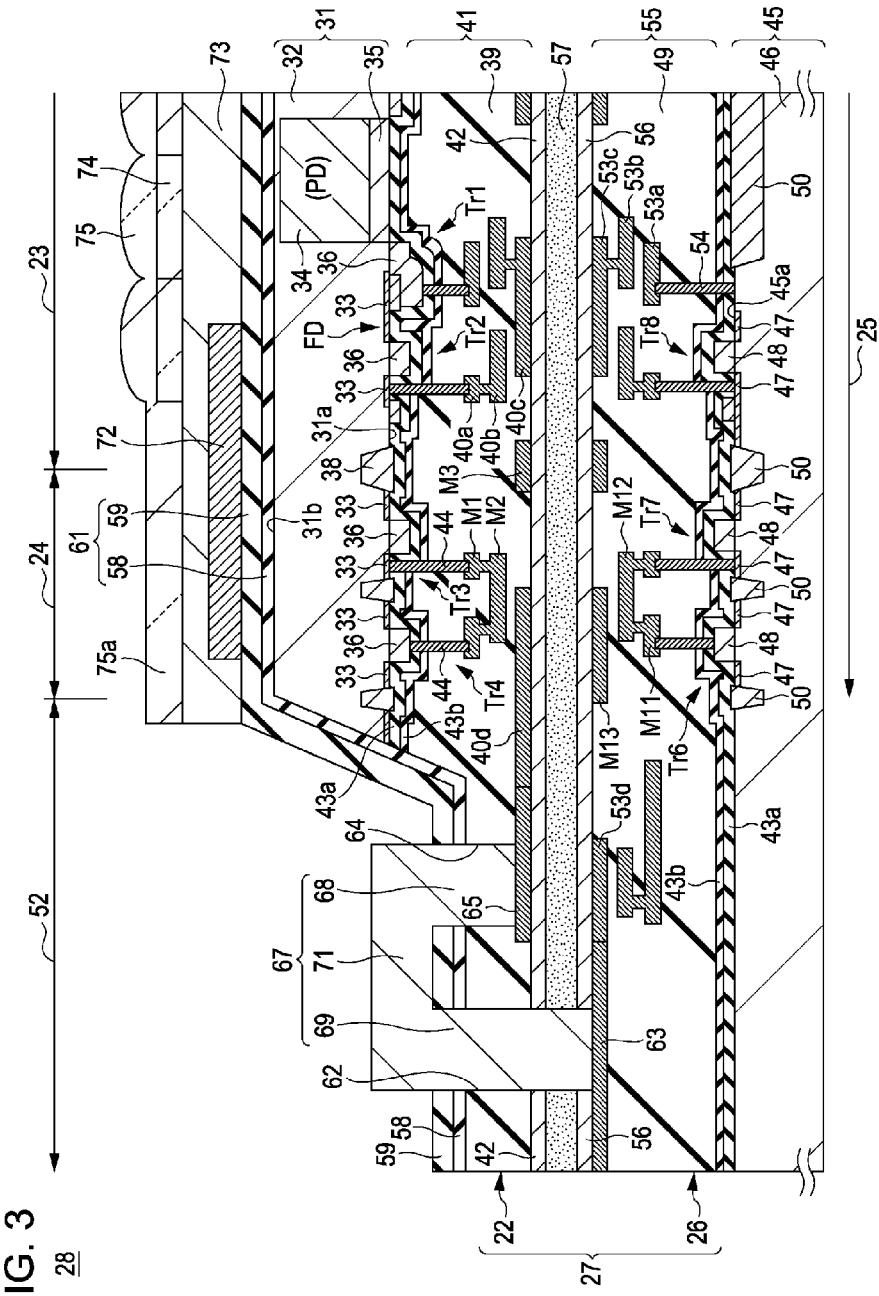
FIG. 3 is a diagram illustrating one embodiment of the overall configuration of the main units of the solid-state imaging device that is consistent with the present invention.

FIG. 3 is a diagram illustrating one embodiment of a semiconductor device, that is, the MOS solid-state imaging device that is consistent with the present invention. In this first embodiment, the solid-state imaging device 28 includes a stacked semiconductor chip 27 in which the first semiconductor chip section 22 including the pixel array 23 and the control circuit 24 and the second semiconductor chip section 26 including the logic circuit 25 are bonded to each other. The first semiconductor chip section 22 and the second semiconductor chip section 26 are bonded to each other so that multi wiring layers 41 and 55 face each other. The first and second semiconductor chip sections can be bonded by an adhesive layer 57 with protective layers 42 and 56 interposed therebetween in this embodiment. Alternatively, the first and second semiconductor chip sections may be bonded by plasma joining.

Figure 15A:
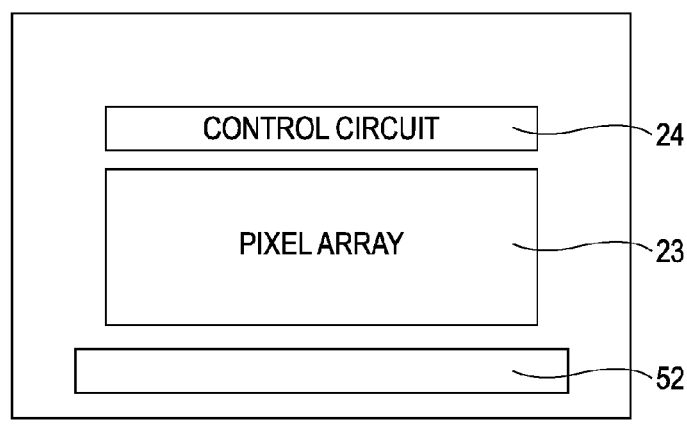
FIGS. 15A and 15B are schematic plan views illustrating one embodiment of the positions of semiconductor removal regions that are consistent with the present invention.

In this embodiment, a semiconductor removal region 52, where a part of a semiconductor portion of the first semiconductor chip section 22 is entirely removed, is formed and connection wirings 67 each connecting the first semiconductor chip section 22 to the second semiconductor chip section 26 are formed in the semiconductor removal region 52. The semiconductor removal region 52 covers all regions where each connection wiring 67 connected to a laying wiring 40d corresponding to each vertical signal line of the pixel array 23 is formed. As shown in FIG. 15A, the semiconductor removal region 52 is formed outside the pixel array 23. The semiconductor removal region 52 corresponds to a so-called electrode pad region. In FIG. 15A, the semiconductor removal region 52 is formed outside the pixel array 23 in a vertical direction.

In the first semiconductor chip section 22, the pixel array 23 including a photodiode (PD), which serves as a photoelectric conversion unit, and a plurality of pixel transistors Tr1 and Tr2 and the control circuit 24 including the MOS transistors Tr3 and Tr4 are formed in a thinned first semiconductor substrate 31. The pixel transistors Tr1 and Tr2 and the MOS transistors Tr3 and Tr4 are representative transistors. On the side of a front surface 31a of the semiconductor substrate 31, the multi wiring layer 41 in which a plurality of wirings 40 [40a, 40b, and 40c] formed by triple layered metals M1 to M3 in this embodiment are disposed is formed using an inter-layer insulation film 39. The pixel transistors Tr1 and Tr2 and the MOS transistors Tr3 and Tr4 of the control circuit 24 will be described in detail below in a manufacturing method.

In the second semiconductor chip section 26, the logic circuit 25 including MOS transistors Tr6 to Tr8 is formed in a second semiconductor substrate 45. On the side of the front surface 45a of the semiconductor substrate 45, a multi wiring layer 55 in which wirings 53 [53a, 53b, and 53c] formed by triple layered metals M11 to M13 in this embodiment are disposed is formed using an inter-layer insulation film 49. The MOS transistors Tr6 to Tr8 will be described in detail below in the manufacturing method.

In the semiconductor removal region 52 of the first semiconductor chip section 22, the entire first semiconductor substrate 31 is removed by etching. A stacked insulation film 61 including a silicon oxide ($SiO_2$) film 58 and a silicon nitride (SiN) film 59 is formed to extend from the bottom surface and the side surface of the semiconductor removal region 31 to the front surface of the semiconductor substrate. The stacked insulation film 61 serves as a protective insulation film that protects the semiconductor substrate 31 exposed to the side surface of a recessed portion of the semiconductor removal region 52 and also serves as an anti-reflection film of the pixels.

In the semiconductor removal region 52, a connection hole 64, which reaches from the silicon nitride film 59 to a first connection pad 65 electrically connected to a necessary wiring in the multi wiring layer 41a laying wiring 40d formed by the third-layer metal M3 in the first semiconductor chip section 22, is formed. In addition, a through connection hole 62, which is penetrated through the multi wiring layer 41 of the first semiconductor chip section 22 and reaches a second connection pad 63 electrically connected to a necessary wiring in the multi wiring layer 55 a laying wiring 53d formed by the third-layer metal M13 in the second semiconductor chip section 26, is formed.

The connection wiring 67 includes a connection conductor 68 buried in the connection holes 64 and 62 and electrically connected to the first connection pad 65, a through connection conductor 69 electrically connected to the second connection pad 63, and a link conductor 71 electrically connecting both of the conductors 68 and 69 to each other in the upper end of the conductors 68 and 69.

A light-shielding film 72 covering the region where light has to be blocked is formed on the side of a rear surface 31b that is a light incident surface of a photodiode 34 of the first semiconductor chip section 22. A planarization film 73 is formed to cover the light-shielding film 72, on-chip color filters 74 are formed on the planarization film 73 to correspond to the each pixel, and on-chip micro lenses 75 are formed on the on-chip color filters 74. In this way, the back-illuminated solid-state imaging device 28 is formed. The link conductor 71 of the connection wiring 67 exposed to the outside serves as an electrode pad connected to an external wiring by a bonding wire.

Exemplary Method of Manufacturing Solid-state Imaging Device

Figure 4:
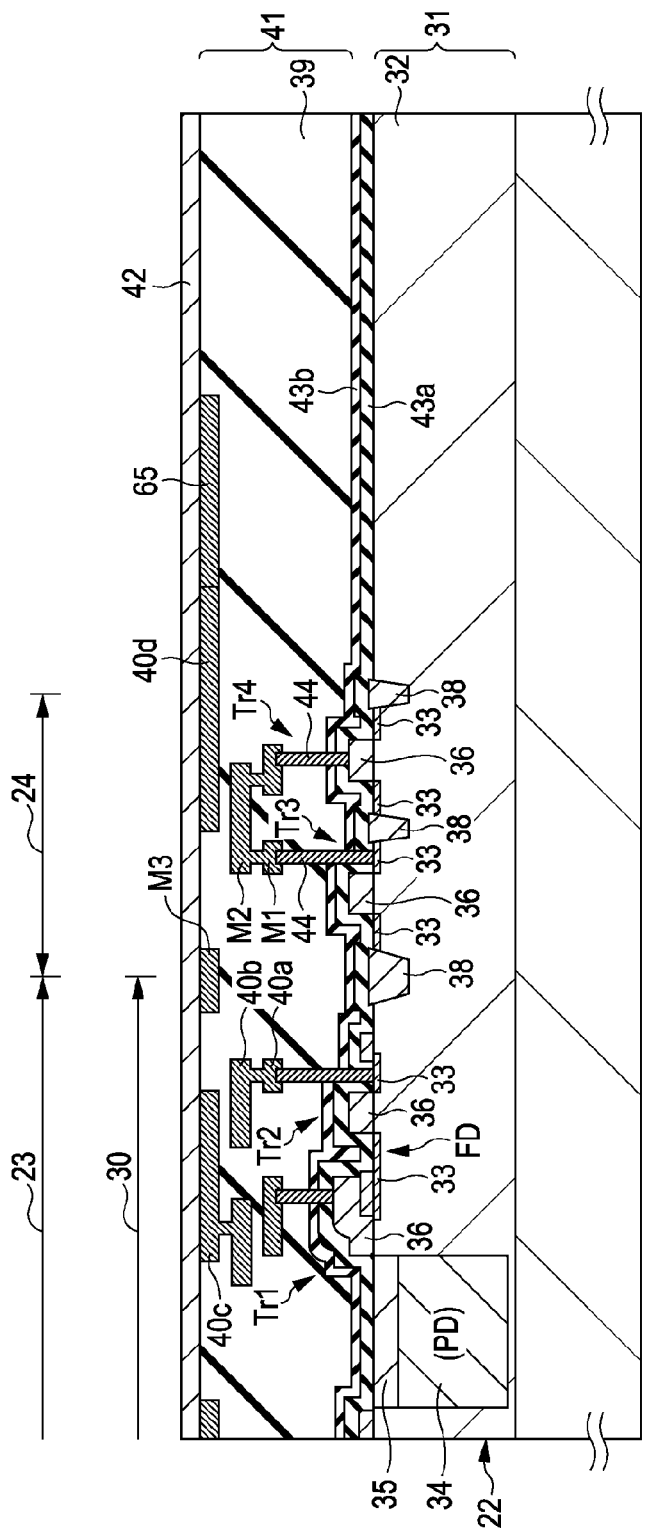
FIG. 4 is a diagram illustrating one embodiment of a manufacturing process for a solid-state imaging device that is consistent with the present invention.

FIGS. 4 to 14 are diagrams illustrating one embodiment of a method of manufacturing the solid-state imaging device 28 according to the first embodiment. As shown in FIG. 4, partly-finished image sensors, that is, the pixel array 23 and the control circuit 24 are formed in the regions of a first semiconductor wafer (hereinafter, referred to as a semiconductor substrate) 31, where the respective chip sections are formed. That is, a photodiode (PD) serving as a photoelectric conversion unit of each pixel is formed in each region of the semiconductor substrate (such as a silicon substrate) 31 where the chip section is formed, and a source/drain region 33 of each pixel transistor is formed in a semiconductor well region 32. The semiconductor well region 32 is formed by implanting first conductive-type impurities such as p-type impurities. The source/drain region 33 is formed by implanting second conductive-type impurities such as n-type impurities. The photodiode (PD) and the source/drain region 33 of each pixel transistor are formed by implanting ions from the front surface of the semiconductor substrate.

The photodiode (PD) includes an n-type semiconductor region 34 and a p-type semiconductor region 35 on the side of the front surface of the semiconductor substrate. A gate electrode 36 is formed on the front surface of the semiconductor substrate, in which the pixel is formed, via a gate insulation film. The gate electrode 36 and a pair of source/drain regions 33 form the pixel transistors Tr1 and Tr2. In FIG. 4, the two pixel transistors Tr1 and Tr2 are representatives of a plurality of pixel transistors. The pixel transistor Tr1 adjacent to the photodiode (PD) corresponds to a transfer transistor and the source/drain region of the pixel transistor Tr1 corresponds to a floating diffusion (FD). The unit pixels 30 are isolated from each other by a device isolation region 38. The device isolation region 38 is formed to have an STI (Shallow Trench Isolation) structure in which an insulation film such as a $SiO_2$ film is buried in a groove formed in the substrate.

On the other hand, the MOS transistors forming the control circuit are formed in the semiconductor substrate 31 on the side of the control circuit 24. In FIG. 4, the MOS transistors Tr3 and Tr4 are representatives of the transistors and indicate the MOS transistors forming the control circuit 23. The MOS transistors Tr3 and Tr4 each include an n-type source/drain region 33 and a gate electrode 36 formed via a gate insulation film.

Next, the interlayer insulation film 39 of a first layer is formed on the front surface of the semiconductor substrate 31, the connection holes are formed in the inter-layer insulation film 39, and then the connection conductors 44 connected to the necessary transistors are formed. When the connection conductors 44 with different heights are formed, a first insulation thin film 43a, such as a silicon oxide film, and a second insulation thin film 43b, such as a silicon nitride film serving as an etching stopper, are stacked on the entire surface including the upper surface of the transistors. The first-layer inter-layer insulation film 39 is formed on the second insulation thin film 43b. Then, connection holes with different depths are selectively formed in the first-layer inter-layer insulation film 39 up to the second insulation thin film 43b serving as the etching stopper. Next, the first insulation thin film 43a and the second insulation thin film 43b with the same thickness are selectively etched in the respective units to form connection holes so as to continue with the respective connection holes. Then, the connection conductor 44 is buried in each connection hole.

Next, the multi wiring layer 41 in which the plurality of wirings 40 [40a, 40b, and 40c] formed by triple layered metals M1 to M3 are disposed is formed using an inter-layer insulation film 39 so as to be connected to the respective connection conductors 44. The wirings 40 are formed of copper (Cu). In general, each copper wiring is covered with a barrier metal film to prevent diffusion of Cu. Thus, a cap film, a so-called protective film 42, for the copper wirings 40 is formed on the multi wiring layer 41. By the above-described processes, the first semiconductor substrate 31 including the partly-finished pixel array 23 and the partly-finished control circuit 24 is formed.

Figure 5:
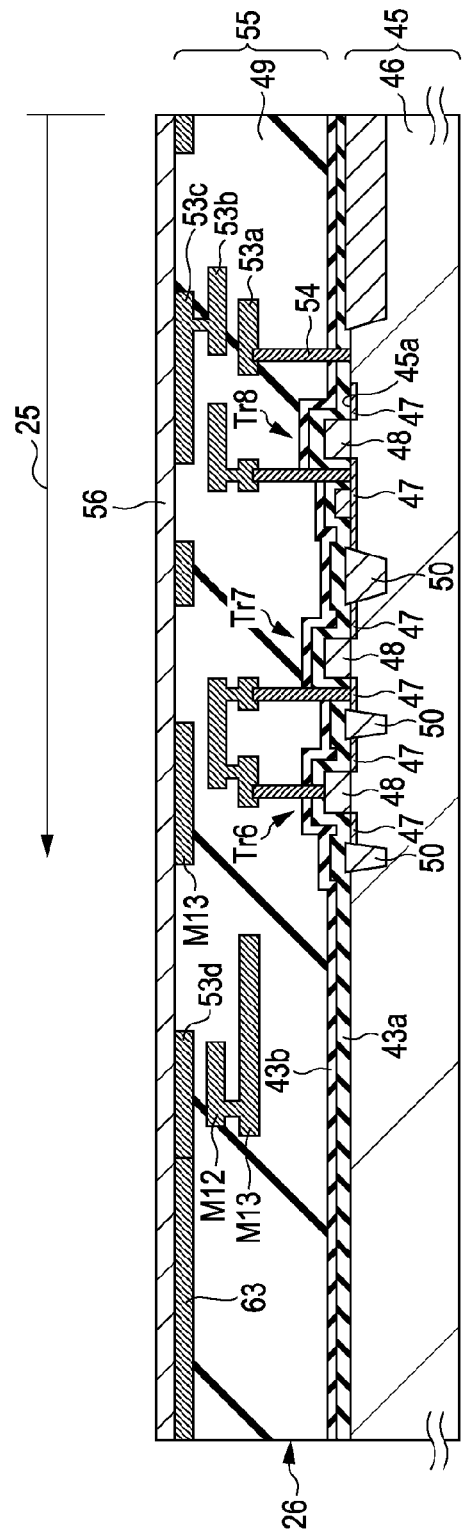
FIG. 5 is a diagram illustrating one embodiment of a manufacturing process for a solid-state imaging device that is consistent with the present invention.

On the other hand, as shown in FIG. 5, the logic circuit 25 including a partly-finished signal processing circuit to process signals is formed in the region where each chip section of the second semiconductor substrate (semiconductor wafer) 45 is formed. That is, a plurality of MOS transistors each including a logic circuit is formed in p-type semiconductor well regions 46 on the front surface side of the semiconductor substrate (such as a silicon substrate) 45 so as to be isolated from each other by device isolation regions 50. Here, the MOS transistors Tr6, Tr7, and Tr8 are representatives of the plurality of MOS transistors. The MOS transistors Tr6, Tr7, and Tr8 each include a pair of n-type source/drain regions 47 and a gate electrode 48 formed via a gate insulation film. The logic circuit 25 can include a CMOS transistor. The device isolation region 50 is formed to have an STI (Shallow Trench Isolation) structure in which an insulation film such as a $SiO_2$ film is buried in a groove formed in the substrate.

Next, a first-layer inter-layer insulation film 49 is formed on the front surface of the semiconductor substrate 45 and then connection holes are formed in the inter-layer insulation film 49 to form connection conductors 54 connected to the necessary transistors. When the connection conductors 54 with different heights are formed, like the above description, a first insulation thin film 43a, such as a silicon oxide film, and a second insulation thin film 43b, such as a silicon nitride film, serving as an etching stopper are stacked on the entire surface including the upper surface of the transistors. The first-layer inter-layer insulation film 49 is formed on the second insulation thin film 43b. Then, the connection holes with different depths are selectively formed in the first inter-layer insulation film 39 up to the second insulation thin film 43b serving as the etching stopper. Next, the first insulation thin film 43a and the second insulation thin film 43b with the same thickness are selectively etched in the respective units to form connection holes so as to continue with the respective connection holes. Then, the connection conductor 44 is buried in each connection hole.

Next, a multi wiring layer 55 in which the plurality of wirings 53 [53a, 53b, and 53c] formed by triple layered metals Mil to M13 are disposed is formed using an inter-layer insulation film 49 so as to be connected to the respective connection conductors 54. The wirings 53 are formed of copper (Cu). Like the above description, a cap film, a so-called protective film 56, for the copper wirings 53 is formed on the inter-layer insulation film 49. By the above-described processes, the second semiconductor substrate 45 including the partly-finished logic circuit 25 is formed.

Figure 6:
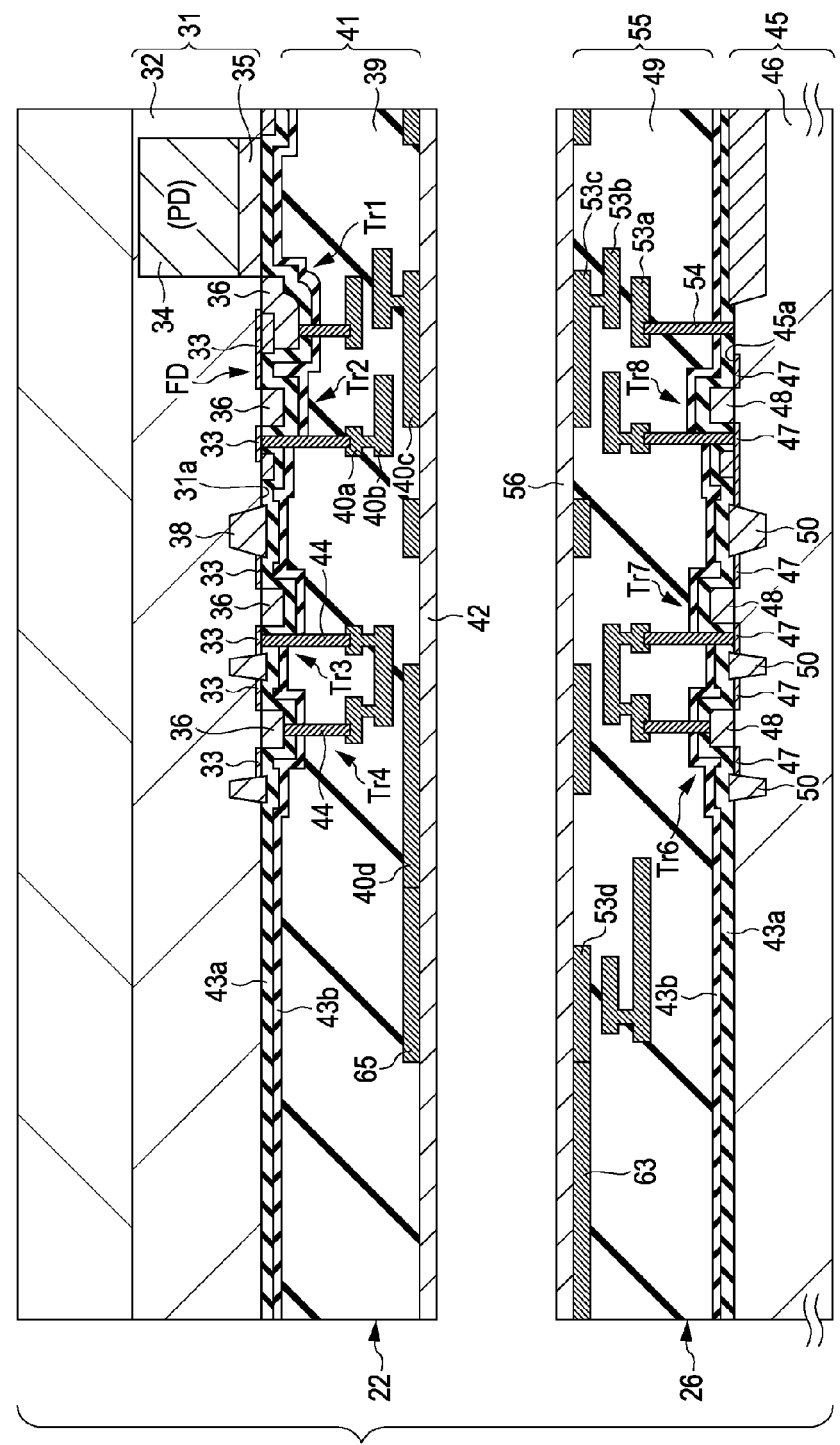
FIG. 6 is a diagram (third manufacturing process diagram) illustrating one embodiment of a manufacturing process for a solid-state imaging device that is consistent with the present invention.
Figure 7:
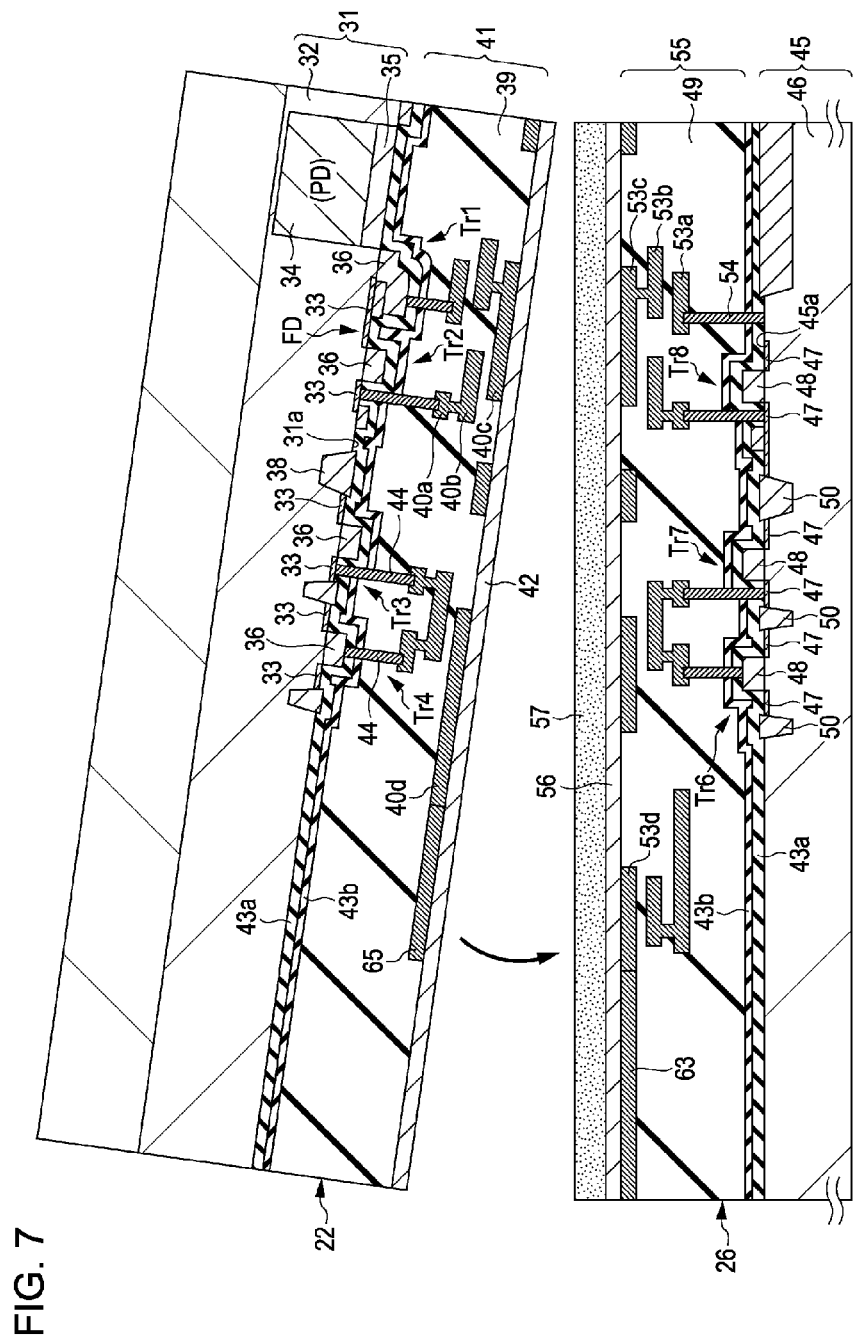
FIG. 7 is a diagram illustrating one embodiment of a manufacturing process for a solid-state imaging device that is consistent with the present invention.

Next, as shown in FIG. 6, the first semiconductor substrate 31 and the second semiconductor substrate 45 are bonded to each other so that the multi wiring layers 41 and 55 face each other. The first and second semiconductor substrates can be bonded by plasma joining or an adhesive. The first and second semiconductor substrates are bonded by an adhesive. When an adhesive is used, as shown in FIG. 7, an adhesive layer 58 is formed on one of the joining surfaces of the first semiconductor substrate 31 and the second semiconductor substrate 45. Both the semiconductor substrates are superimposed to each other with the adhesive layer 58 interposed therebetween. That is the first semiconductor substrate 31 and the second semiconductor substrate 45 are bonded to each other.

When the first semiconductor substrate and the second semiconductor substrate are bonded by plasma joining, although not illustrated, a plasma TEOS film, a plasma SiN film, a SiON film (block film), a SiC film, or the like is formed on the joining surfaces of the first semiconductor wafer 31 and the second semiconductor wafer 45. The joining surfaces on which this film is formed are subjected to plasma processing to be superimposed, and then the both joining surfaces are adhered by annealing. Preferably, the first and second semiconductor wafers are bonded at a low temperature of 400° C. or less at which the wirings or the like are not influenced.

Figure 8:
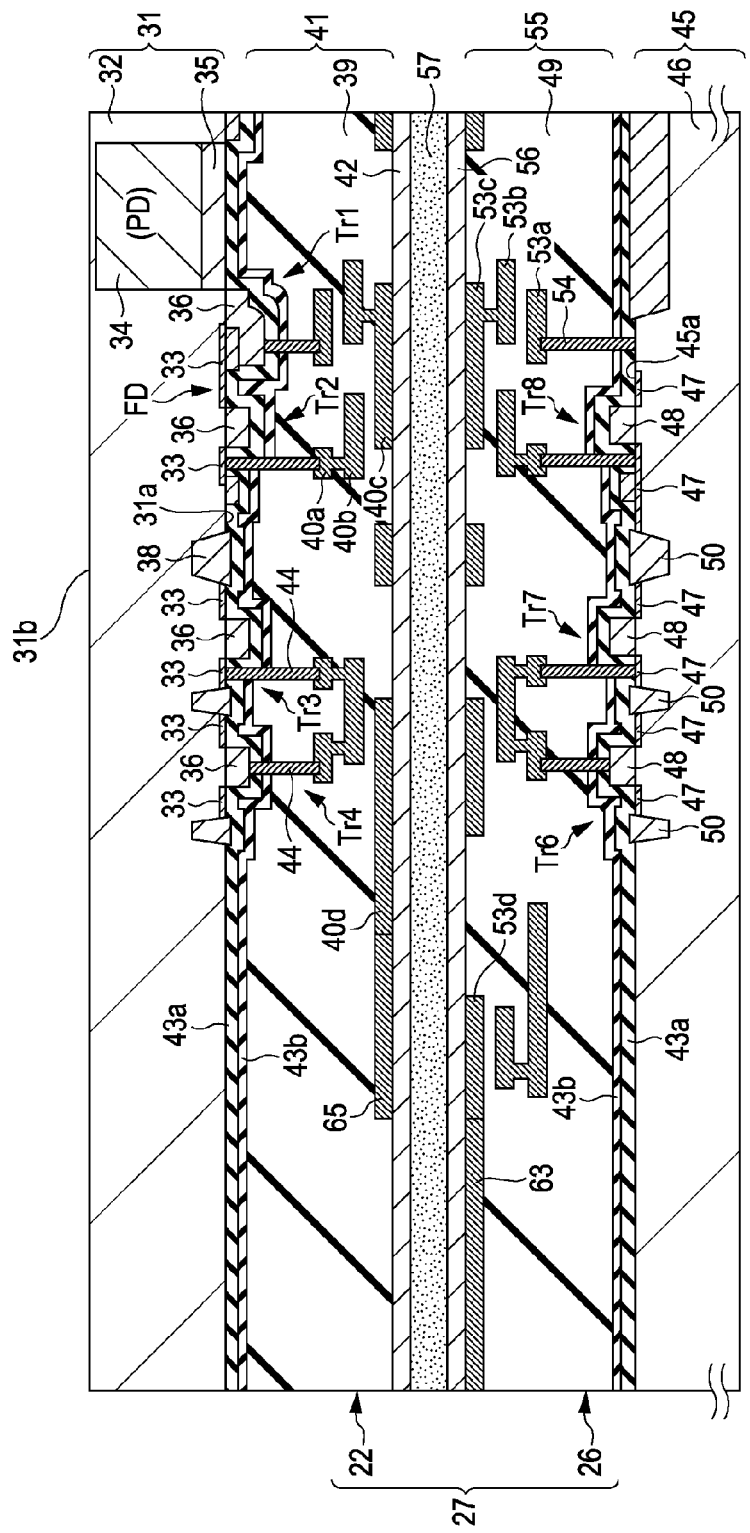
FIG. 8 is a diagram illustrating one embodiment of a manufacturing process for a solid-state imaging device that is consistent with the present invention.

Next, as shown in FIG. 8, grinding and polishing are performed from the rear surface 31b of the first semiconductor substrate 31 to thin the first semiconductor substrate 31. The thinning is performed so that the photodiode (PD) is faced. After the thinning, a p-type semiconductor layer is formed on the rear surface of the photodiode (PD) to prevent dark current. The semiconductor substrate 31 has about a thickness of 600 μm, but is thinned from about 3 μm to about 5 μm. In a related art, a separate support substrate is bonded for the thinning. In this embodiment, however, the second semiconductor substrate 45 including the logic circuit 25 also serves as a support substrate so that the first semiconductor substrate 31 is thinned. The rear surface 31b of the first semiconductor substrate 31 is a light incident surface of the back-illuminated solid-state imaging device.

Figure 9:
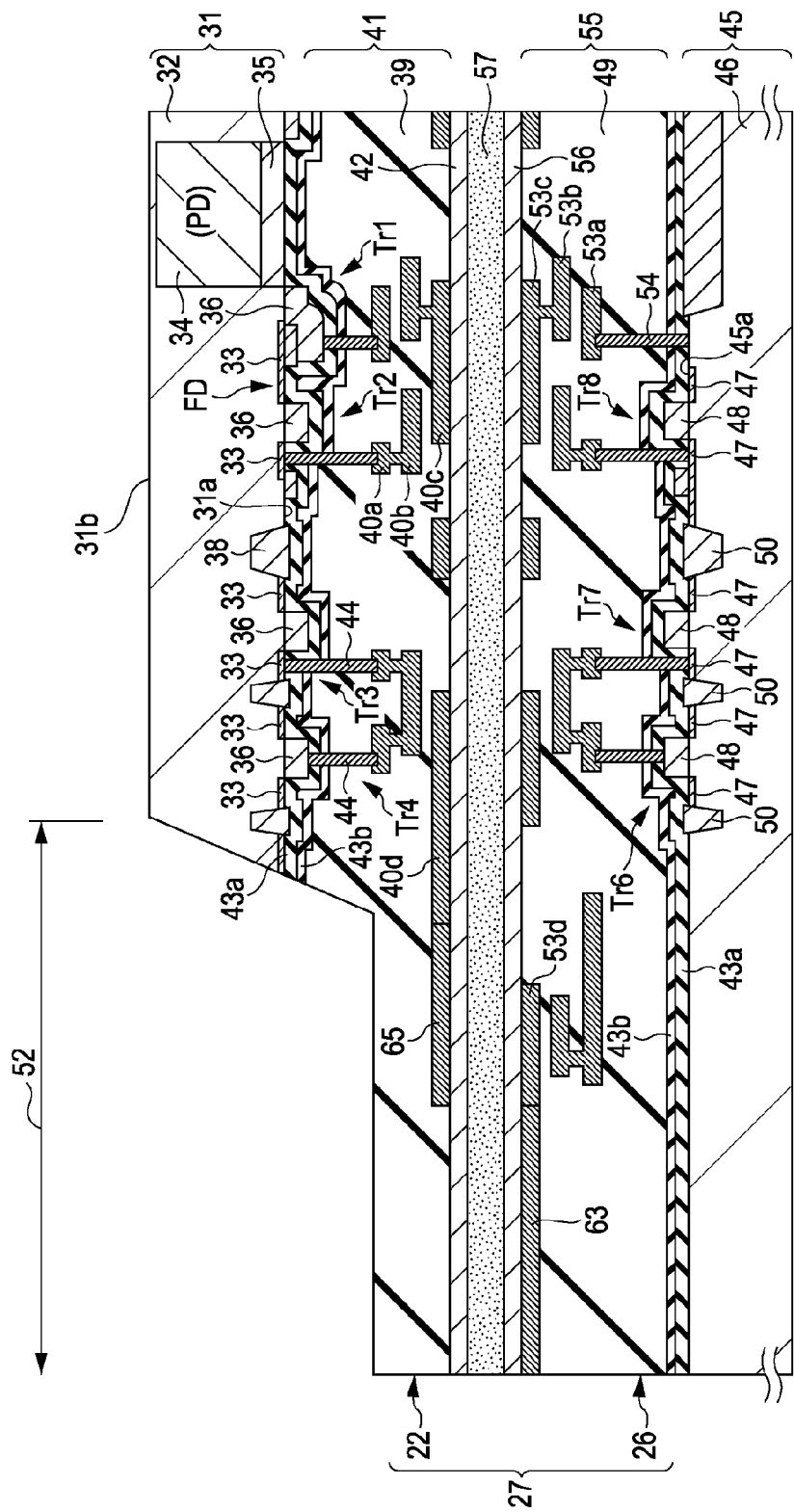
FIG. 9 is a diagram illustrating one embodiment of a manufacturing process for a solid-state imaging device that is consistent with the present invention.
Figure 15B:
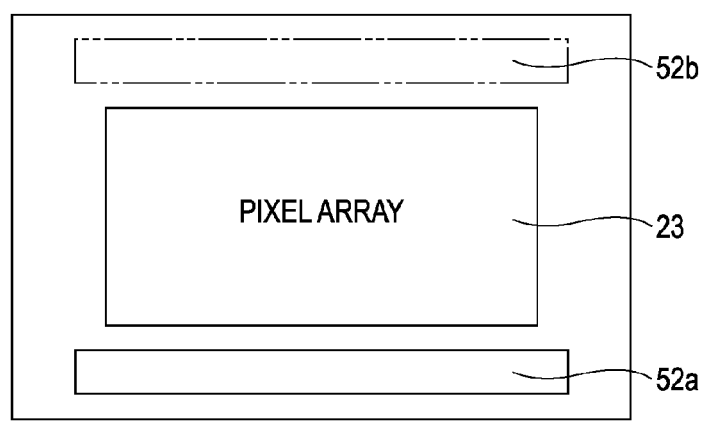

Next, in the first semiconductor substrate 31 and the second semiconductor substrate 45 bonded to each other, as shown in FIG. 9, the part of a semiconductor portion of the region of the finished first semiconductor chip section, that is, the part of the semiconductor substrate 31, is completely removed to form the semiconductor removal region 52. The semiconductor removal region 52 covers all regions including a part where each connection wiring connected to the laying wiring 40d corresponding to each vertical signal line of the pixel array is formed, and is formed outside the pixel array 23, as shown in FIG. 15B. In FIG. 15B, the semiconductor removal region 52 is formed outside the pixel array 23 in a vertical direction.

Figure 10:
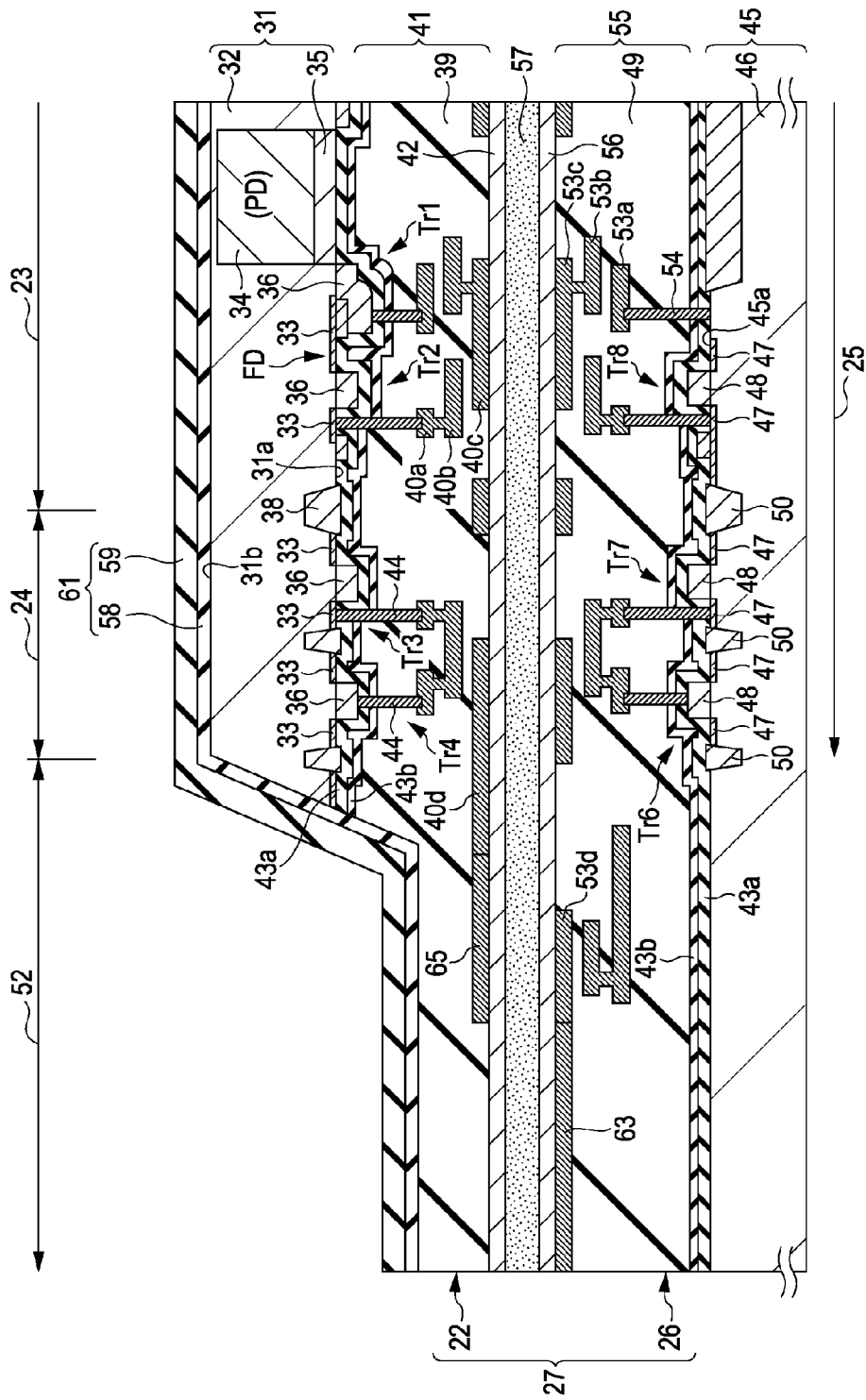
FIG. 10 is a diagram) illustrating one embodiment of a manufacturing process for a solid-state imaging device that is consistent with the present invention.

Next, as shown in FIG. 10, a stacked insulation film 61 including a silicon oxide ($SiO_2$) film 58 and a silicon nitride (SiN) film 59 is formed and adhered across the rear surface (light incident surface) of the control circuit 24 and the pixel array 23 from the internal surface of the semiconductor removal region 52. The stacked insulation film 61 serves as a protective film of the semiconductor side surface of the semiconductor removal region 52 and also serves as an anti-reflection film for the pixel array 23.

Figure 11:
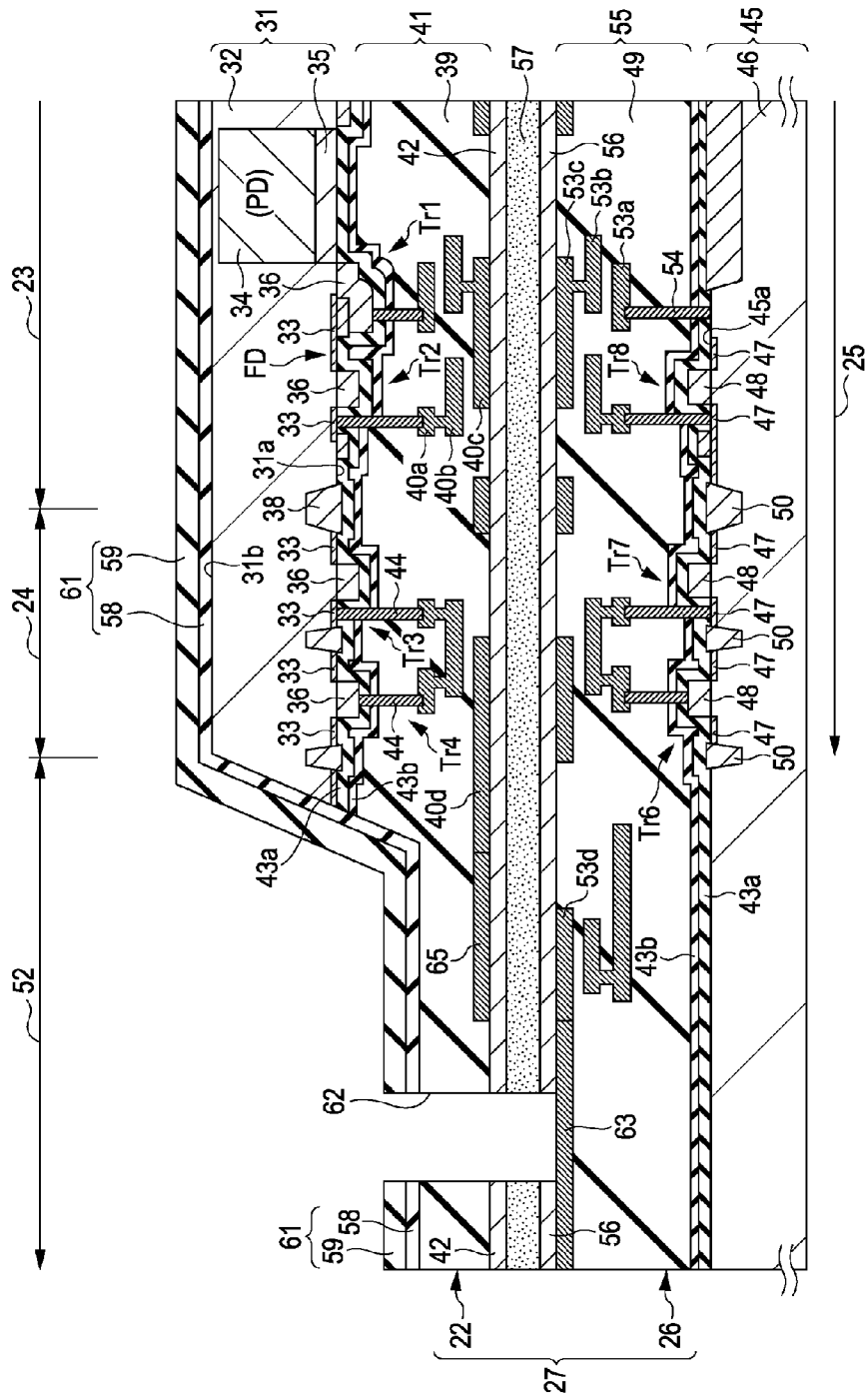
FIG. 11 is a diagram illustrating one embodiment of a manufacturing process for a solid-state imaging device that is consistent with the present invention.

Next, as shown in FIG. 11, the through connection hole 62 formed from the stacked insulation film 61 to the second connection pad 63, which is connected to the necessary wiring 53 for the multi wiring layer 55 of the second semiconductor substrate 45, through the multi wiring layer 41 of the first semiconductor substrate 31 is formed in the semiconductor removal region 52. The through connection hole 62 reaches the second connection pad 63 electrically connected to the wiring 53d formed by the uppermost layer of the multi wiring layer, that is, the third-layer metal M13. The plurality of through connection holes 62 are formed to correspond in number to the vertical signal lines of the pixel array 23. The wiring 53d formed by the third-layer metal M13 connected to the second connection pad 63 serves as the laying wiring corresponding to the vertical signal line. As an illustrated example, the second connection pad 63 is formed by the third-layer metal M13 and is formed so as to continue with the laying wiring 53d corresponding to the vertical signal line.

Figure 12:
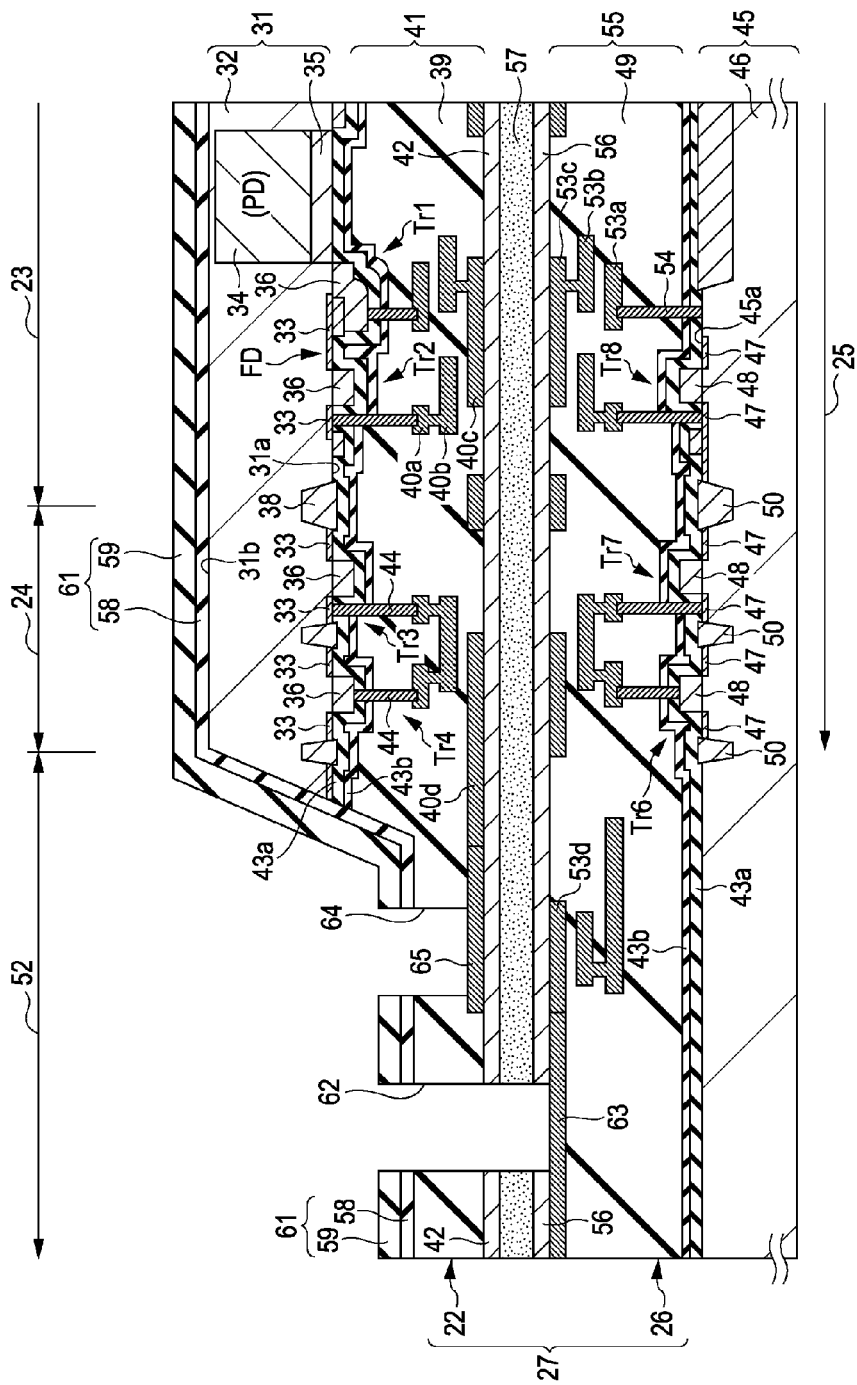
FIG. 12 is a diagram illustrating one embodiment of a manufacturing process for a solid-state imaging device that is consistent with the present invention.

Next, as shown in FIG. 12, the connection hole 64 formed from the stacked insulation film 61 to the first connection pad 65, which is connected to the necessary wiring 40 for the multi wiring layer 41 of the first semiconductor substrate 31, is formed in the semiconductor removal region 52. In this example, the connection hole 64 reaching the first connection pad 65 electrically connected to the wiring 40d formed by the third-layer metal M3 of the multi wiring layer 41 is formed. The plurality of connection holes 64 are formed to correspond in number to the vertical signal lines of the pixel array 23. The wiring 40d formed by the third-layer metal M3 connected to the first connection pad 65 serves as the laying wiring corresponding to the vertical signal line. In the illustrated example, the first connection pad 65 is formed by the third-layer metal M3 and is formed so as to continue with the laying wiring 40d corresponding to the vertical signal line.

Figure 13:
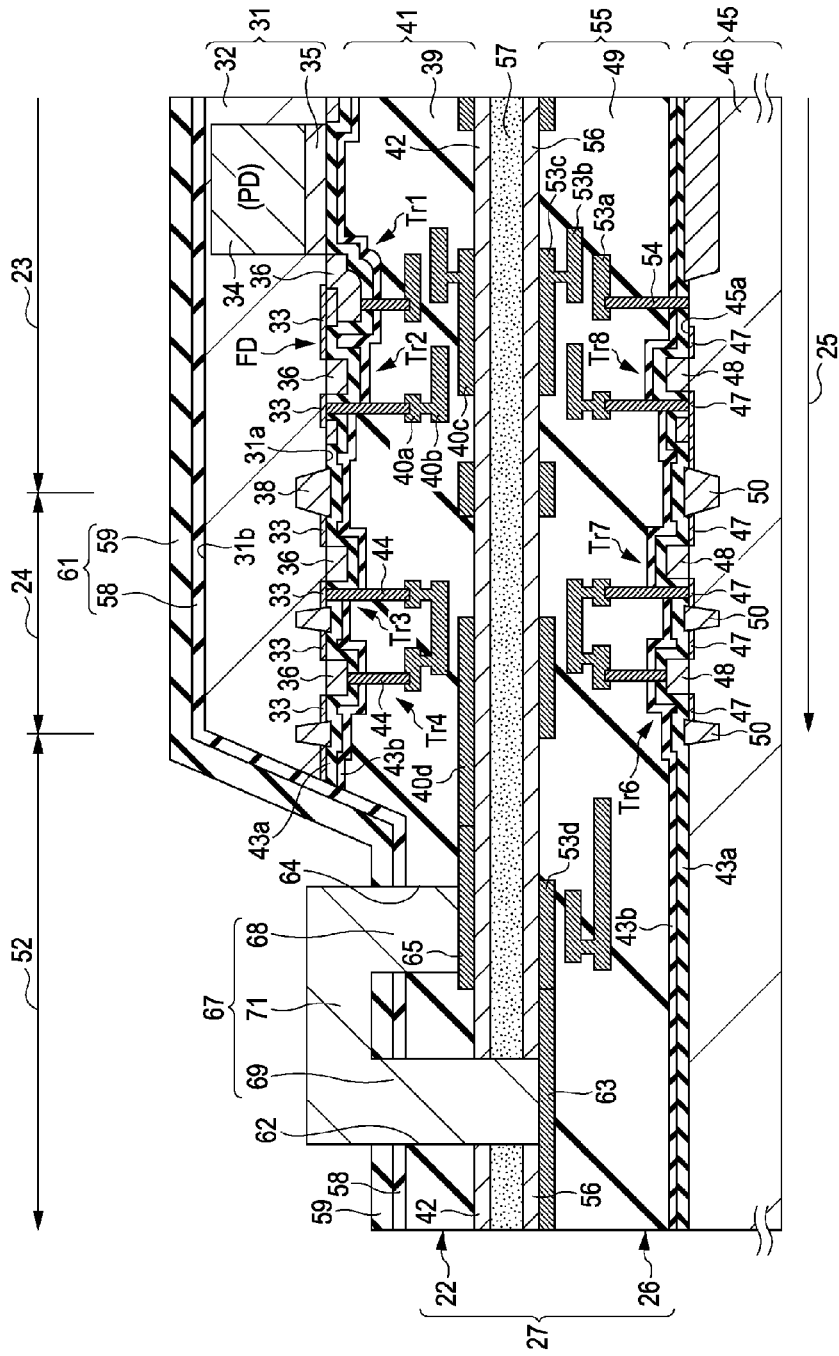
FIG. 13 is a diagram illustrating one embodiment of a manufacturing process for a solid-state imaging device that is consistent with the present invention.

Next, as shown in FIG. 13, the connection wiring 67 is formed to electrically connect the first connection pad 65 to the second connection pad 63. That is, a conductive film is formed on the entirety of the rear surface of the first semiconductor substrate 31 so as to be buried in both the connection holes 62 and 64, and then is subjected to etch-back and patterning to form the connection wiring 67. The connection wiring 67 includes the connection conductor 68 buried in the connection hole 64 and connected to the first connection pad 65 and the through connection conductor 69 buried in the through connection hole 62 and connected to the second connection pad. The connection wiring 67 further includes the link conductor 71 electrically linking the connection conductor 68 to the through connection conductor 69 on the exposed bottom surface of the semiconductor removal region. The connection conductor 68, the through connection conductor 69, and the link conductor 71 are integrally formed of the same metal. The connection wiring 67 can be formed of metal, such as tungsten (W), aluminum (Al), or gold (Au), which can be patterned, via barrier metal (TiN or the like).

Figure 14:
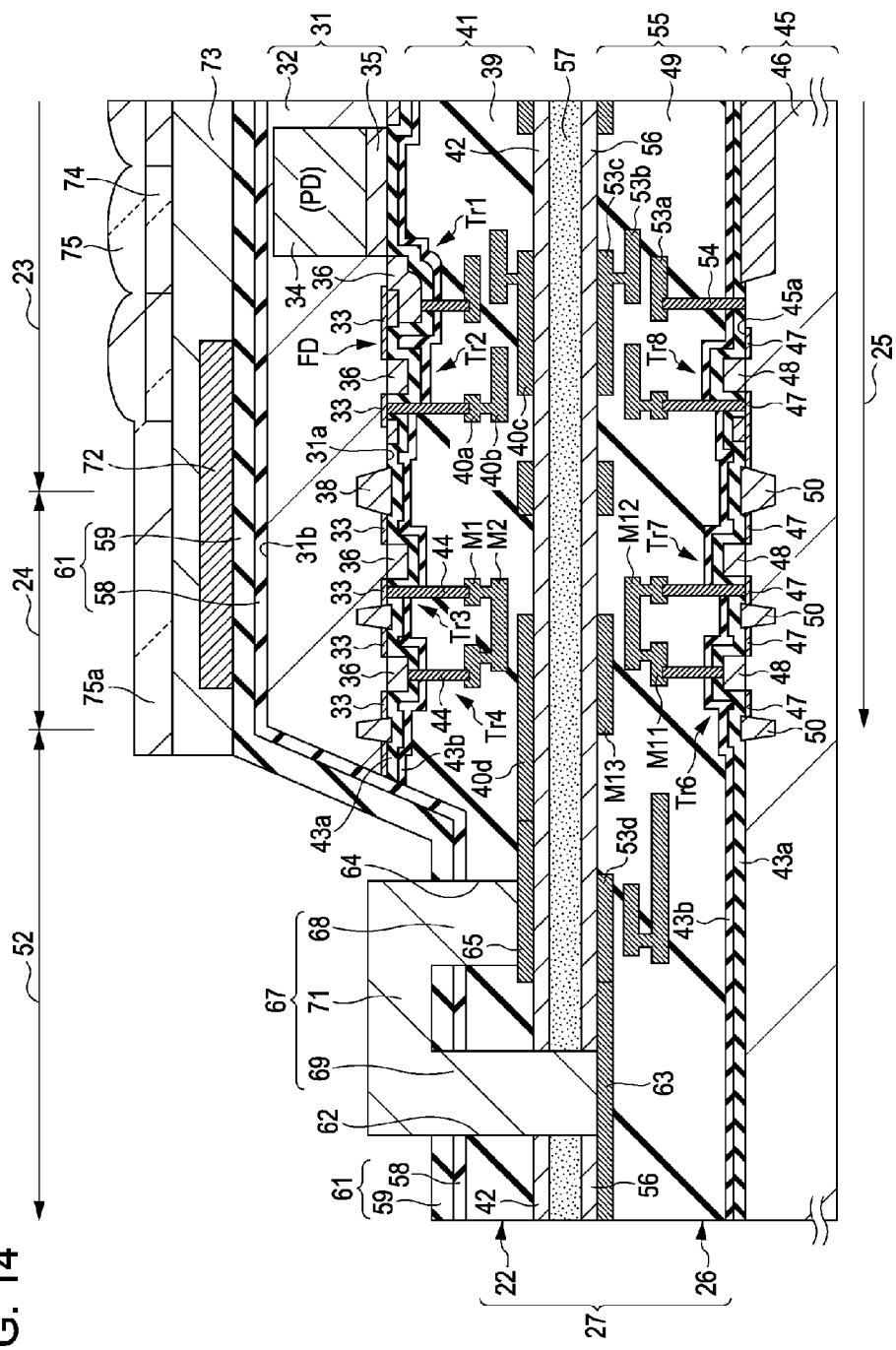
FIG. 14 is a diagram illustrating one embodiment of a manufacturing process for a solid-state imaging device that is consistent with the present invention.

Next, as shown in FIG. 14, the light-shielding film 72 is formed in the region where light has to be shielded. The light-shielding film 72 is formed on the control circuit 24, as schematically illustrated in the drawing. Alternatively, the light-shielding film 72 may be also formed on the pixel transistors. The light-shielding film 72 can be formed of metal such as tungsten (W). The planarization film 73 is formed across the pixel array 23 so as to cover the light-shielding film 72. Such as, but not limited to, red (R), green (G), and blue (B) on-chip color filters 74 are formed on the planarization film 73 so as to correspond to the respective pixels, and then the on-chip micro lenses 75 are formed on the on-chip color filters 74. The pixel array 23 and the control circuit 25 are finished for the first semiconductor substrate 31. The link conductor 71 of the connection wiring 67 serves as an electrode pad exposed to the outside. The logic circuit 25 is finished for the second semiconductor substrate 45.

Next, the divided individual chips are obtained, and thus the desired back-illuminated solid-state imaging device 28 shown in FIG. 3 is obtained. In the solid-state imaging device 28, the electrode pad formed by the link conductor 71 of the connection wiring 67 is connected to an external wiring by wire bonding.

In the solid-state imaging device and the method of manufacturing the same according to the first embodiment, the pixel array 23 and the control circuit 24 are formed in the first semiconductor chip section 22 and the logic circuit 25 processing signals is formed in the second semiconductor chip section 26. Since the solid-state imaging device has a configuration in which the pixel array function and the logic function are realized in the different chip sections, the optimum processing techniques of the pixel array 23 and the logic circuit 25 can be used. Accordingly, the performances of the pixel array 23 and the logic circuit 25 can be sufficiently achieved, thereby providing the high-performance solid-state imaging device.

In this embodiment, the part of the first semiconductor chip section 22, that is, the semiconductor portion of the region where the connection conductor and the through connection conductor are formed is completely removed. Since the connection conductor 68 and the through connection conductor 69 are formed in the semiconductor removal region 52 where the semiconductor portion is removed, parasitic capacitance between the semiconductor substrate 31 and the connection conductor 68 and the through connection conductor 69 can be reduced, thereby realizing high performance in the solid-state imaging device.

When the configuration shown in FIG. 2C is used, the pixel array 23 receiving light may be formed on the first semiconductor chip section 22, and the control circuit 24 and the logic circuit 25 may be separated from each other to be formed in the second semiconductor chip section 26. Accordingly, the optimum processing techniques can be independently selected when the semiconductor chip sections 22 and 26 are manufactured, and the area of the product module can be reduced.

In the first embodiment, the first semiconductor substrate 31 including the pixel array 23 and the control circuit 24 and the second semiconductor substrate 45 including the logic circuit 25, which are all partly-finished products, are bonded to each other, and then the first semiconductor substrate 31 is thinned. That is, the second semiconductor substrate 45 is used as the support substrate when the first semiconductor substrate 31 is thinned. Accordingly, the number of members can be reduced and the manufacturing process can be simplified.

In this embodiment, the first semiconductor substrate 31 is thinned and the through connection hole 62 and the connection hole 64 are formed in the semiconductor removal region 52 where the semiconductor portion is further removed. Therefore, the aspect ratio of the holes is reduced, thereby forming the connection holes 62 and 64 with high precision. Accordingly, the high-performance solid-state imaging device can be manufactured with high precision.

Figure 16:
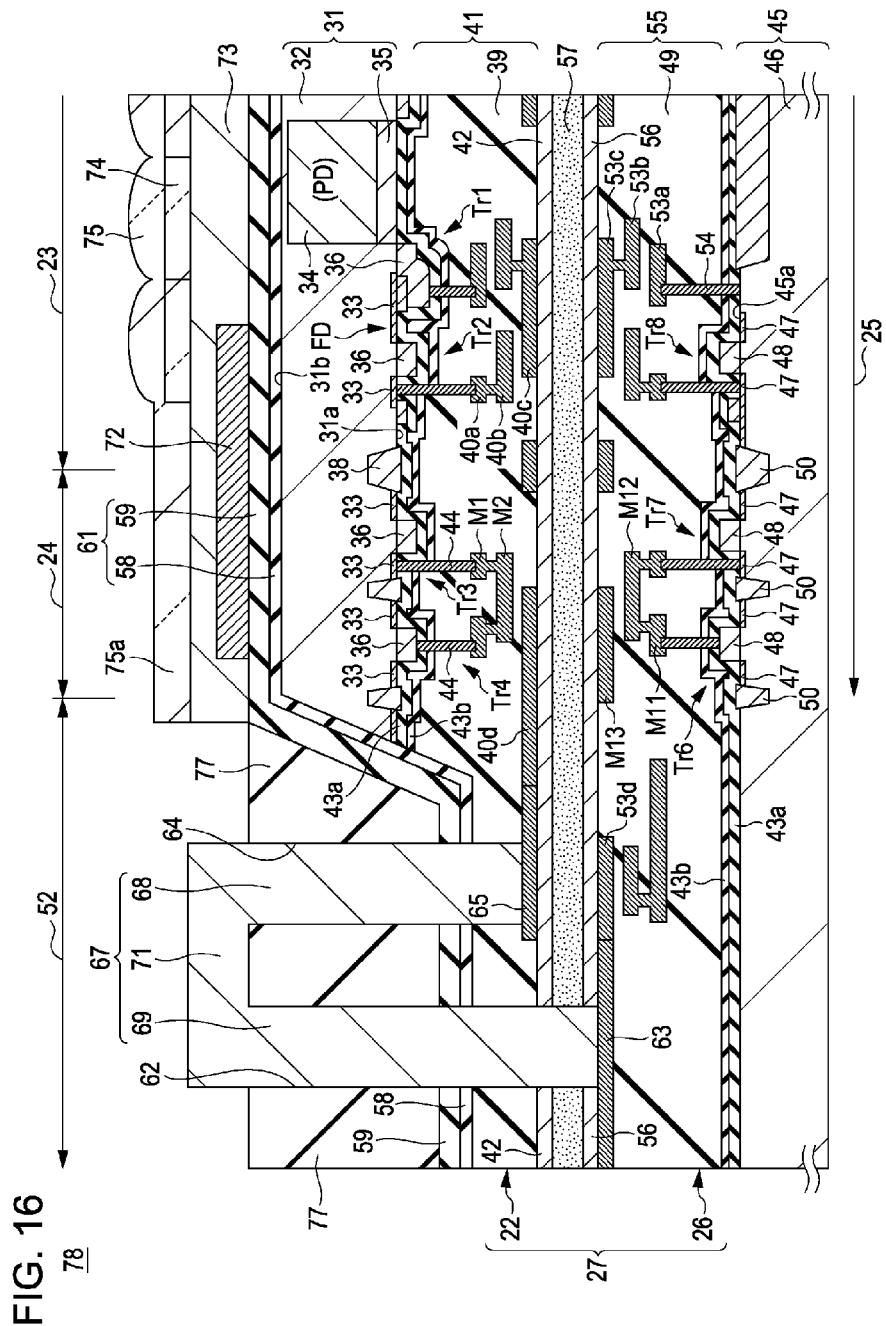
FIG. 16 is a diagram illustrating one embodiment of the overall configuration of the main units of a solid-state imaging device that is consistent with the present invention.

FIG. 16 is a diagram illustrating one embodiment of a semiconductor device, that is, a MOS solid-state imaging device that is consistent with the present invention. In the second embodiment, a solid-state imaging device 78 includes the stacked semiconductor chip 27 in which the first semiconductor chip section 22 including the pixel array 23 and the control circuit 24 and the second semiconductor chip section 26 including the logic circuit 25 are bonded to each other. The first semiconductor chip section 22 and the second semiconductor chip section 26 are bonded to each other so that multi wiring layers 41 and 55 face each other.

In this embodiment, the semiconductor removal region 52, where a part of a semiconductor portion of the first semiconductor chip section 22 is entirely removed, is formed and the stacked insulation film 61 extending from the internal surface of the semiconductor removal region 52 to the rear surface 31b of the semiconductor substrate 31 is formed. An insulation film 77 subjected to planarization and thus flush with the front surface of the stacked insulation film on the semiconductor substrate 31 is formed in the semiconductor removal region. The etching rate of the insulation film 77 is different from that of the silicon nitride film 59 on the front surface of the stacked insulation film 61. The insulation film 77 is formed of, such as, but not limited to, a silicon oxide film.

Then, the connection hole 64 and the through connection hole 62 reaching the first connection pad 65 and the second connection pad 63, respectively, through the insulation film 77 are formed. The connection wiring 67 connecting the first connection pad 65 to the second connection pad 63 through both the connection holes 64 and 62 is formed. The connection wiring 67 includes the connection conductor 68 buried in the connection holes 64 and 62 and electrically connected to the first connection pad 65, the through connection conductor 69 electrically connected to the second connection pad 63, and the link conductor 71 electrically connecting both of the conductors 68 and 69 to each other in the upper end. The connection conductor 68, the through connection conductor 69, and the link conductor 71 are integrally and necessarily formed of metal. The link conductor 71 is formed on the insulation film 77 subjected to planarization.

The other configuration is the same as the above-described configuration of the first embodiment. Therefore, the same reference numerals are given to the corresponding members in FIG. 3 and repetition of the description thereof is omitted.

FIGS. 17 to 24 are diagrams illustrating one embodiment of a method of manufacturing the solid-state imaging device 78 according to the second embodiment.

Figure 17:
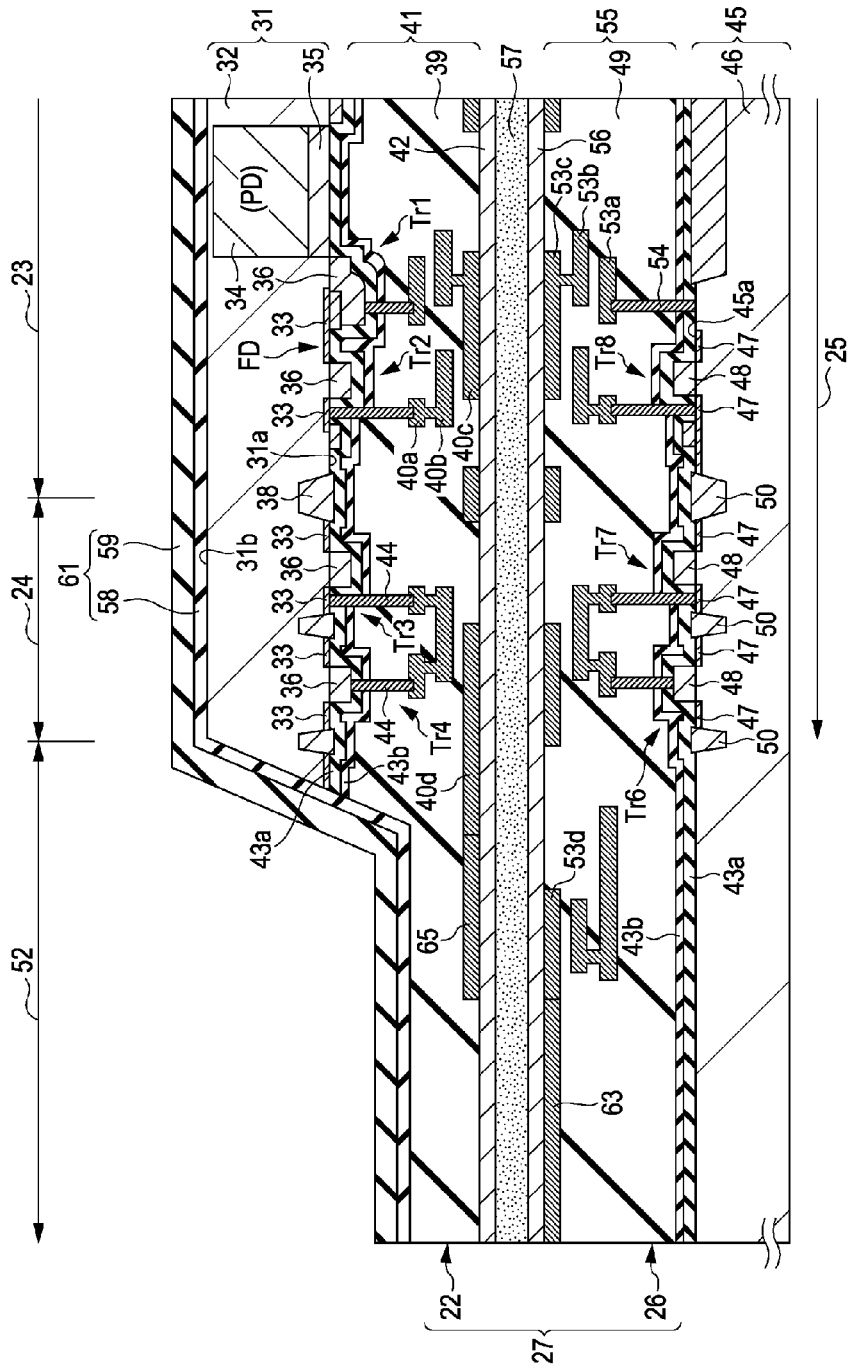
FIG. 17 is a diagram (illustrating one embodiment of a manufacturing process for a solid-state imaging device that is consistent with the present invention.

FIG. 17 is a diagram illustrating the same configuration as that in FIG. 10 in the steps of manufacturing the solid-state imaging device 28 according to the above-described first embodiment. Since the steps of FIG. 17 are the same as the steps of FIGS. 4 to 10 described above, a detailed description thereof is omitted.

In the steps of FIG. 17, the stacked insulation film 61 including the silicon oxide ($SiO_2$) film 58 and the silicon nitride (SiN) film 59 is formed and adhered across the rear surface (light incident surface) of the control circuit 24 and the pixel array 23 from the internal surface of the semiconductor removal region 52.

Figure 18:
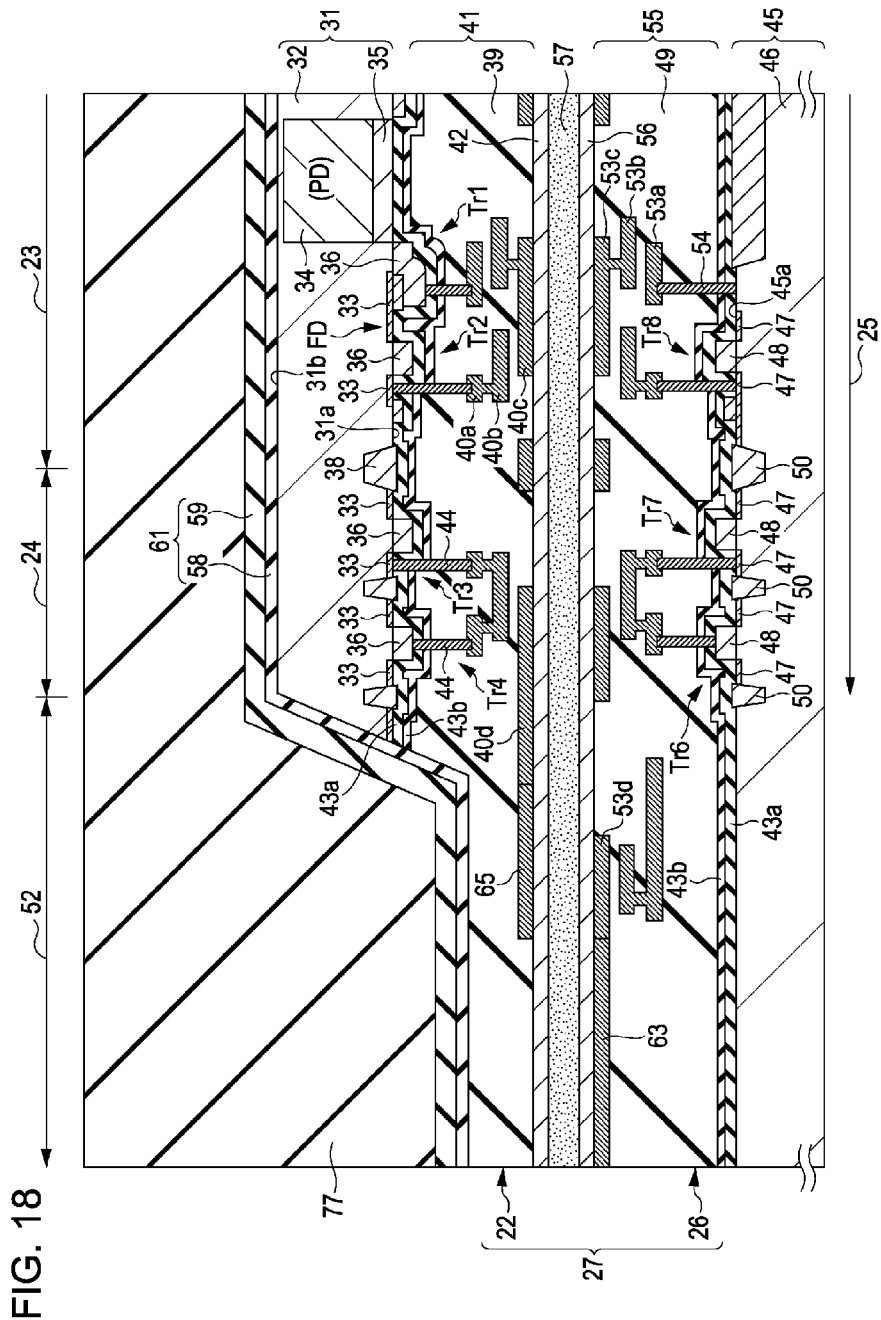
FIG. 18 is a diagram (illustrating one embodiment of a manufacturing process for a solid-state imaging device that is consistent with the present invention.

Next, as shown in FIG. 18, the insulation film 77 such as a silicon oxide film is stacked on the entirety of the rear surface of the semiconductor substrate 31 to bury the inside of the semiconductor removal region 52.

Figure 19:
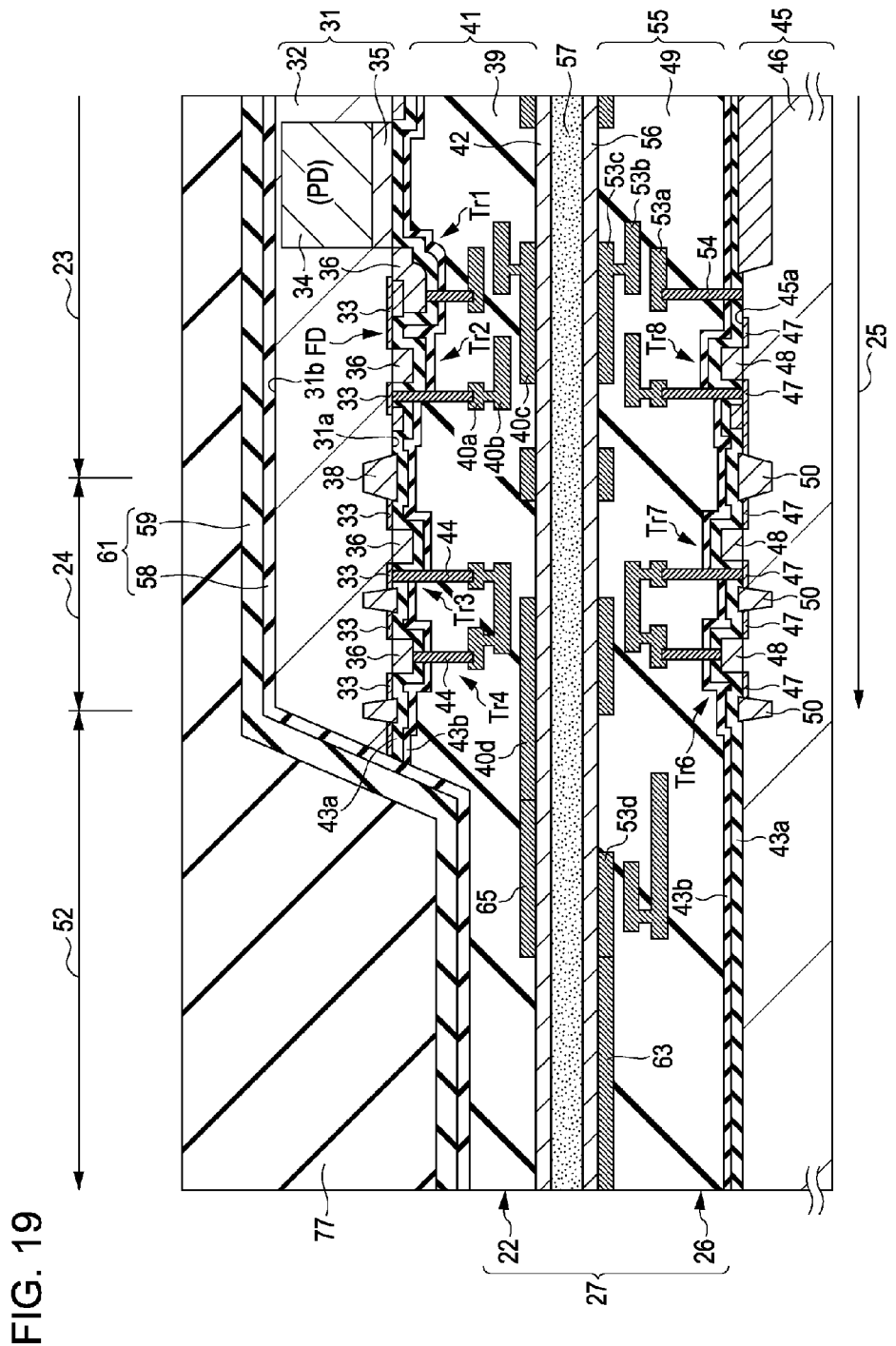
FIG. 19 is a diagram illustrating one embodiment of a manufacturing process for a solid-state imaging device that is consistent with the present invention.

Next, as shown in FIG. 19, the insulation film 77 is polished by a chemical mechanical polishing (CMP) method until the insulation film 77 has a necessary thickness.

Figure 20:
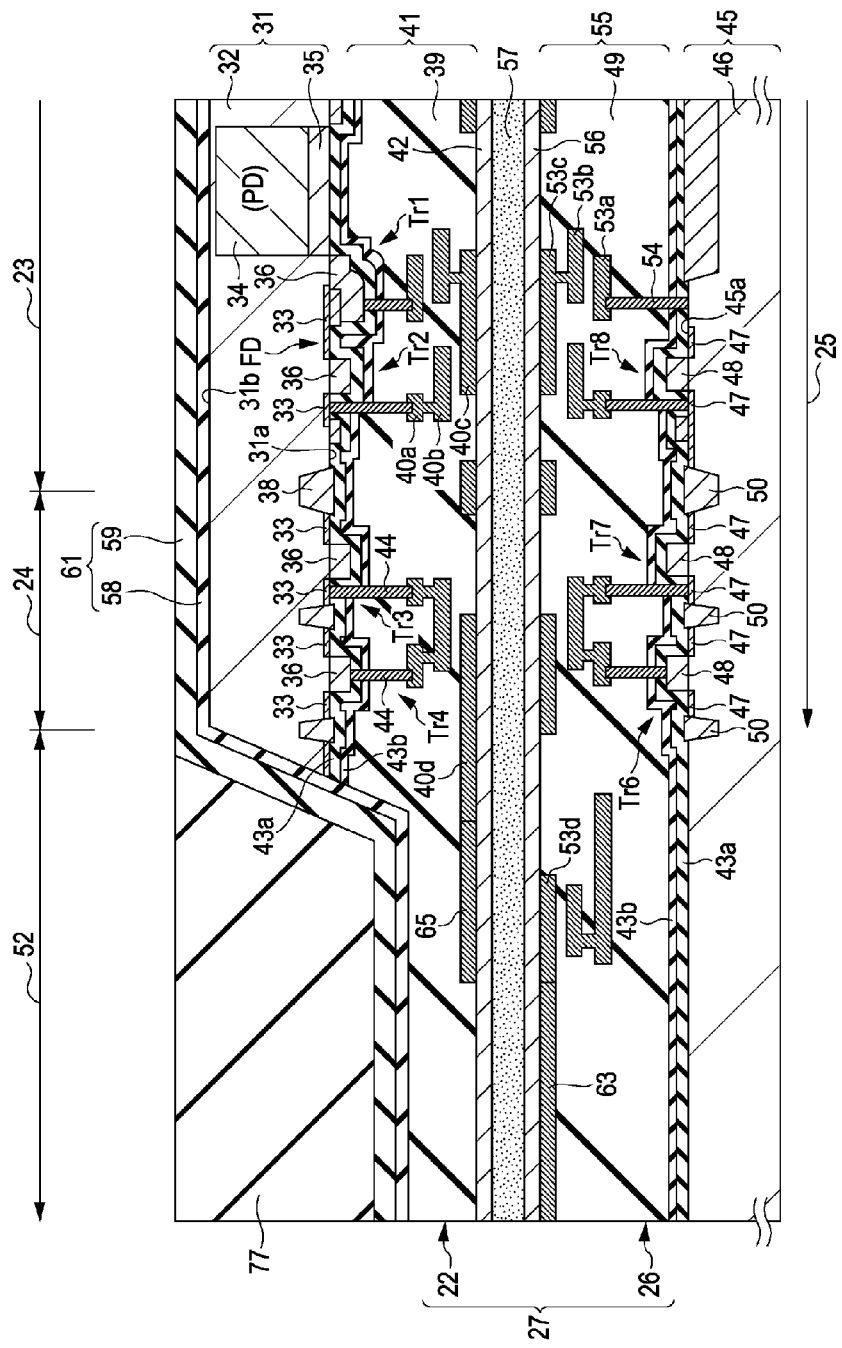
FIG. 20 is a diagram illustrating one embodiment of a manufacturing process for a solid-state imaging device that is consistent with the present invention.

Next, as shown in FIG. 20, the insulation film 77 is etched up to the silicon nitride film 59 by a wet etching method using hydrofluoric acid, and is subjected to planarization so as to be flush with the silicon nitride film 59. At this time, the silicon nitride film 59 serves as an etching stopper.

Figure 21:
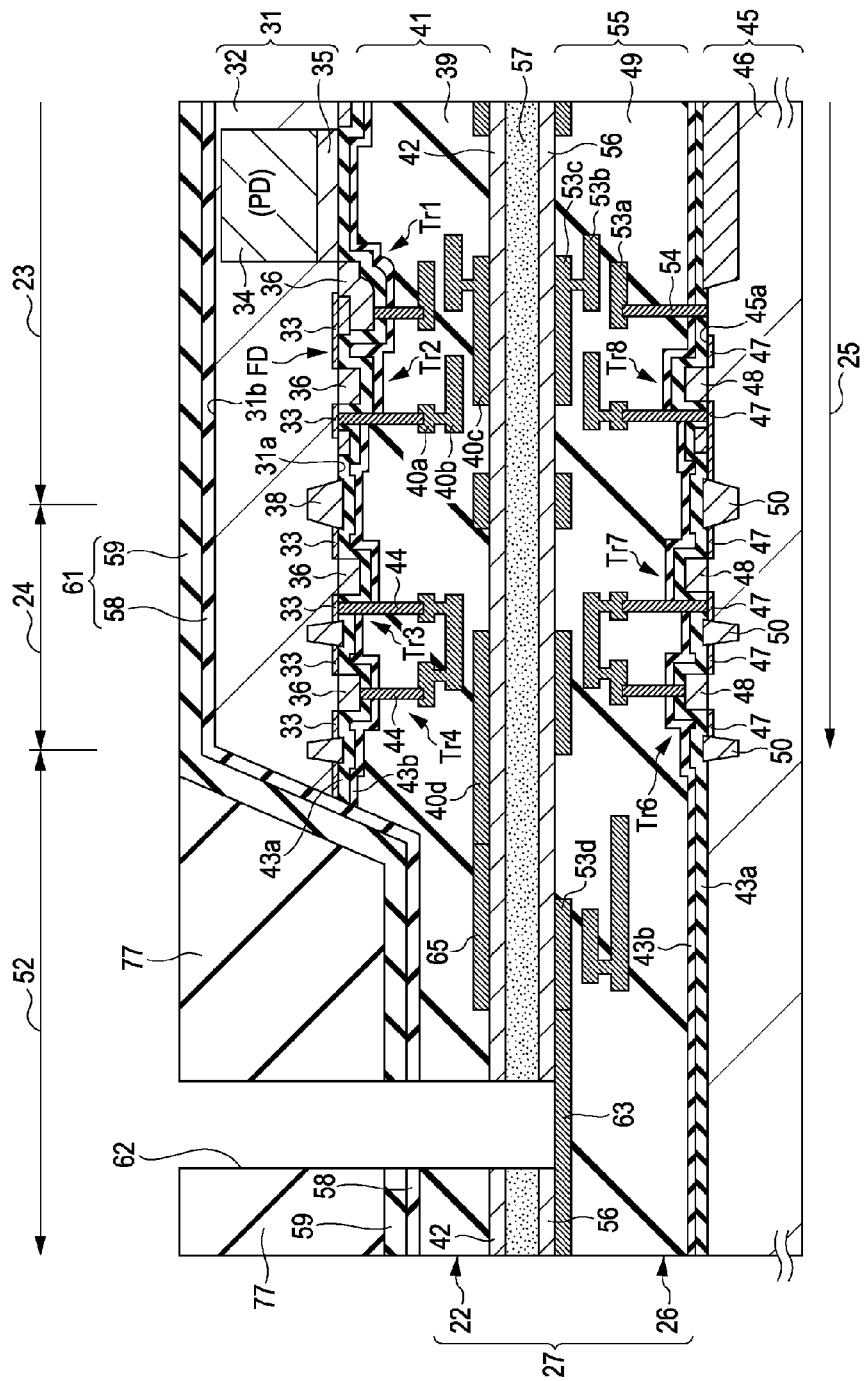
FIG. 21 is a diagram illustrating one embodiment of a manufacturing process for a solid-state imaging device that is consistent with the present invention.

Next, as shown in FIG. 21, the through connection hole 62 penetrated through the insulation film 77 the multi wiring layer 41 and reaching the second connection pad 63, which is connected to the necessary wiring 53d for the multi wiring layer 55 of the second semiconductor substrate 45, is formed in the semiconductor removal region 52. The through connection hole 62 reaches the second connection pad 63 electrically connected to the wiring 53d formed by the uppermost layer of the multi wiring layer 55, that is, the third-layer metal M13 like the above description. The plurality of through connection holes 62 are formed to correspond in number to the vertical signal lines of the pixel array 23. The wiring 53d formed by the third-layer metal M13 connected to the second connection pad 63 serves as the laying wiring corresponding to the vertical signal line. As an illustrated example, the second connection pad 63 is formed by the third-layer metal M13 and is formed so as to continue with the laying wiring 53d corresponding to the vertical signal line.

Figure 22:
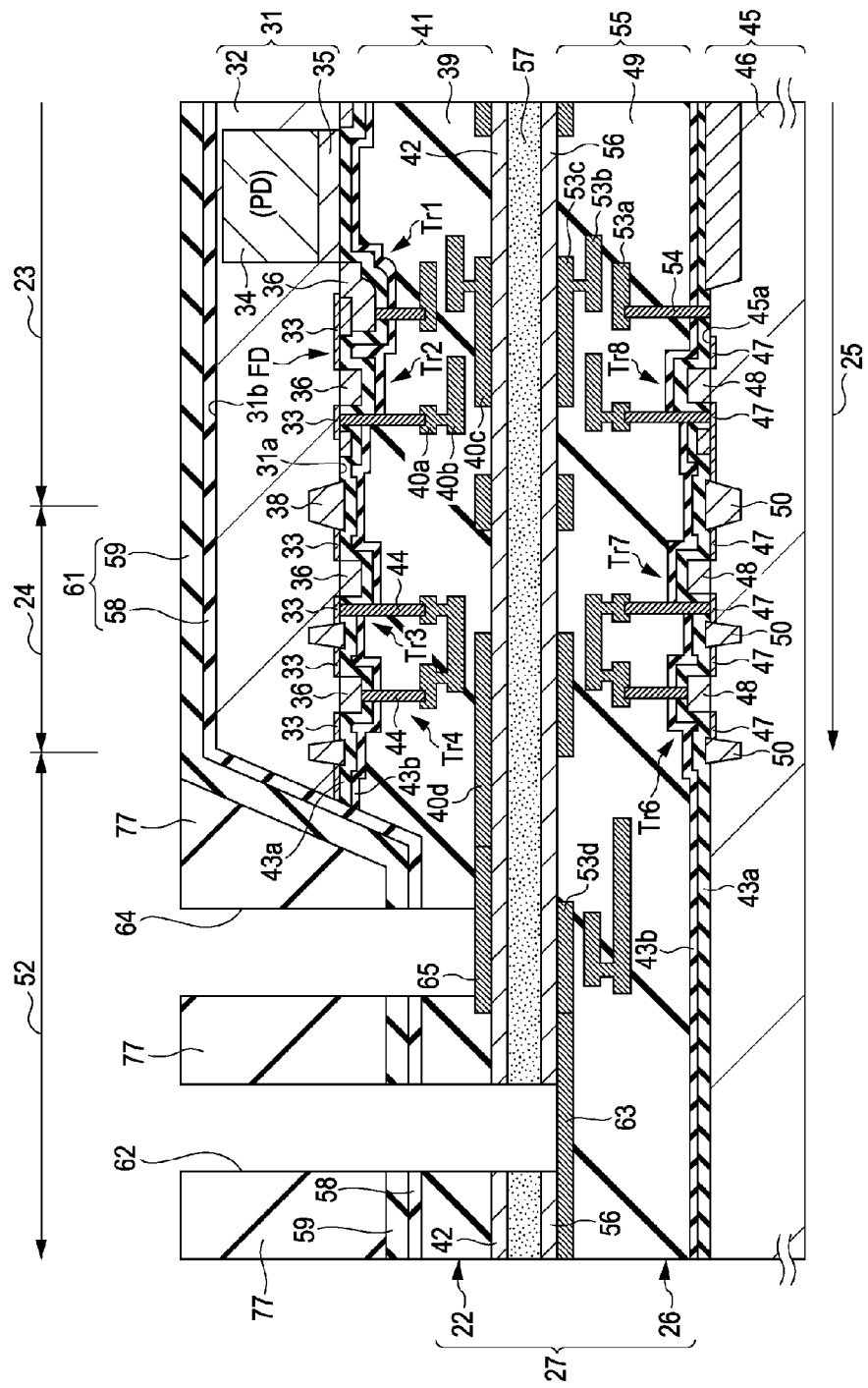
FIG. 22 is a diagram illustrating one embodiment of a manufacturing process for a solid-state imaging device that is consistent with the present invention.

Next, as shown in FIG. 22, the connection hole 64 formed from the insulation film 77 to the first connection pad 65 is formed in the semiconductor removal region 52. The connection hole 64 reaches the second connection pad 65 electrically connected to the wiring 40d formed by the third-layer metal M3 of the multi wiring layer 41. The plurality of connection holes 64 are formed to correspond in number to the vertical signal lines of the pixel array 23. The wiring 40d formed by the third-layer metal M3 connected to the first connection pad 65 serves as the laying wiring corresponding to the vertical signal line. As an illustrated example, the first connection pad 65 is formed by the third-layer metal M3 and is formed so as to continue with the laying wiring 40d corresponding to the vertical signal line.

Figure 23:
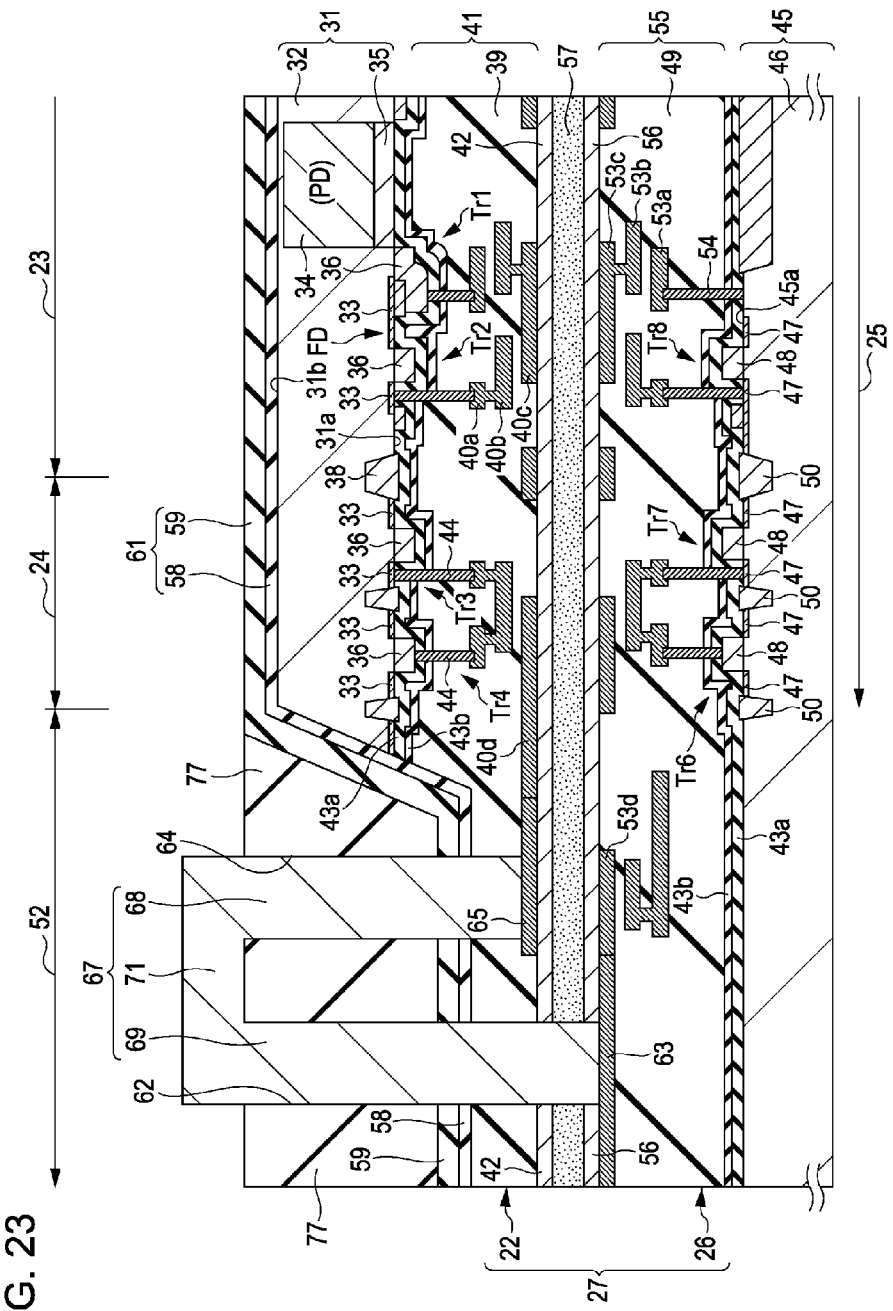
FIG. 23 is a diagram (illustrating one embodiment of a manufacturing process for a solid-state imaging device that is consistent with the present invention.

Next, as shown in FIG. 23, the connection wiring 67 is formed to electrically connect the first connection pad 65 to the second connection pad 63. That is, a conductive film is formed on the entirety of the rear surfaces of the insulation film 77 and the first semiconductor substrate 31 so as to be buried in both the connection holes 62 and 64, and then is subjected to etch-back and patterning to form the connection wiring 67. The connection wiring 67 includes the connection conductor 68 buried in the connection hole 64 and connected to the first connection pad 65 and the through connection conductor 69 buried in the through connection hole 62 and connected to the second connection pad. The connection wiring 67 further includes the link conductor 71 electrically linking the connection conductor 68 to the through connection conductor 69 on the insulation film 77 subjected to planarization. The connection conductor 68, the through connection conductor 69, and the link conductor 71 are integrally formed as the conductive film using the same metal film. The connection wiring 67 can be formed of metal, such as tungsten (W), aluminum (Al), or gold (Au), which can be patterned, via barrier metal (TiN or the like).

Figure 24:
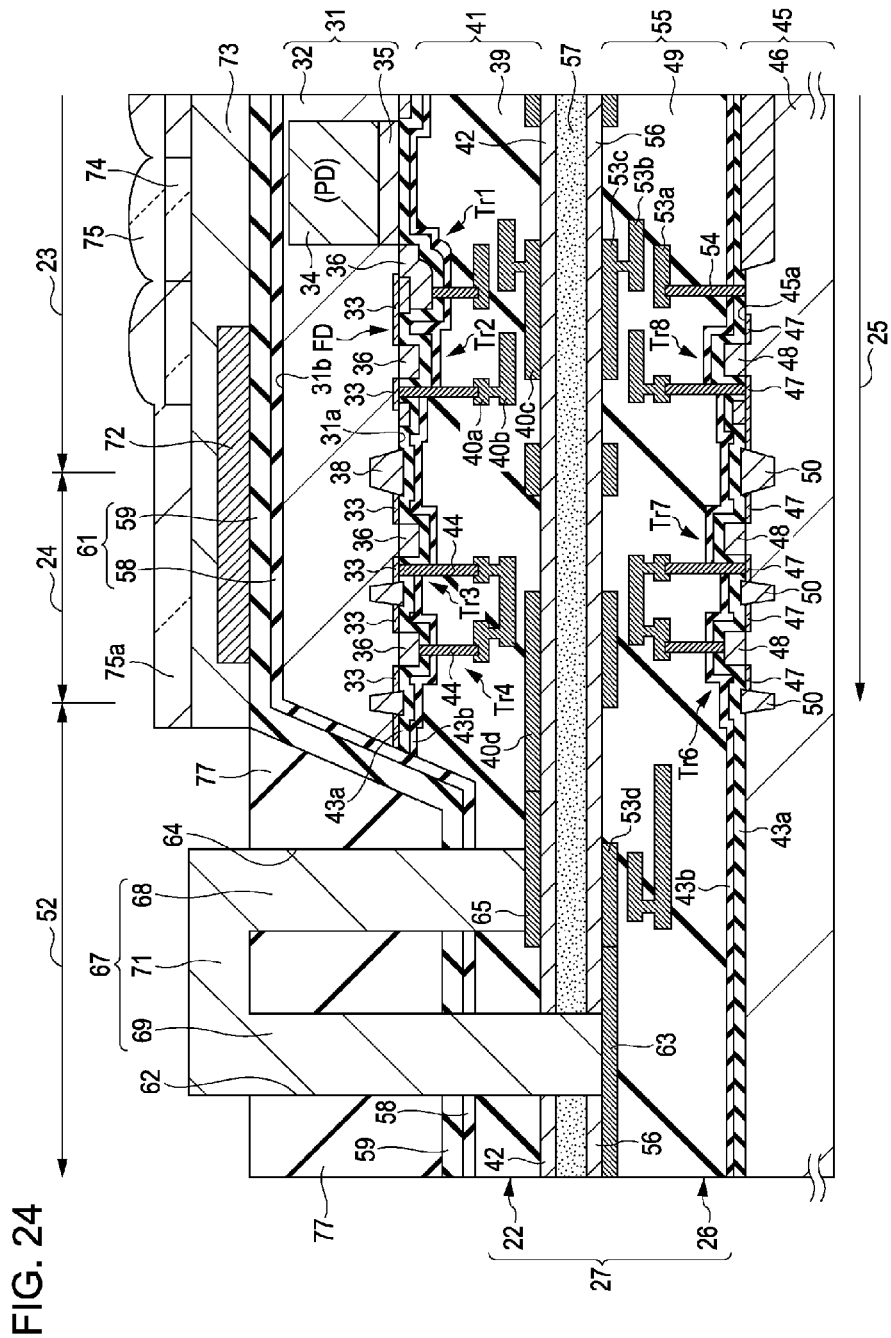
FIG. 24 is a diagram illustrating one embodiment of a manufacturing process for a solid-state imaging device that is consistent with the present invention.

Next, as shown in FIG. 24, the light-shielding film 72 is formed in the region where light has to be shielded. The light-shielding film 72 is formed on the control circuit 24, as schematically illustrated in the drawing. Alternatively, the light-shielding film 72 may be also formed on the pixel transistors. The light-shielding film 72 can be formed of metal such as tungsten (W). The planarization film 73 is formed across the pixel array 23 so as to cover the light-shielding film 72. Such as, but not limited to, red (R), green (G), and blue (B) on-chip color filters 74 are formed on the planarization film 73 so as to correspond to the respective pixels, and then the on-chip micro lenses 75 are formed on the on-chip color filters 74. The pixel array 23 and the control circuit 25 are finished for the first semiconductor substrate 31. The link conductor 71 of the connection wiring 67 serves as an electrode pad exposed to the outside. The logic circuit 25 is finished for the second semiconductor substrate 45.

Next, the individual divided chips are obtained, and thus the desired back-illuminated solid-state imaging device 78 shown in FIG. 16 is obtained.

In the solid-state imaging device 78 and the method of manufacturing the same according to the second embodiment, the part of the first semiconductor chip section 22, that is, the semiconductor portion of the region where the connection conductor 68 and the through connection conductor 69 are formed is completely removed, the insulation film 77 is buried in the removed semiconductor removal region 52. Since the connection conductor 68 and the through connection conductor 69 are buried in the connection hole 64 and the through connection hole 62 formed in the insulation film 77, the connection conductors 68 and 69 are distant from the side surface of the semiconductor substrate 31 by the insulation film 77, thereby reducing the parasitic capacitance between the connection conductors 68 and 69 and the semiconductor substrate 31. Since the inside of the semiconductor removal region 52 is buried by the insulation film 77, the surface of the semiconductor substrate 31 facing the side wall of the semiconductor removal region 52 can be reliably protected mechanically in cooperation with the stacked insulation film 61. Accordingly, high performance in the solid-state imaging device can be realized.

In this embodiment, the first semiconductor substrate 31 is thinned and the through connection hole 62 and the connection hole 64 are formed. Therefore, the aspect ratio of the holes is reduced, thereby forming the connection holes 62 and 64 with high precision. Accordingly, the high-performance solid-state imaging device can be manufactured with high precision.

Further description is omitted, but the same advantages as those of the first embodiment can be obtained.

Figure 25:
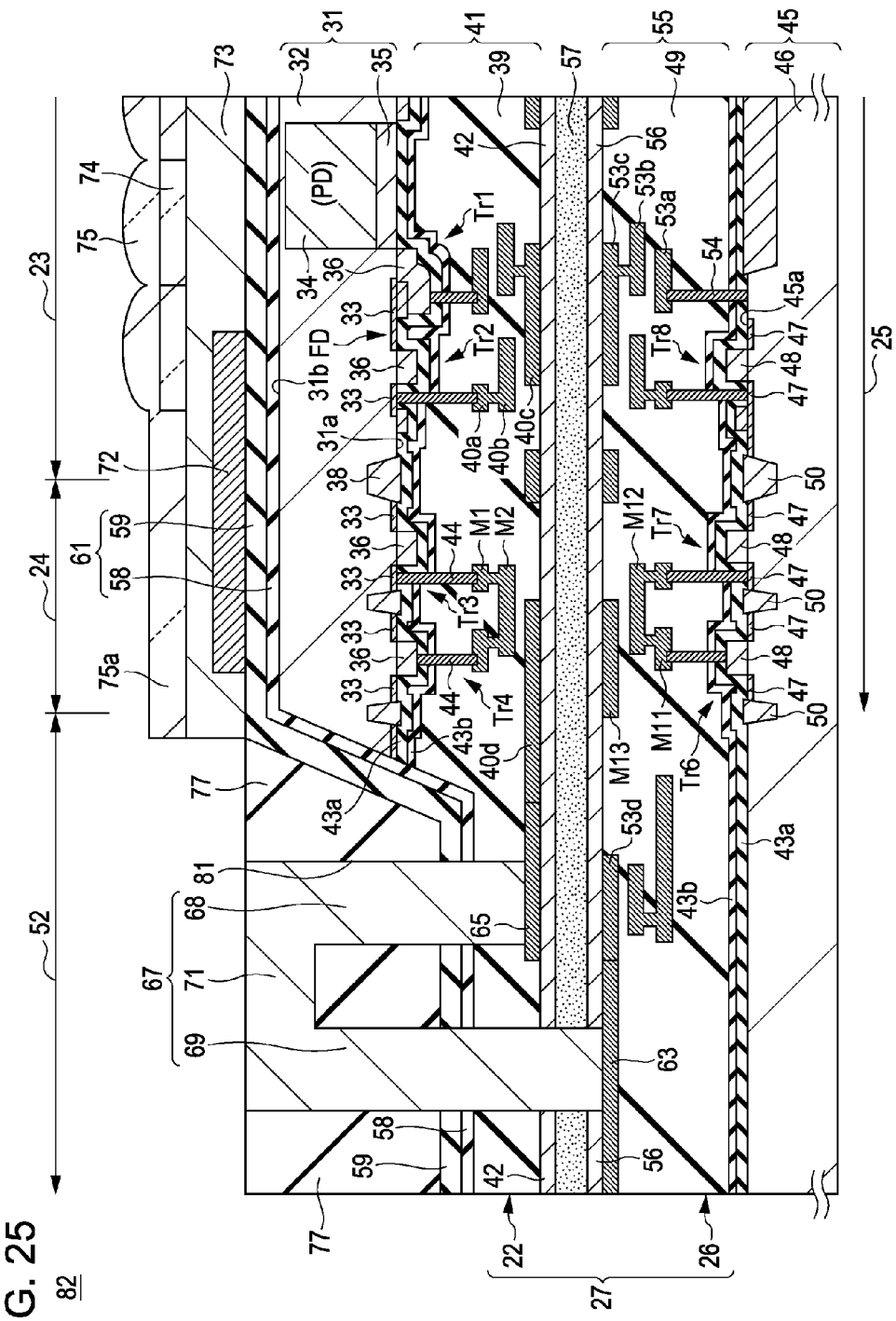
FIG. 25 is a diagram illustrating one embodiment of an overall configuration of the main units of a solid-state imaging device that is consistent with the present invention.

FIG. 25 is a diagram illustrating a semiconductor device, that is, a MOS solid-state imaging device according to a third embodiment of the invention. In the third embodiment, a solid-state imaging device 82 includes the stacked semiconductor chip 27 in which the first semiconductor chip section 22 including the pixel array 23 and the control circuit 24 and the second semiconductor chip section 26 including the logic circuit 25 are bonded to each other. The first semiconductor chip section 22 and the second semiconductor chip section 26 are bonded to each other so that multi wiring layers 41 and 55 face each other.

In this embodiment, the semiconductor removal region 52, where a part of a semiconductor portion of the first semiconductor chip section 22 is entirely removed, is formed and the stacked insulation film 61 extending from the internal surface of the semiconductor removal region 52 to the rear surface of the semiconductor substrate 31 is formed. An insulation film 77 subjected to planarization and thus flush with the front surface of the stacked insulation film 61 on the semiconductor substrate 31 is formed in the semiconductor removal region 52. A concave portion 81 with a necessary depth is formed from the front surface in the portion corresponding to the connection wiring 67 of the insulation film 77. The etching rate of the insulation film 77 is different from that of the silicon nitride film 59 on the front surface of the stacked insulation film 61. The insulation film 77 is formed of such as, but not limited to, a silicon oxide film.

Then, the connection hole 64 and the through connection hole 62 penetrated through the insulation film 77 below the concave portion 81 and reaching the first connection pad 65 and the second connection pad 63, respectively, are formed. The connection wiring 67 connecting the first connection pad 65 to the second connection pad 63 through both the connection holes 62 and 64 is formed. The connection wiring 67 includes the connection conductor 68 buried in the connection holes 64 and 62 and electrically connected to the first connection pad 65, the through connection conductor 69 electrically connected to the second connection pad 63, and the link conductor 71 electrically connecting both of the conductors 68 and 69 to each other in the upper stage. The connection conductor 68, the through connection conductor 69, and the link conductor 71 are integrally and necessarily formed of metal. The link conductor 71 is buried in the concave portion 81 of the insulation film 77. The front surface of the link conductor 71 is flush with the front surface of the insulation film 77.

The other configuration is the same as the above-described configuration of the first embodiment. Therefore, the same reference numerals are given to the corresponding members in FIG. 3 and repetition of the description thereof is omitted.
Exemplary Method of Manufacturing Solid-state Imaging Device FIGS. 26 to 30 are diagrams illustrating a method of manufacturing the solid-state imaging device 82 according to the third embodiment.

Figure 26:
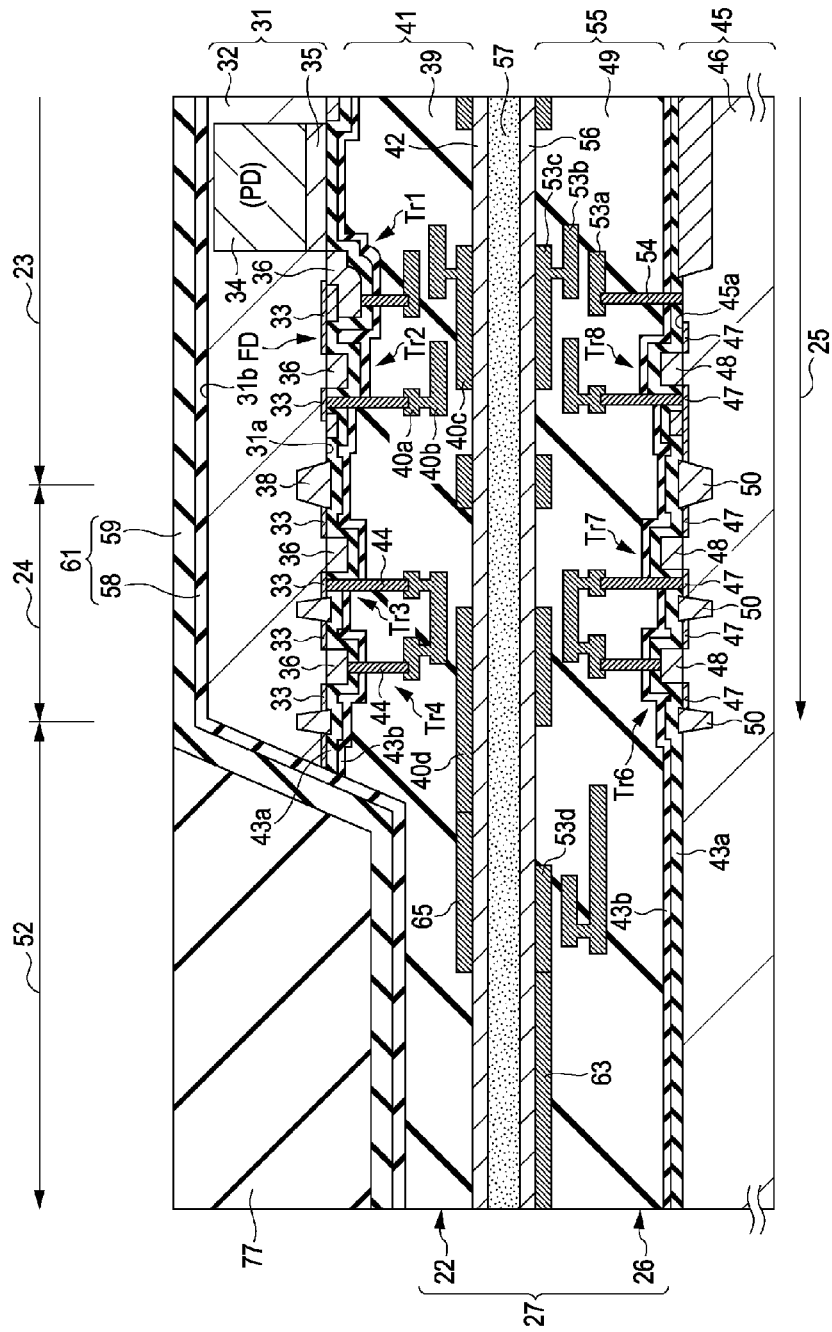
FIG. 26 is a diagram illustrating one embodiment of a manufacturing process for a solid-state imaging device that is consistent with the present invention.

FIG. 26 is a diagram illustrating the same configuration as that in FIG. 20 in the steps of manufacturing the solid-state imaging device 78 according to the above-described second embodiment. Since the steps of FIG. 26 are the same as the steps of FIGS. 4 to 10 and the steps of FIGS. 17 to 20 described above, a detailed description thereof is omitted.

In the step of FIG. 26, the insulation film 77 is stacked so as to be buried in the semiconductor removal region 52, and then the front surface of the insulation film 77 is subjected to planarization by chemical mechanical polishing (CMP) and wet etching so as to be flush with the front surface of the stacked insulation film 61.

Figure 27:
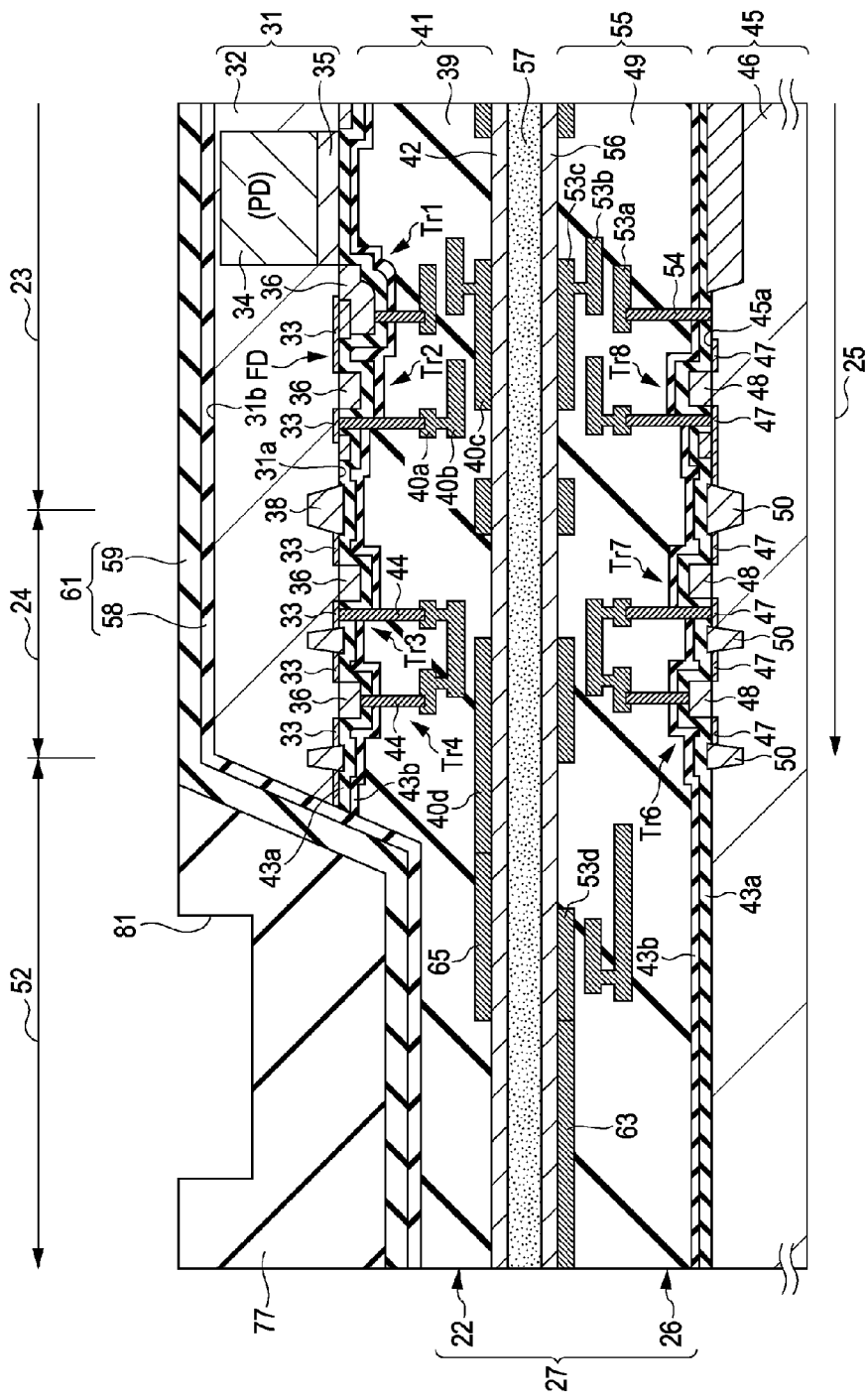
FIG. 27 is a diagram illustrating one embodiment of a manufacturing process for a solid-state imaging device that is consistent with the present invention.

Next, as shown in FIG. 27, the concave portion 81 with the necessary depth from the front surface is formed on the front surface of the insulation film 77 to correspond to the region of the connection wiring 67.

Figure 28:
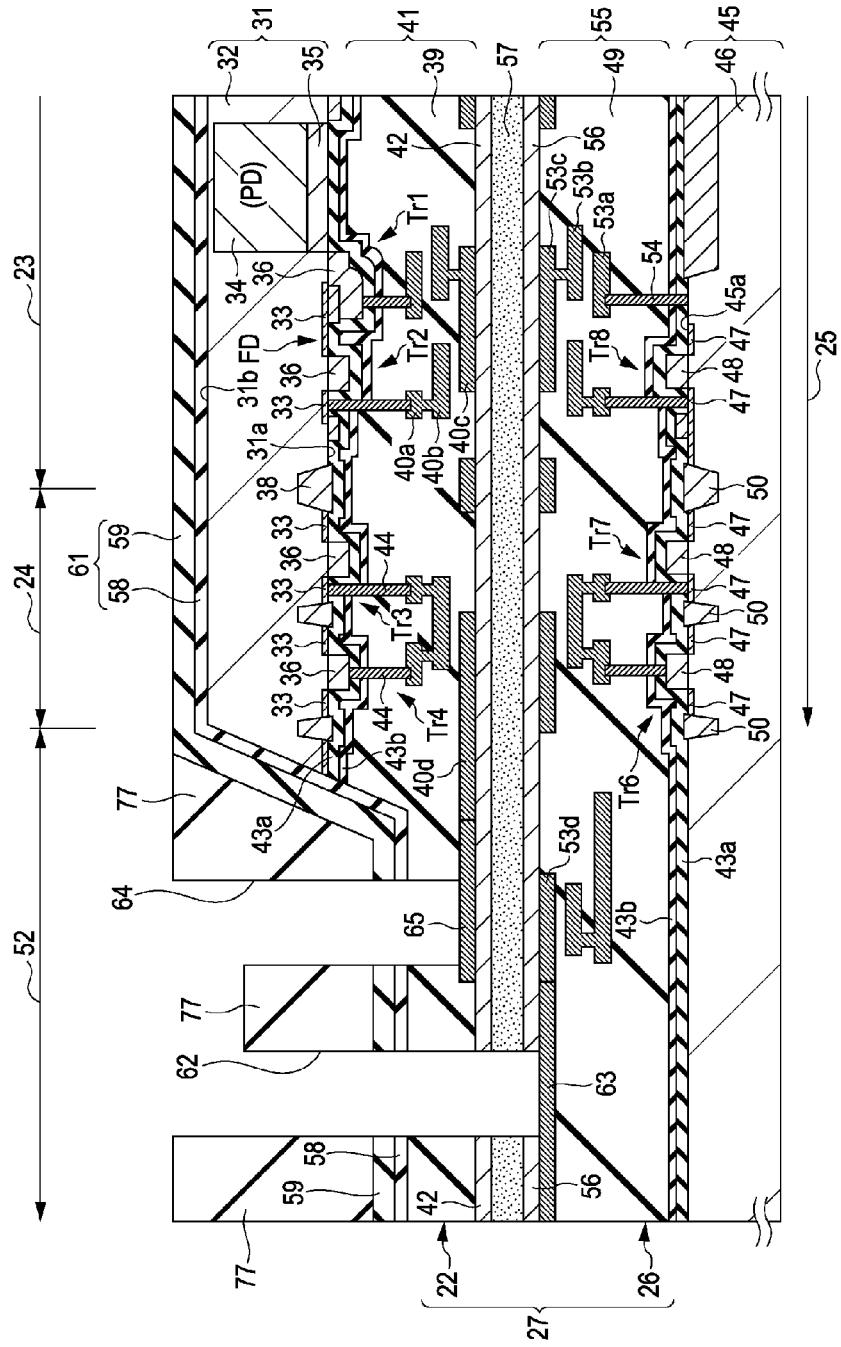
FIG. 28 is a diagram illustrating one embodiment of a manufacturing process for a solid-state imaging device that is consistent with the present invention.

Next, as shown in FIG. 28, the through connection hole 62 penetrated through the insulation film 77 below the concave portion 81 and the multi wiring layer 41 and reaching the second connection pad 63 is formed. The through connection hole 62 reaches the second connection pad 63 electrically connected to the wiring 53d formed by the uppermost layer of the multi wiring layer 55 of the second semiconductor chip section 26, that is, the third-layer metal M13 like the above description. The plurality of through connection holes 62 are formed to correspond in number to the vertical signal lines of the pixel array 23. The wiring 53d connected to the second connection pad 63 serves as the laying wiring corresponding to the vertical signal line. As an illustrated example, the second connection pad 63 is formed by the third-layer metal M13 and is formed so as to continue with the laying wiring 53d corresponding to the vertical signal line.

Then, the connection hole 64 formed from the insulation film 77 below the concave portion 81 to the first connection pad 65 is formed in the semiconductor removal region 52. The connection hole 64 reaches the second connection pad 65 electrically connected to the wiring 40d formed by the third-layer metal M3 of the multi wiring layer 41 of the first semiconductor chip section 22. The plurality of connection holes 64 are formed to correspond in number to the vertical signal lines of the pixel array 23. The metal wiring 40c formed by the third-layer metal M3 connected to the first connection pad 65 serves as the laying wiring corresponding to the vertical signal line. As an illustrated example, the first connection pad 65 is formed by the third-layer metal M3 and is formed so as to continue with the laying wiring 40d corresponding to the vertical signal line.

Figure 29:
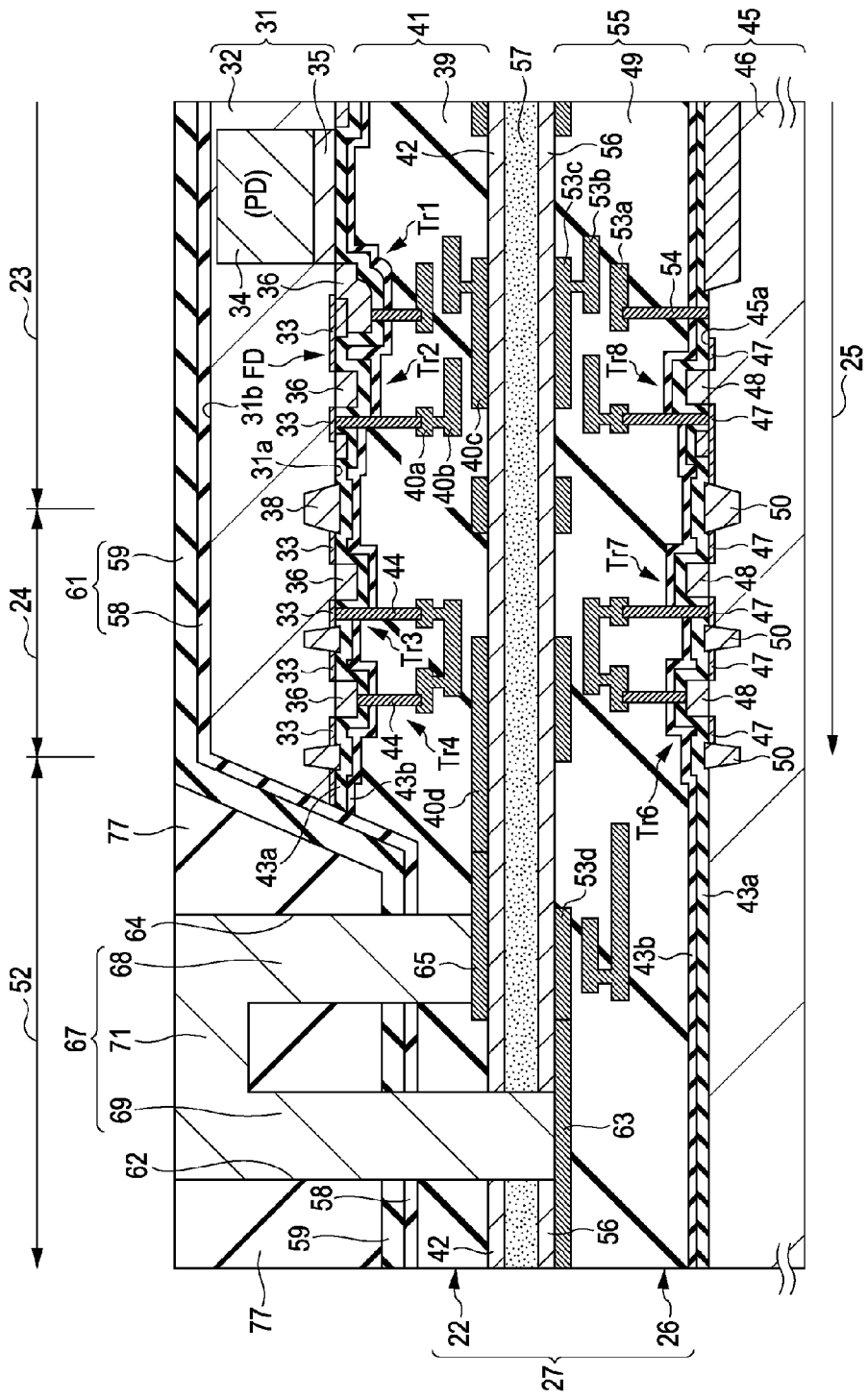
FIG. 29 is a diagram illustrating one embodiment of a manufacturing process for a solid-state imaging device that is consistent with the present invention.

Next, as shown in FIG. 29, the connection wiring 67 is formed to electrically connect the first connection pad 65 to the second connection pad 63. That is, a conductive film is formed on the entirety of the rear surfaces of the insulation film 77 and the first semiconductor substrate 31 so as to be buried in the concave portion 81 and both the connection holes 62 and 64, and then is subjected to etch-back to form the connection wiring 67. The connection wiring 67 includes the connection conductor 68 buried in the connection hole 64 and connected to the first connection pad 65 and the through connection conductor 69 buried in the through connection hole 62 and connected to the second connection pad. The connection wiring 67 further includes the link conductor 71 electrically linking the connection conductor 68 to the through connection conductor 69. The link conductor 71 is subjected to planarization to be buried in the concave portion 81 and be flush with the front surface of the insulation film 77. The connection conductor 68, the through connection conductor 69, and the link conductor 71 are integrally formed as the conductive film using the same metal. The connection wiring 67 can be formed of copper (Cu), since the connection wiring 67 is formed by etch-back. The link conductor 71 can be formed of metal, such as tungsten (W), aluminum (Al), or gold (Au), which can be patterned, via barrier metal (TiN or the like).

Figure 30:
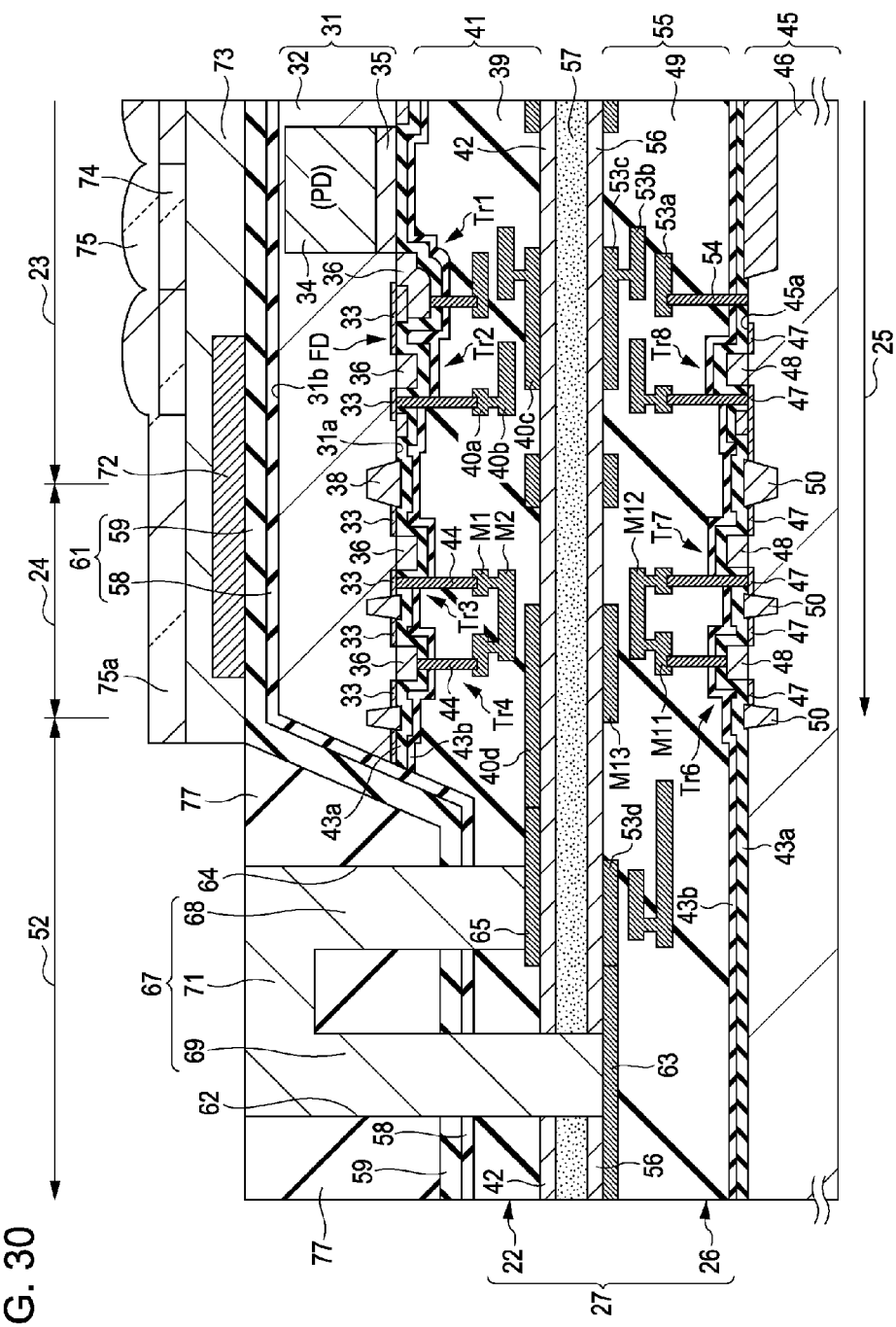
FIG. 30 is a diagram illustrating one embodiment of a manufacturing process for a solid-state imaging device that is consistent with the present invention.

Next, as shown in FIG. 30, the light-shielding film 72 is formed in the region where light has to be shielded. The light-shielding film 72 is formed on the control circuit 24, as schematically illustrated in the drawing. Alternatively, the light-shielding film 72 may be also formed on the pixel transistors. The light-shielding film 72 can be formed of metal such as tungsten (W). The planarization film 73 is formed across the pixel array 23 so as to cover the light-shielding film 72. Such as, but not limited to, red (R), green (G), and blue (B) on-chip color filters 74 are formed on the planarization film 73 so as to correspond to the respective pixels, and then the on-chip micro lenses 75 are formed on the on-chip color filters 74. The pixel array 23 and the control circuit 25 are finished for the first semiconductor substrate 31. The link conductor 71 of the connection wiring 67 serves as an electrode pad exposed to the outside. The logic circuit 25 is finished for the second semiconductor substrate 45.

Next, the divided individual chips are obtained, and thus the desired back-illuminated solid-state imaging device 82 shown in FIG. 25 is obtained.

In the solid-state imaging device and the method of manufacturing the same according to the third embodiment, the part of the first semiconductor chip section 22, that is, the semiconductor portion of the region where the connection conductor 68 and the through connection conductor 69 are formed is completely removed, the insulation film 77 is buried in the removed semiconductor removal region 52. The concave portion 81 is formed in the insulation film 77, and the connection conductor 68 and the through connection conductor 69 are buried in the connection hole 64 and the through connection hole 62 formed in the insulation film 77 below the concave portion 81. Accordingly, both the connection conductors 68 and 69 are distant from the side surface of the semiconductor substrate 31 by the insulation film 77, thereby reducing the parasitic capacitance between the connection conductors 68 and 69 and the semiconductor substrate 31. Since the inside of the semiconductor removal region 52 is buried by the insulation film 77, the surface of the semiconductor substrate 31 facing the side wall of the semiconductor removal region 52 can be reliably protected mechanically in cooperation with the stacked insulation film 61. Accordingly, high performance in the solid-state imaging device can be realized.

Since the link conductor 71 is buried in the concave portion 81 of the insulation film 77 and the link conductor 71 is subjected to planarization so as to be flush with the front surface of the insulation film 77, the solid-state imaging device with a small uneven surface can be obtained.

In the third embodiment, the first semiconductor substrate 31 is thinned, the concave portion 81 is formed in the insulation film 77, and the through connection hole 62 and the connection hole 64 are formed. Therefore, the aspect ratio of the holes is reduced, thereby forming the connection holes 62 and 64 with high precision. Accordingly, the high-performance solid-state imaging device can be manufactured with high precision.

Further description is omitted, but the same advantages as those of the first embodiment can be obtained.

In the second and third embodiments, the configuration in FIG. 2C can be used.

In the above-described embodiments, the two semiconductor chips 22 and 26 are bonded to each other. The solid-state imaging device according to the embodiment of the invention may be configured by bonding two or more semiconductor chip sections to each other. Even in the configuration in which two or more semiconductor chip sections are bonded to each other, the above-described configuration in which the semiconductor portion is completely removed is applied to the connection portion in which the first semiconductor chip section 22 having the pixel array 23 and the second semiconductor chip section 26 having the logic circuit 25 processing signals.

In the configuration in which the above-described semiconductor chip sections are bonded to each other, parasitic capacitance such as pair ground capacitance or pair adjacent coupling capacitance occurs. In particular, since the connection conductor 68 and the through connection conductor 69 have a large surface area, it is preferable to reduce the adjacent coupling capacitance between the connection conductors of the adjacent lines or the laying wirings of the adjacent lines. Here, the portion between the connection conductors indicates a portion between the connection conductors of the adjacent pairs when the connection conductor 68 and the through connection conductor 69 are paired. On the other hand, since the area and pitch of the first connection pad 65 and the area and pitch of the second connection pad 63 are larger than the pixel area and the pixel pitch, a practically obtainable layout is preferable.

Next, embodiments in which the practically obtainable layout is realized to reduce the pair adjacent coupling capacitance will be described.

Figure 31:
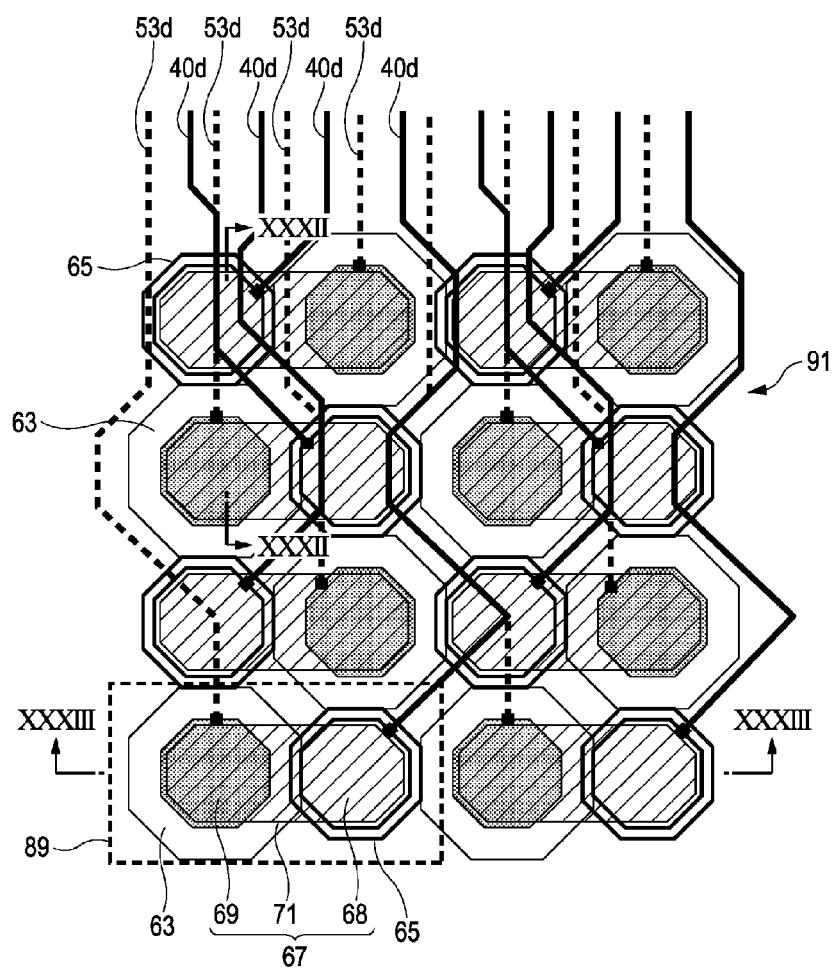
FIG. 31 is a diagram illustrating one embodiment of an overall configuration of the main units of a solid-state imaging device that is consistent with the present invention.
Figure 32:
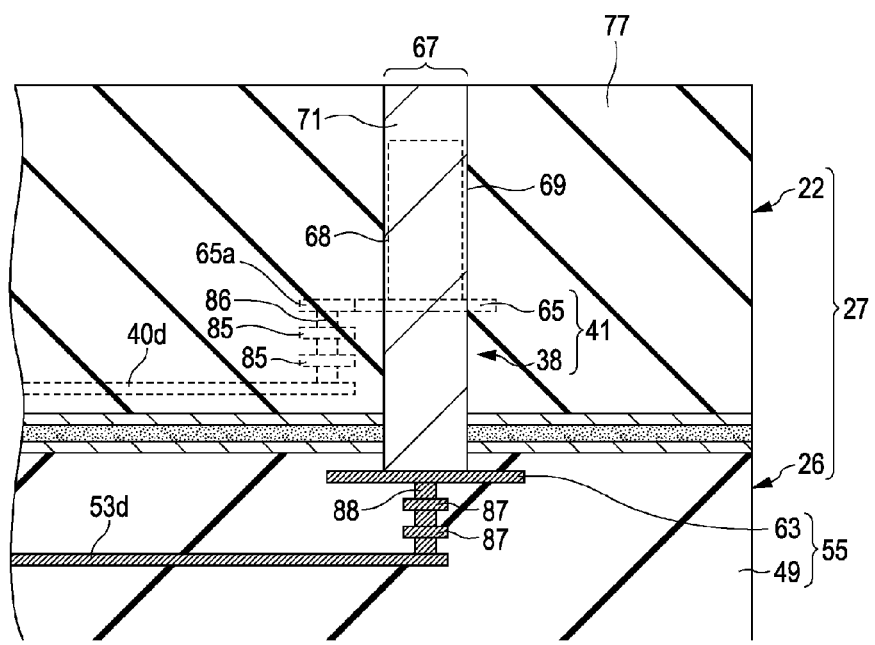
FIG. 32 is a schematic sectional view taken along the line XXXII-XXXII of FIG. 31.
Figure 33:
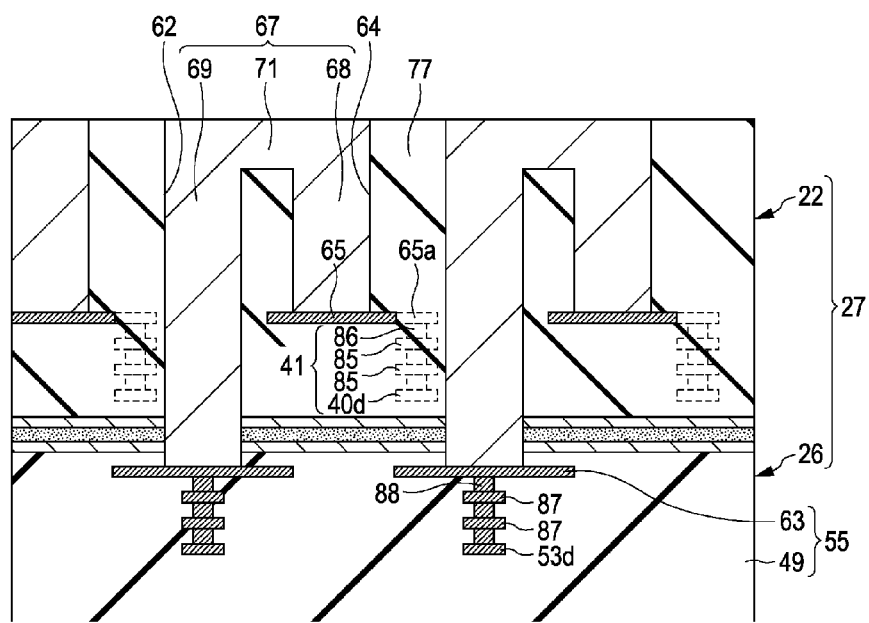
FIG. 33 is a schematic sectional view taken along the line XXXIII-XXXIII of FIG. 31.
Figure 34:
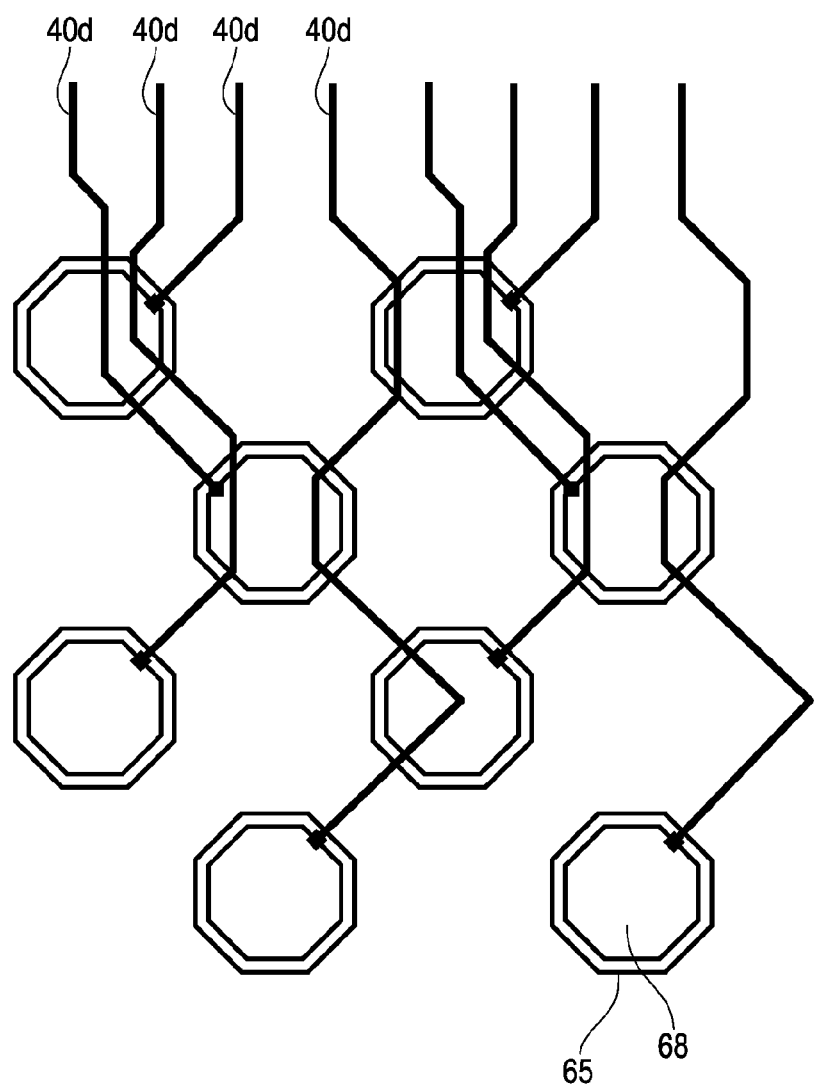
FIG. 34 is an exploded plan view illustrating a first connection pad in FIG. 31.
Figure 35:
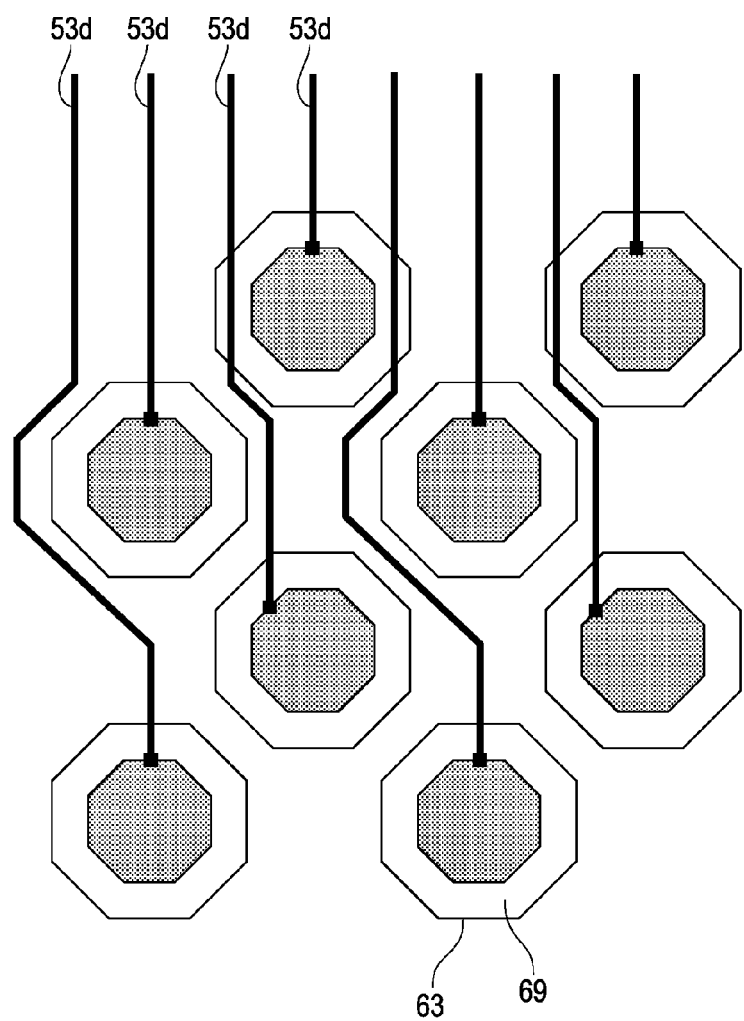
FIG. 35 is an exploded plan view illustrating a second connection pad in FIG. 31.

FIGS. 31 to 35 are diagrams illustrating a semiconductor device, that is, a MOS solid-state imaging device according to a fourth embodiment of the invention. In the drawings, only the layout of the wiring connection portion including the connection pads electrically connecting the first and second semiconductor chip sections to each other is shown. FIG. 31 is a plan view illustrating a connection pad array. FIG. 32 is a sectional view taken along the line XXXII-XXXII of FIG. 31. FIG. 33 is a sectional view taken along the line XXXIII-XXXIII of FIG. 31. FIGS. 34 and 35 are exploded plan views of FIG. 31.

In a solid-state imaging device 84 according to the fourth embodiment, like the above description, two semiconductor chip sections 22 and 26 are bonded to each other, the part of a semiconductor portion of the first semiconductor chip section 22 is removed, and both the semiconductor chip sections 22 and 26 are connected to each other through the connection wiring 67 in the semiconductor removal region 52. In this embodiment, since the several configurations of the above-described embodiments are applicable to the other configuration excluding the layout of the wiring connection portion, a detailed description thereof is omitted.

In the fourth embodiment, the wirings 40 [40a, 40b, 40c, and 40d] of the multi wiring layer 41 in the first semiconductor chip section 22 are formed by a plurality of layers by four-layer metals. The first connection pad 65 is formed by the first-layer metal, and the laying wiring 40d corresponding to the vertical signal line is formed by the metal subsequent to the second-layer metal. The laying wiring 40d corresponding to the vertical signal line is formed by the fourth-layer metal. The wirings 53 [53a, 53b, 53c, and 53d] of the multi wiring layer 55 in the second semiconductor chip section 26 are formed by a plurality of layers by four-layer metals. The second connection pad 63 is formed by the metal subsequent to the second-layer metal the third-layer metal or the fourth-layer metal. The second connection pad 63 is formed by the fourth-layer metal. The laying wiring 53d corresponding to the vertical signal line is formed by the first-layer metal. In the first semiconductor chip section 22, the first connection pad 65 formed by the first-layer metal is electrically connected to the laying wiring 40d formed by the fourth-layer metal via a connection portion 85 and a via conductor 86 respectively formed by the second-layer metal and the third-layer metal. In the second semiconductor chip section 26, the second connection pad 63 formed by the fourth-layer metal is electrically connected to the laying wiring 53d formed by the first-layer metal via a connection portion 87 and a via conductor 88 respectively formed by the third-layer metal and the second-layer metal.

The second connection pad 63 is formed to have an area larger than that of the first connection pad 65 in consideration of the difference between the positions at which the first semiconductor chip section 22 and the second semiconductor chip section 26 are bonded to each other. A pair of first connection pad 65 and second connection pad 63 is collectively called a connection pad pair 89.

The first connection pad 65 and the second connection pad 63 have an octagonal shape in a plan view, and preferably have a regular octagonal shape. The first and second, connection pads of the connection pad pair 89 are arranged in a horizontal direction. The plurality of connection pad pairs 89 is arranged in the horizontal direction in which the laying wirings 40d and 53d of the respective lines are arranged. On the other hand, a plurality of stages, in this embodiment, four stages of the connection pad pairs 89, is arranged in the vertical direction. That is, in the wiring connection portion of both the semiconductor chip sections 22 and 26, the first connection pads 65 and the second connection pads 63 with the regular octagonal shape are alternately arranged in the horizontal and vertical directions. Here, the plurality of connection pad pairs 89 is arranged in the horizontal direction and four stages of the connection pad pairs 89 are arranged in the vertical direction to configure a connection pad array 91. Here, the octagonal shape is defined. The octagonal first connection pad 65 may integrally have a connection protrusion portion 65a protruding in part, since the octagonal first connection pad 65 is connected to the laying wiring 40d (see FIG. 32). In this case, the shape slightly protrudes in terms of the entire octagonal shape, and thus falls within the range of the octagon.

In the connection pad array 91, the first connection pads 65 and the second connection pads 63 are densely arranged in a plan view. The first connection pads 65 and the second connection pads 63 may be arranged to partially overlap with each other. The connection conductors 68 and the through connection conductors 69 are connected to the first connection pads 65 and the second connection pads 63, respectively, and the first semiconductor chip section 22 and the second semiconductor chip section 26 are electrically connected to each other via the connection wirings 67 each including the link conductor 71 linking both the connection conductors 68 and 69 to each other. The connection conductor 68 and the through connection conductor 69 may be formed to have the same octagonal shape as the planar shape of the connection pads 65 and 63 corresponding to the cross-section shapes of the connection conductor 68 and the through connection conductor 69. The connection wiring 67 is formed in the same way as that of the third embodiment. That is, the insulation film 77 is buried in the semiconductor removal region 52, the connection conductor 65 and the through connection conductor 63 are penetrated through the insulation film 77, the front surface of the link conductor 71 is subjected to planarization so as to be flush with the front surface of the insulation film 77.

In this embodiment, the laying wirings 40d and 53d each corresponding to four vertical signal lines are connected to the first connection pads 65 and the second connection pads 63 of the four-stage connection pad pairs 89, respectively. In the first semiconductor chip section 22, the first connection pads 65 are each formed by the first-layer metal and the laying wirings 40d are each formed by the fourth-layer metal. Since the laying wirings 40d can cross below the first connection pads 65, the distance between the adjacent laying wirings 40d can be increased. Likewise, in the second semiconductor chip section 26, the second connection pads 63 are each formed by the fourth-layer metal and the laying wirings 53d are each formed by the first-layer metal. Since the laying wirings 53d can be disposed so as to cross below the second connection pads 63, the distance between the adjacent laying wirings 53d can be increased.

In the solid-state imaging device 84 according to the fourth embodiment, the planar shapes of the first connection pads 65 and the second connection pads 63 are octagonal and the connection pad array 91 is formed in which the first connection pads 65 and the second connection pads 63 are alternately arranged densely in the horizontal and vertical directions. That is, the dense connection pad array 91 is formed in the wiring connection portion of both the semiconductor chip sections 22 and 26. Since the laying wirings 40d and 52d corresponding to the vertical signal lines of four lines are connected to each of the four-stage connection pad pairs 89 of the connection pad array 91, the distance between the adjacent laying wirings 40d and the distance between the adjacent laying wirings 53d are increased, thereby reducing the adjacent coupling capacitance. Moreover, since there is the insulation film 77 between the adjacent connection conductor pairs, the adjacent coupling capacitance between the connection conductor pairs can be reduced.

A wiring resistance difference caused by the difference in the wiring length of the laying wirings of four lines is reduced in the configuration in which the pairs of first connection pads 65 and second connection pads 63 are arranged in the horizontal direction, compared to a configuration described below in which the pairs of first connection pads 65 and second connection pads 63 are arranged in the vertical direction.

The area and pitch of the connection pads 65 and 63 are larger than the area and pitch of the pixels. However, in the above-described layout of the connection pads 65 and 63, the wirings 40d and 53d can be drawn, thereby providing the high-performance solid-state imaging device.

In the fourth embodiment, even when the configuration of the connection wirings 67 of the first and second embodiments is used, the adjacent coupling capacitance can be similarly reduced.

In the fourth embodiment, the same advantages as those of the first to third embodiments can be obtained.

Figure 36:
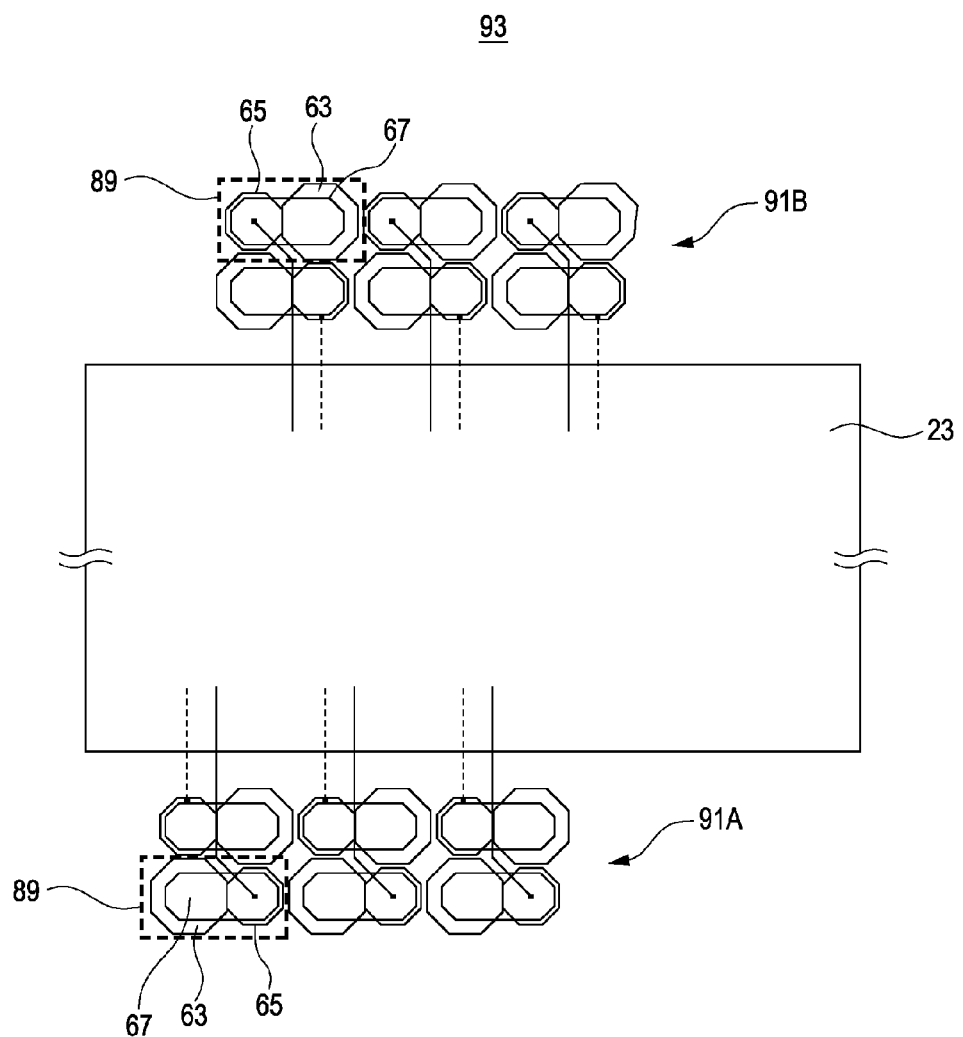
FIG. 36 is a diagram illustrating the overall configuration of the main units of a solid-state imaging device that is consistent with the present invention.

FIG. 36 is a diagram illustrating a semiconductor device, that is, a MOS solid-state imaging device according to a fifth embodiment of the invention. In the drawing, only the layout of the wiring connection portion including the connection pads 65 and 63 electrically connecting the first semiconductor chip section 22 to the second semiconductor chip section 26 is shown.

In a solid-state imaging device 93 according to the fifth embodiment, like the above description, two semiconductor chip sections 22 and 26 are bonded to each other, the part of a semiconductor portion of the first semiconductor chip section 22 is removed, and both the semiconductor chip sections 22 and 26 are connected to each other through the connection wiring 67 in the semiconductor removal region 52. In this embodiment, since the several configurations of the above-described embodiments are applicable to the other configuration excluding the layout of the wiring connection portion, a detailed description thereof is omitted.

In the fifth embodiment, connection pad arrays 91A and 91B are disposed on both outsides to face each other in the vertical direction with the pixel array 23 interposed therebetween, and the laying wirings 40d and 53d corresponding to the vertical signal lines are alternately connected to the connection pad arrays 91A and 91B. In this embodiment, as in FIG. 31, the connection pad pairs 89 in which the pairs of first connection pads 65 and second connection pads 63 are arranged in the horizontal direction are disposed in a plurality of stages in two stages. The connection pad pairs 89 of the connection pad arrays 91A and 91B are densely arranged. The pairs of laying wirings 40d and 53d are alternately connected at the interval of two layers to the two-stage connection pad pairs 89 of the connection pad arrays 91A and 91B. Both the connection pad arrays 91A and 91B are formed in semiconductor removal regions 52a and 52b shown in FIG. 15B.

In FIG. 36, the planar shapes of the connection pads 65 and 63 are octagonal, and preferably regular octagonal. However, since the distance between the wirings can be increased, the planar shapes of the connection pads may be tetragonal or hexagonal (preferably, regular hexagonal). This embodiment is applicable to the configuration described below in which the connection pad pairs 89 can be replaced by the connection pad pairs in which the first connection pads 65 and the second connection pads 63 are arranged in the vertical direction.

In the solid-state imaging device 93 according to the fifth embodiment, the connection pad arrays 91A and 91B are disposed with the pixel array 23 interposed therebetween, and the laying wirings of the plurality of lines two lines corresponding to the vertical signal lines are alternately connected to the two-stage connection pad pairs 89 of the connection pad arrays 91A and 91B. With such a configuration, it is not necessary to narrow the distance between the adjacent laying wirings 40d and the distance between the laying wirings 53d. In other words, the distance between the adjacent laying wirings 40d and the distance between the laying wirings 53d can be sufficiently increased. Therefore, the adjacent coupling capacitance can be reduced. Moreover, since the difference in the wiring length between the laying wirings is reduced, the wiring resistance difference can be further reduced.

The area and pitch of the connection pads 65 and 63 are larger than the area and pitch of the pixels. However, in the above-described layout of the connection pads 65 and 63, the wirings 40d and 53d can be drawn, thereby providing a high-performance solid-state imaging device.

In the fifth embodiment, even when the configuration of the connection wirings of the first, second, or third embodiment is used, the adjacent coupling capacitance can be similarly reduced.

In the fifth embodiment, the same advantages as those of the first to third embodiments can be obtained.

Figure 37:
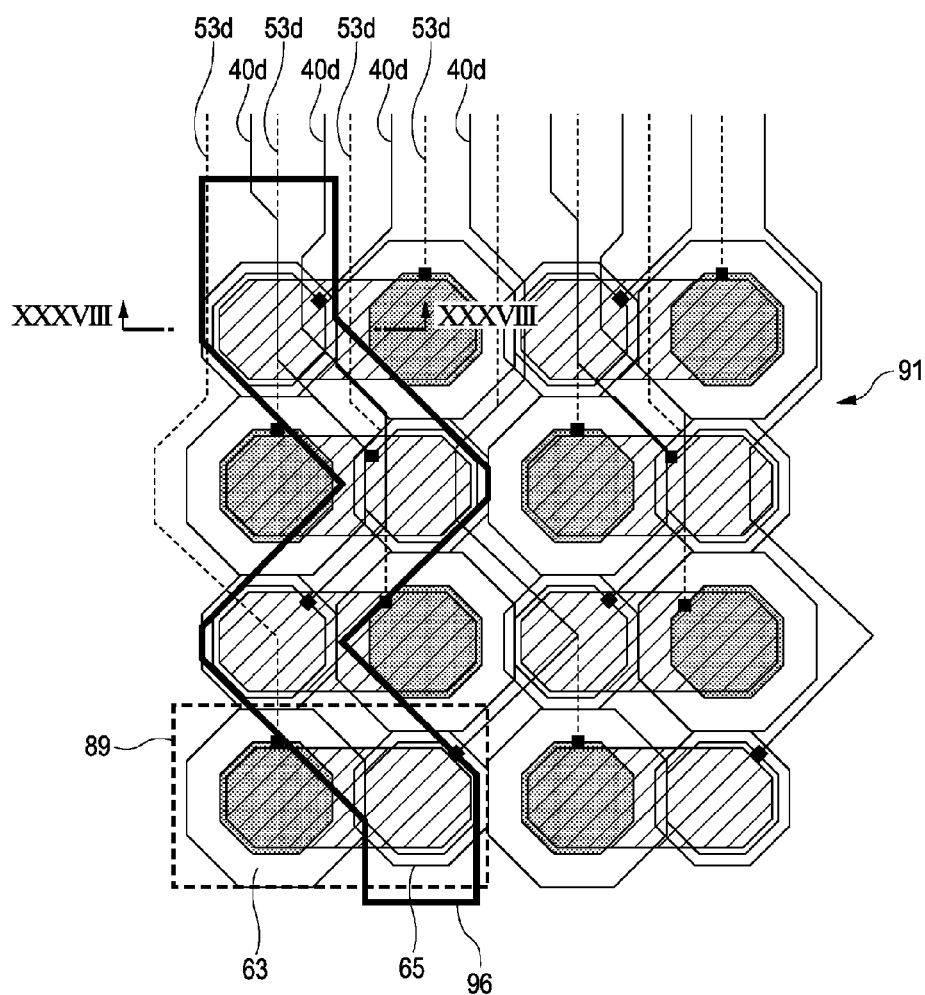
FIG. 37 is a diagram illustrating the overall configuration of the main units of a solid-state imaging device that is consistent with the present invention.
Figure 38:
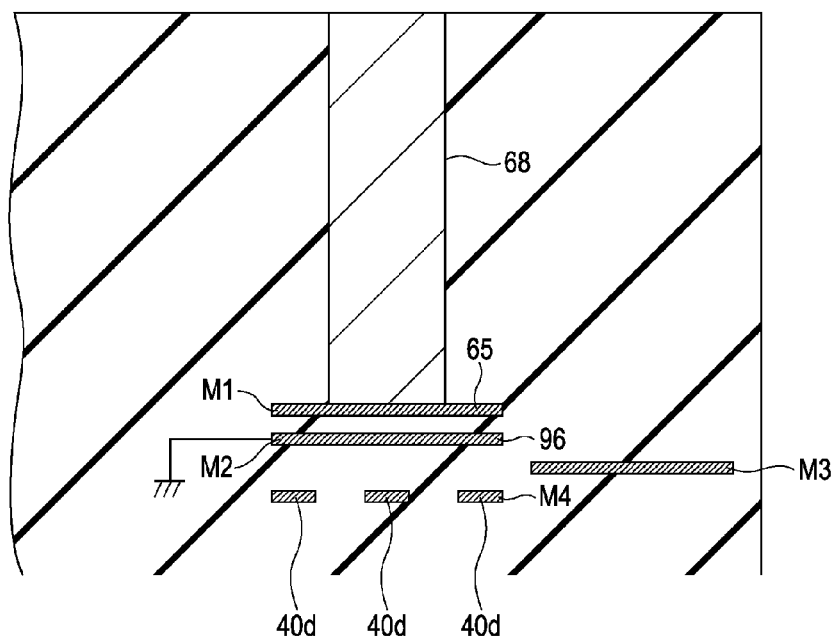
FIG. 38 is a schematic sectional view taken along the line XXXVIII-XXXVIII of FIG. 37.

FIGS. 37 and 38 are diagrams illustrating a semiconductor device, that is, a MOS solid-state imaging device according to a sixth embodiment of the invention. In the drawings, particularly, only the layout of the wiring connection portion including the connection pads 65 and 63 electrically connecting the first semiconductor chip section 22 to the second semiconductor chip section 26 is shown.

In a solid-state imaging device 95 according to the sixth embodiment, like the above description, two semiconductor chip sections 22 and 26 are bonded to each other, the part of a semiconductor portion of the first semiconductor chip section 22 is removed, and both the semiconductor chip sections 22 and 26 are connected to each other through the connection wiring 67 in the semiconductor removal region 52. In this embodiment, since the several configurations of the above-described embodiments are applicable to the other configuration excluding the layout of the wiring connection portion, a detailed description thereof is omitted.

In the sixth embodiment, the connection pad array 91 in which the first connection pads 65 and the second connection pads 63 with the same regular octagonal shape shown in FIG. 31 are alternately arranged in the horizontal and vertical directions, and the laying wirings 40d and 53d of every four lines are connected to each of the four-stage connection pad pairs 89 of the connection pad array 91. Each first connection pad 65 in the first semiconductor chip section 22 is formed by the first-layer metal and each laying wiring 40*d* connected to the connection pad 65 is formed by the fourth-layer metal. Each second connection pad 63 in the second semiconductor chip section 26 is formed by the fourth-layer metal and each laying wiring 53*d* connected to the connection pad 63 is formed by the first-layer metal.

The laying wiring 40*d* in the first semiconductor chip section 22 is disposed so as to cross below another necessary first connection pad 65 to which this laying wiring 40*d* is not connected. Since the area of the connection pad 65 is relatively large, coupling capacitance may occur between the connection pad 65 and another laying 40*d* crossing the connection pad 65 and having a different potential. In this embodiment, accordingly, a shield wiring 96 formed by the metal of the layer between the first connection pad 65 and the laying wiring 40*d* is formed between the first connection pad 65 and the necessary laying wiring 40*d*. That is, the shield wiring 96 formed by the second-layer metal or the third-layer metal the second-layer metal is formed between the first connection pad 65 and the necessary laying wiring 40*d*. As shown in FIG. 38, three laying wirings 40*d* cross below the first connection pad 65 in some cases. Therefore, the shield wirings 96 are continuously formed in the four-stage connection pad pairs 89 so as to have a width corresponding to the width of the connection pad 65.

In the solid-state imaging device according to the sixth embodiment, the shield wiring 96 disposed between the first connection pad 65 and the laying wiring 40*d* crossing below the first connection pad 65 is formed, thereby preventing the coupling capacitance from occurring between the connection pad 65 and the laying wiring 40*d* of which potentials are different. Accordingly, it is possible to provide a high-performance solid-state imaging device.

In the sixth embodiment, as in the first to third embodiments, the same advantages such as the reduction in the adjacent coupling capacitance can be obtained.

In the sixth embodiment, the advantage can be obtained by the shield wiring 96 irrespective of the planar shape of the connection pad 65 or the layout of the connection pad 65.

Figure 39:
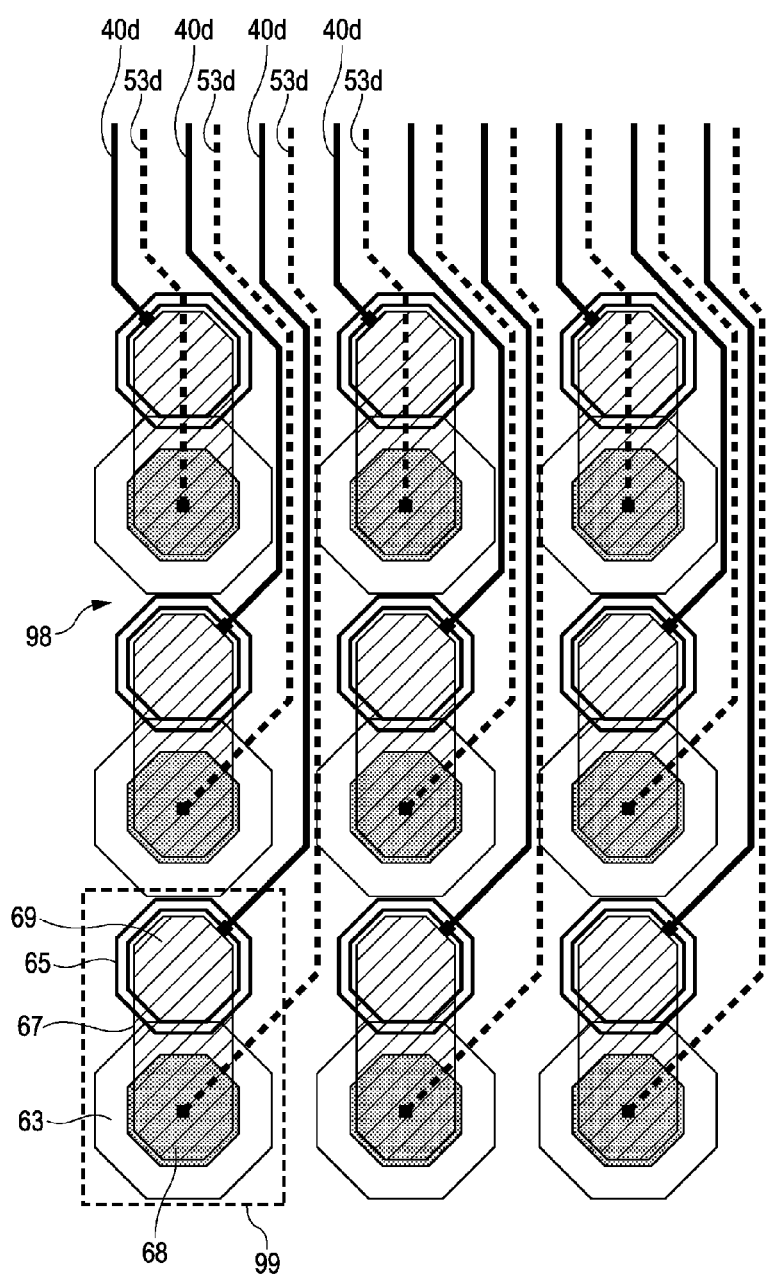
FIG. 39 is a diagram illustrating one embodiment of an overall configuration of the main units of a solid-state imaging device that is consistent with the present invention.

FIG. 39 is a diagram illustrating a semiconductor device, that is, a MOS solid-state imaging device according to a seventh embodiment of the invention. In the drawing, particularly, only the layout of the wiring connection portion including the connection pads 65 and 63 electrically connecting the first semiconductor chip section 22 to the second semiconductor chip section 26 is shown.

In a solid-state imaging device 97 according to the seventh embodiment, like the above description, two semiconductor chip sections 22 and 26 are bonded to each other, the part of a semiconductor portion of the first semiconductor chip section 22 is removed, and both the semiconductor chip sections 22 and 26 are connected to each other through the connection wiring 67 in the semiconductor removal region 52. In this embodiment, since the several configurations of the above-described embodiments are applicable to the other configuration excluding the layout of the wiring connection portion, a detailed description thereof is omitted.

In the seventh embodiment, the pairs of first connection pads 65 and second connection pads 63 are arranged in the vertical direction (so-called longitudinal direction) in which the laying wirings 40*d* and 53*d* corresponding to the vertical signal lines extend. A plurality of connection pad pairs 99 is arranged in the horizontal direction in which the laying wirings 40*d* and 53*d* are arranged and a plurality of stages three stages of the connection pad pairs 99 are arranged in the vertical direction to configure a connection pad array 98.

The first connection pads 65 and the second connection pads 63 have an octagonal shape, and preferably, a regular octagonal shape in a plan view, like the description of the fourth embodiment. The first connection pads 65 and the second connection pads 63 are electrically connected to each other by the connection wirings 67 each including the connection conductor 68, the through connection conductor 69, and the link conductor 71, like the above description.

When the wirings 40 of the multi wiring layer 41 in the first semiconductor chip section 22 are configured by four-layer metals, it is preferable that the first connection pads 65 are formed by the first-layer metal the laying wirings 40*d* connected to the first connection pads 65 are formed by the fourth-layer metal. However, the invention is not limited thereto. The first connection pads 65 and the laying wirings 40*d* may be formed by any layer metal.

When the wirings 53 of the multi wiring layer 55 in the second semiconductor chip section 26 are configured by four-layer metals, it is preferable that the second connection pads 63 are formed by the fourth-layer metal and the laying wirings 53*d* connected to the second connection pads 63 are formed by the first-layer metal. However, the invention is not limited thereto. The second connection pads 63 and the laying wirings 53*d* may be formed by any layer metal. The laying wirings 40*d* and 53*d* are connected at the interval of three lines to the three-stage pad pairs 99 of the connection pad array 98.

In the solid-state imaging device 97 according to the seventh embodiment, the connection pad array 98 is configured by arranging the plurality of stages of the connection pad pairs 99 in which the first connection pads 65 and the second connection pads 63 are arranged in the vertical direction. Therefore, the wirings 40*d* and 53*d* can be drawn. In particular, even in the connection pads 65 and 63 having the area larger than that of the pixels, the wirings 40*d* and 53*d* can be drawn, thereby providing a high-performance solid-state imaging device. When the laying wirings 40*d* and 53*d* are disposed so as to cross the connection pads 65 and 63, respectively, the distance between the adjacent laying wirings can be sufficiently increased, thereby reducing the adjacent coupling capacitance occurring between the laying wirings.

In the seventh embodiment, even when the configuration of the connection wirings of the first, second, or third embodiment is used, the adjacent coupling capacitance can be similarly reduced.

In the seventh embodiment, the same advantages as those of the first to third embodiments can be obtained.

The planar shapes of the connection pads 65 and 63 are octagonal, but may be a polygonal shape such a tetragonal shape or a hexagonal shape (preferably, regular hexagonal shape), a circular shape, or the like. The cross-sectional surface shapes of the connection conductor 68 and the through connection conductor 69 can be configured to be the planar shapes of the connection pads 65 and 63. The planar shapes of the connection pads 65 and 63 may be different from the cross-sectional surface shapes of the connection conductor 68 and the through connection conductor 69.

In the solid-state imaging devices according to the above-described embodiments, electrons serve as the signal charges, the first conductive type is the p-type, and the second conductive type is the n-type. However, the embodiments are also applicable to a solid-state imaging device in which holes serve as the signal charges. In this case, the conductive types of each semiconductor substrate and the semiconductor well region or the semiconductor region are configured conversely. The n-type is configured as the first conductive type and the p-type is configured as the second conductive type. An n-channel transistor and a p-channel transistor are applicable to the MOS transistors of the logic circuit.

Figure 40:
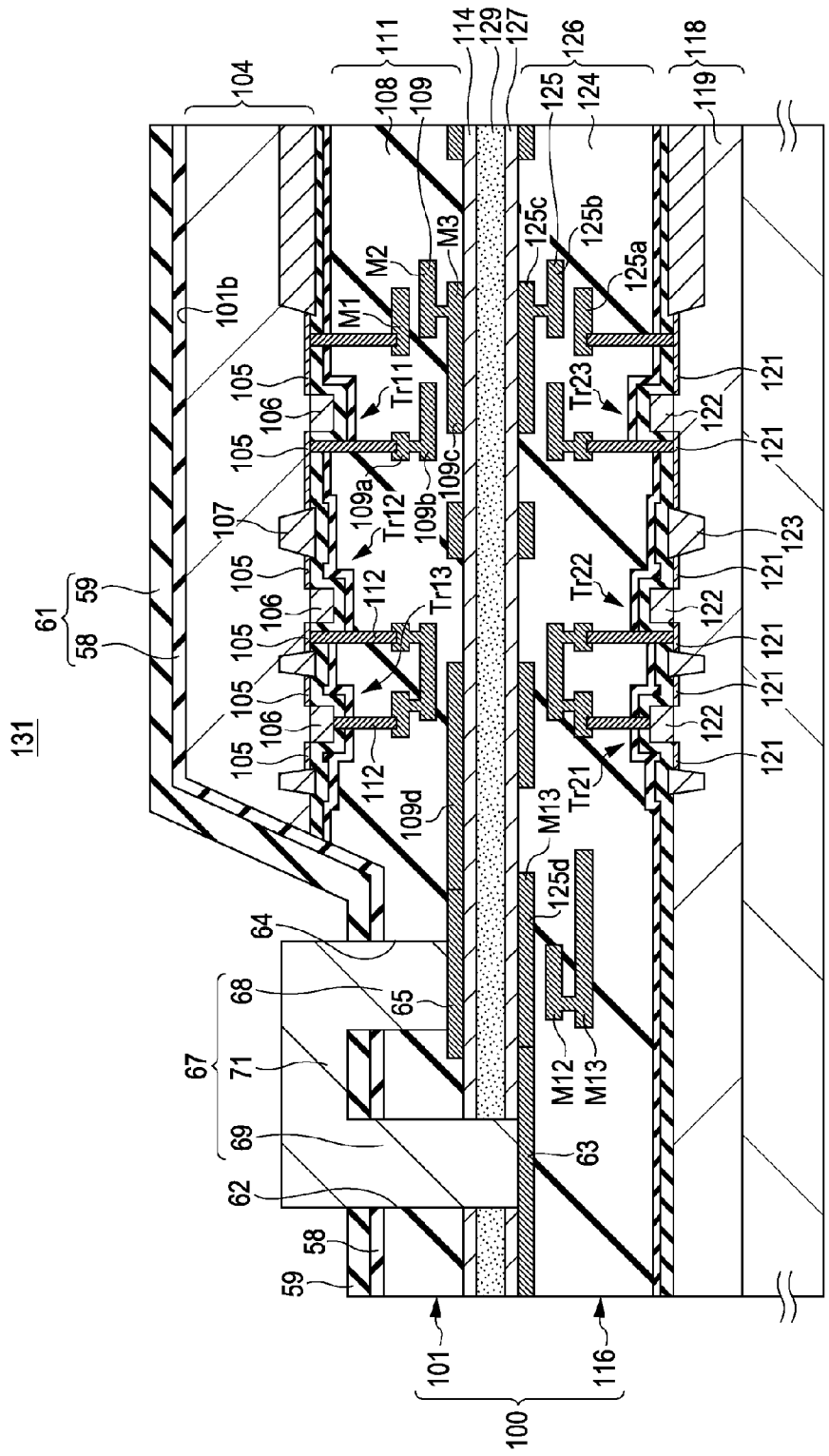
FIG. 40 is a diagram illustrating one embodiment of an overall configuration of the main units of a solid-state imaging device that is consistent with the present invention.

FIG. 40 is a diagram illustrating a semiconductor device according to an eighth embodiment of the invention. A semiconductor device 131 according to the eighth embodiment includes a stacked semiconductor chip 100 in which a first semiconductor chip section 101 having a first semiconductor integrated circuit and a multi wiring layer and a second semiconductor chip section 116 having a second semiconductor integrated circuit and a multi wiring layer are bonded to each other. The first semiconductor chip section 101 and the second semiconductor chip section 116 are bonded to each other so that multi wiring layers face each other. The first and second semiconductor chip sections can be bonded by an adhesive layer 129 with protective layers 114 and 127 interposed therebetween. Alternatively, the first and second semiconductor chip sections may be bonded by plasma joining.

In this embodiment, the semiconductor removal region 52, where a part of a semiconductor portion of the first semiconductor chip section 101 is entirely removed, is formed and the connection wirings 67 each connecting the first semiconductor chip section 101 to the second semiconductor chip section 116 are formed in the semiconductor removal region 52. The semiconductor removal region 52 is all regions including the portion where the respective connection wirings 67 of the semiconductor integrated circuits are formed, and is formed in the peripheral section of the semiconductor chip section 101.

In the first semiconductor chip section 101, the first semiconductor integrated circuit the logic circuit 102 is formed in a thinned first semiconductor substrate 103. That is, a plurality of MOS transistors Tr11, Tr12 and Tr13 are formed in a semiconductor well region 104 formed in the semiconductor substrate (such as, but not limited to, a silicon substrate) 103. The MOS transistors Tr11 to Tr13 each include a pair of source/drain regions 105 and gate electrodes 106 formed via an insulation film. The MOS transistors Tr11 to Tr13 are isolated from each other by device isolation regions 107.

The MOS transistors Tr11 to Tr13 are representative transistors. The logic circuit 102 may include CMOS transistors. Therefore, the plurality of MOS transistors may be configured as n-channel MOS transistors or p-channel MOS transistors. Therefore, when the n-channel MOS transistors are formed, source/drain regions are formed in the p-type semiconductor well region. When the p-channel MOS transistors are formed, p-type source/drain regions are formed in the n-type semiconductor well region.

A multi wiring layer 111 in which wirings 109 formed by a plurality of metals triple layered metals are stacked via an inter-layer insulation film 108 is formed on the semiconductor substrate 103. The wirings 109 can be formed by a material such as, but not limited to, Cu wirings. The MOS transistors Tr11 to Tr13 are connected with the necessary first-layer wiring 109 and a connection conductor 112 interposed therebetween. The three-layer wirings 109 are connected to each other through a connection conductor.

In the second semiconductor chip section 116, the second semiconductor integrated circuit the logic circuit 117 is formed in a second semiconductor substrate 118. That is, a plurality of MOS transistors Tr21, Tr22, Tr23 are formed in a semiconductor well region 119 formed in the semiconductor substrate (such as, but not limited to, a silicon substrate) 118. The MOS transistors Tr21 to Tr23 each include a pair of source/drain regions 121 and gate electrodes 122 formed via an insulation film. The MOS transistors Tr21 to Tr23 are isolated from each other by device isolation regions 123.

The MOS transistors Tr21 to Tr23 are representative transistors. The logic circuit 117 may include CMOS transistors. Therefore, the plurality of MOS transistors may be configured as n-channel MOS transistors or p-channel MOS transistors. Therefore, when the n-channel MOS transistors are formed, source/drain regions are formed in the p-type semiconductor well region. When the p-channel MOS transistors are formed, p-type source/drain regions are formed in the n-type semiconductor well region.

A multi wiring layer 126 in which wirings 125 formed by a plurality of metals triple layered metals are stacked via an inter-layer insulation film 124 is formed on the semiconductor substrate 118. The wirings 125 can be formed by a material including, but not limited to, Cu wirings. The MOS transistors Tr21 to Tr23 are connected with the necessary first-layer wiring 125 and a connection conductor 120 interposed therebetween. The three-layer wirings 125 are connected to each other through a connection conductor 120. The semiconductor substrate 118 of the second chip section 116 also serves as a support substrate of the thinned first semiconductor chip section 101.

As the first semiconductor integrated circuit a semiconductor memory circuit may be used instead of the logic circuit 102. In this case, the logic circuit 117 serving as the second semiconductor integrated circuit is provided to process signals of the semiconductor memory circuit.

In the semiconductor removal region 52, the entire first semiconductor substrate 118 is removed by etching. The stacked insulation film 61 including a silicon oxide ($SiO_2$) film 58 and a silicon nitride (SiN) film 59 is formed to extend from the bottom surface and the side surface of the semiconductor removal region 52 to the front surface of the semiconductor substrate 118. The stacked insulation film 61 protects the semiconductor substrate 118 exposed to the front surface of the semiconductor substrate 118 and the side surface of the semiconductor removal region 52.

In the semiconductor removal region 52, the connection hole 64, which reaches from the silicon nitride film 59 to the first connection pad 65 electrically connected to a necessary wiring in the multi wiring layer 111 the wiring 109d of the third-layer metal in the first semiconductor chip section 101, is formed. In addition, the through connection hole 62, which is penetrated through the first semiconductor chip section 101 and reaches the second connection pad 63 electrically connected to a necessary wiring in the multi wiring layer 126 a wiring 125d formed by the third-layer metal in the second semiconductor chip section 116, is formed.

The connection wiring 67 includes the connection conductor 68 buried in the connection holes 64 and 62 and electrically connected to the first connection pad 65, the through connection conductor 69 connected to the second connection pad 63, and the link conductor 71 electrically connecting both of the conductors 68 and 69 to each other in the upper end of the conductors 68 and 69. The link conductor 71 of the connection wiring 67 exposed to the outside serves as an electrode pad connected to an external wiring by a bonding wire.

The semiconductor device according to the eighth embodiment can be manufactured by the manufacturing method described in the first embodiment. In this case, the pixel array and the control circuit of the first semiconductor chip section in the first embodiment is replaced by the first semiconductor integrated circuit and the logic circuit in the second embodiment chip section is replaced by the second semiconductor integrated circuit.

In the semiconductor device according to the eighth embodiment, the first semiconductor chip section 101 and the second semiconductor chip 116 are bonded to each other.

Therefore, the optimum processing techniques can be used when the first and second semiconductor integrated circuits are formed. Accordingly, the performances of the first and second semiconductor integrated circuits can be sufficiently achieved, thereby providing a high-performance semiconductor device.

In this embodiment, the part of the first semiconductor chip section 101, that is, the semiconductor portion of the region where the connection conductor 68 and the through connection conductor 69 are formed is completely removed. Since the connection conductor 68 and the through connection conductor 69 are formed in the semiconductor removal region 52, parasitic capacitance between the semiconductor substrate 104 and the connection conductor 68 and the through connection conductor 69 can be reduced, thereby realizing high performance in the semiconductor device.

In the eighth embodiment, the first semiconductor substrate 104 and the second semiconductor substrate 118 in a partly finished state are bonded to each other before formation of a chip, and then the first semiconductor substrate 104 is thinned in the manufacturing process. That is, the second semiconductor substrate 118 is used as the support substrate when the first semiconductor substrate 104 is thinned. Accordingly, the number of members can be reduced and the manufacturing process can be simplified. In this embodiment, the first semiconductor substrate 104 is thinned and the through connection hole 62 and the connection hole 64 are formed in the semiconductor removal region 52 where the semiconductor portion is removed. Therefore, the aspect ratio of the holes is reduced, thereby forming the connection holes with high precision. Accordingly, the high-performance semiconductor device can be manufactured with high precision.

Figure 41:
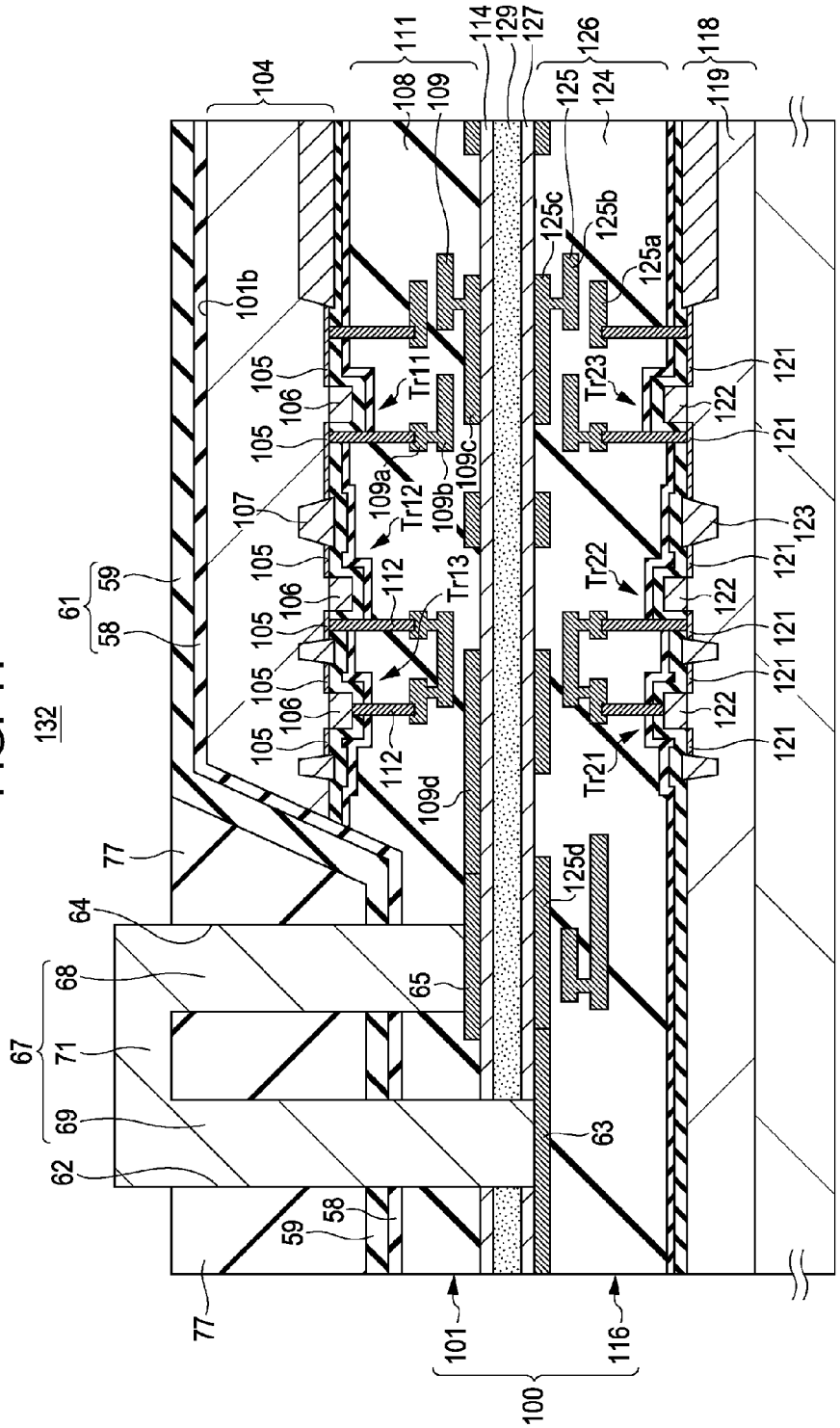
FIG. 41 is a diagram illustrating one embodiment of an overall configuration of the main units of a solid-state imaging device that is consistent with the present invention.

FIG. 41 is a diagram illustrating a semiconductor device according to a ninth embodiment of the invention. A semiconductor device 132 according to the ninth embodiment includes a stacked semiconductor chip 100 in which the first semiconductor chip section 101 including the first semiconductor integrated circuit and a multi wiring layer and the second semiconductor chip section 116 including the second semiconductor integrated circuit and a multi wiring layer are bonded to each other. The first semiconductor chip section 101 and the second semiconductor chip section 116 are bonded to each other so that multi wiring layers face each other.

In this embodiment, the semiconductor removal region 52, where a part of a semiconductor portion of the first semiconductor chip section 101 is entirely removed, is formed and the stacked insulation film 61 extending from the internal surface of the semiconductor removal region 52 to the rear surface of the semiconductor substrate 103 is formed. The insulation film 77 subjected to planarization and thus flush with the front surface of the stacked insulation film 61 on the semiconductor substrate 103 is formed in the semiconductor removal region 52. Like the above description, the insulation film 77 is formed by an insulation film, such as a silicon oxide film, with an etching rate different from that of the silicon nitride film 59 on the front surface of the stacked insulation film 61.

Then, the connection hole 64 and the through connection hole 62 reaching the first connection pad 65 and the second connection pad 63, respectively, through the insulation film 77 are formed. The connection wiring 67 connecting the first connection pad 65 to the second connection pad 63 is formed through both the connection holes 64 and 62. The connection wiring 67 includes the connection conductor 68 buried in the connection holes 64 and 62 and electrically connected to the first connection pad 65, the through connection conductor 69 electrically connected to the second connection pad 63, and the link conductor 71 electrically connecting both of the conductors 68 and 69 to each other in the upper end. The connection conductor 68, the through connection conductor 69, and the link conductor 71 are integrally and necessarily formed of metal. The link conductor 71 is formed on the insulation film 77 subjected to planarization.

The other configuration is the same as the above-described configuration of the eighth embodiment. Therefore, the same reference numerals are given to the corresponding members in FIG. 40 and the repetition of the description thereof is omitted.

The semiconductor device 132 according to the ninth embodiment can be manufactured by the manufacturing method described in the second embodiment. In this case, the pixel array and the control circuit of the first semiconductor chip section in the second embodiment is replaced by the first semiconductor integrated circuit and the logic circuit in the second embodiment chip section is replaced by the second semiconductor integrated circuit.

In the semiconductor device 132 according to the ninth embodiment, the part of the first semiconductor chip section 101, that is, the semiconductor portion of the region where the connection conductor 68 and the through connection conductor 69 are formed is completely removed, the insulation film 77 is buried in the removed semiconductor removal region 52. Since the connection conductor 68 and the through connection conductor 69 are buried in the connection hole 64 and the through connection hole 62 formed in the insulation film 77, the connection conductors 68 and 69 are distant from the side surface of the semiconductor substrate 103 by the insulation film 77. Therefore, the parasitic capacitance between the connection conductors 68 and 69 and the semiconductor substrate 103 can be reduced. Since the inside of the semiconductor removal region 52 is buried by the insulation film 77, the surface of the semiconductor substrate 103 facing the side wall of the semiconductor removal region 52 can be reliably protected mechanically in cooperation with the stacked insulation film 61. Accordingly, high performance in the semiconductor device can be realized.

In this embodiment, the first semiconductor substrate 103 is thinned and the through connection hole 62 and the connection hole 64 are formed. Therefore, the aspect ratio of the holes is reduced, thereby forming the connection holes 62 and 64 with high precision. Accordingly, the high-performance semiconductor device can be manufactured with high precision.

Further description is omitted, but the same advantages as those of the eighth embodiment can be obtained.

Figure 42:
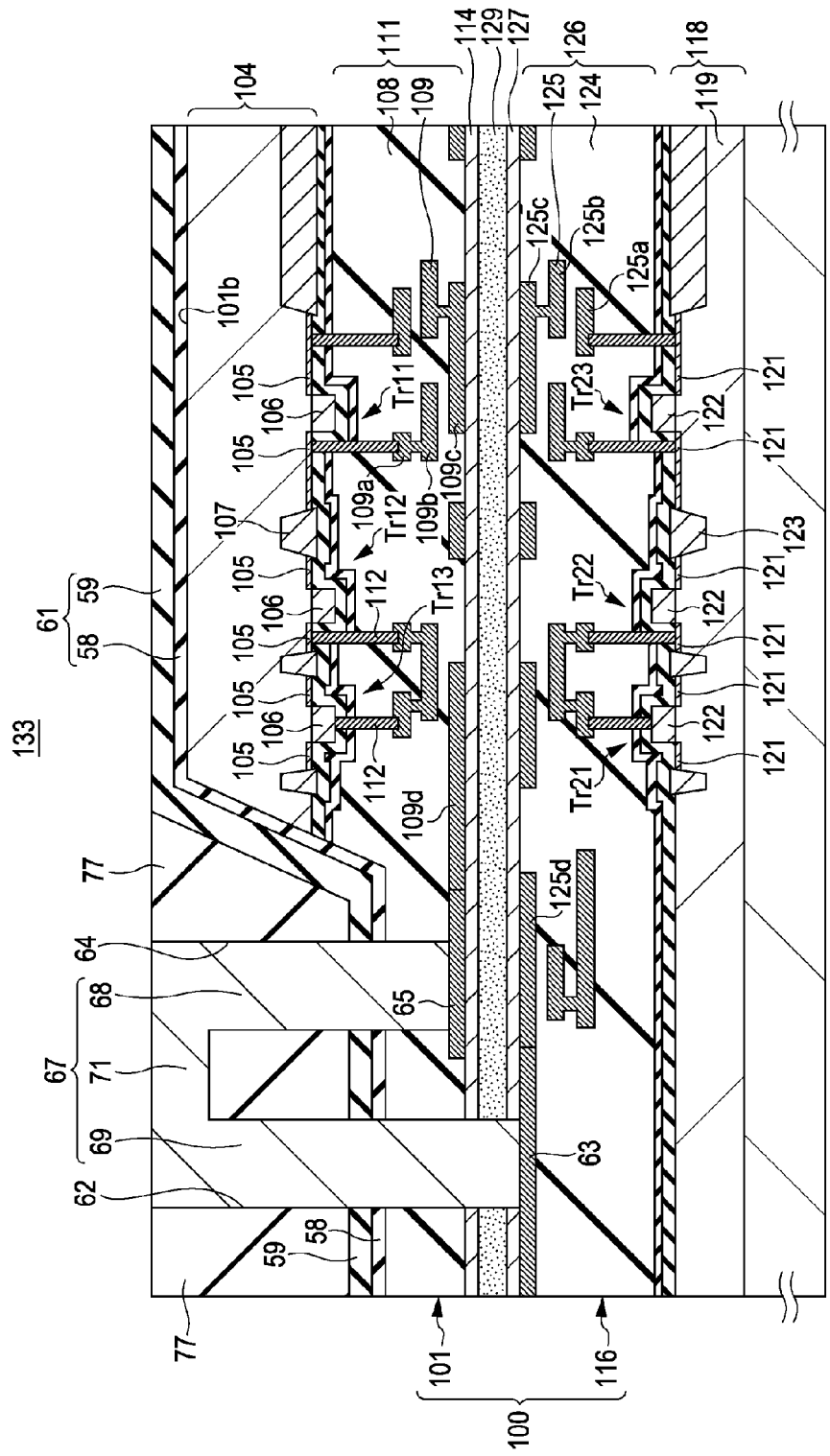
FIG. 42 is a diagram illustrating one embodiment of an overall configuration of the main units of a solid-state imaging device that is consistent with the present invention.

FIG. 42 is a diagram illustrating a semiconductor device according to a tenth embodiment of the invention. A semiconductor device 133 according to the tenth embodiment includes the stacked semiconductor chip 100 in which the first semiconductor chip section 101 including a first semiconductor integrated circuit and a multi wiring layer and the second semiconductor chip section 116 including a second semiconductor integrated circuit and a multi wiring layer are bonded to each other. The first semiconductor chip section 101 and the second semiconductor chip section 116 are bonded to each other so that multi wiring layers face each other.

In this embodiment, the semiconductor removal region 52, where a part of a semiconductor portion of the first semiconductor chip section 101 is entirely removed, is formed and the stacked insulation film 61 extending from the internal surface of the semiconductor removal region 52 to the rear surface of the semiconductor substrate 103 is formed. The insulation film 77 subjected to planarization and thus flush with the front surface of the stacked insulation film 61 on the semiconductor substrate 103 is buried in the semiconductor removal region 52. The concave portion 81 with a necessary depth from the front surface is formed in the portion corresponding to the connection wiring 67 of the insulation film 77.

Then, the connection hole 64 and the through connection hole 62 reaching the first connection pad 65 and the second connection pad 63, respectively, through the insulation film 77 below the concave portion 81 are formed. The connection wiring 67 connecting the first connection pad 65 to the second connection pad 63 through both the connection holes 64 and 62 is formed. The connection wiring 67 includes the connection conductor 68 buried in the connection holes 64 and 62 and electrically connected to the first connection pad 65, the through connection conductor 69 electrically connected to the second connection pad 63, and the link conductor 71 electrically connecting both of the conductors 68 and 69 to each other in the upper end. The connection conductor 68, the through connection conductor 69, and the link conductor 71 are integrally and necessarily formed of metal. The link conductor 71 is buried in the concave portion 81 of the insulation film 77. The front surface of the link conductor 71 is flush with the front surface of the insulation film 77 subjected to planarization.

The other configuration is the same as the above-described configuration of the eighth embodiment. Therefore, the same reference numerals are given to the corresponding members in FIG. 40 and repetition of the description thereof is omitted.

The semiconductor device 133 according to the tenth embodiment can be manufactured by the manufacturing method described in the third embodiment. In this case, the pixel array and the control circuit of the first semiconductor chip section in the third embodiment is replaced by the first semiconductor integrated circuit and the logic circuit in the second embodiment chip section is replaced by the second semiconductor integrated circuit.

In the semiconductor device 133 according to the tenth embodiment, the part of the first semiconductor chip section 101, that is, the semiconductor portion of the region where the connection conductor 68 and the through connection conductor 69 are formed is completely removed, the insulation film 77 is buried in the removed semiconductor removal region 52. The concave portion 81 is formed in the insulation film 77, and the connection conductor 68 and the through connection conductor 69 are penetrated through the connection hole 64 and the through connection hole 62 formed in the insulation film 77 below the concave portion 81, respectively, to form the connection wiring 67. Accordingly, both the connection conductors 68 and 69 are distant from the side surface of the semiconductor substrate 103 by the insulation film 77, thereby reducing the parasitic capacitance between the connection conductors 68 and 69 and the semiconductor substrate 103. Since the inside of the semiconductor removal region 52 is buried by the insulation film 77, the surface of the semiconductor substrate 103 facing the side wall of the semiconductor removal region 52 can be reliably protected mechanically in cooperation with the stacked insulation film 61. Accordingly, high performance in the solid-state imaging device can be realized.

Since the link conductor 71 is buried in the concave portion 81 of the insulation film 77 and the link conductor 71 is subjected to planarization so as to be flush with the front surface of the insulation film 77, the semiconductor device with a small uneven surface can be obtained.

In the tenth embodiment, the first semiconductor substrate 103 is thinned, the concave portion 81 is formed in the insulation film 77, and the through connection hole 62 and the connection hole 64 are formed. Therefore, the aspect ratio of the holes is reduced, thereby forming the connection holes 62 and 64 with high precision. Accordingly, a high-performance semiconductor device can be manufactured with high precision.

Further description is omitted, but the same advantages as those of the eighth embodiment can be obtained.

In the above-described eighth to tenth embodiments, two semiconductor chip sections are bonded to each other. In the semiconductor device according to the embodiments of the invention, three or more semiconductor chip sections may be bonded to each other. Even in a configuration in which three or more semiconductor chip sections are bonded to each other, the above-described configurations in which the semiconductor portion is completely removed are applicable to the connection portion between the first semiconductor chip section including the first semiconductor integrated circuit and the second semiconductor chip section including the second semiconductor integrated circuit. A memory circuit and other electric circuits excluding a logic circuit are applicable to the semiconductor integrated circuit.

In the above embodiments, the layouts of the connection pad arrays 91, 91A, 91B, and 98 described in the fourth to seventh embodiments are applied to the solid-state imaging device in which the semiconductor portion in the region of the connection wirings 67 according to the first to third embodiments is completely removed. The layouts of the connection pad arrays 91, 91A, 91B, and 98 are applicable to the semiconductor device according to the eighth to tenth embodiments. The layouts of the connection pad arrays 91, 91A, 91B, and 98 are not limited thereto. When another wafer or chip is bonded to form connection wirings, the layouts of the connection pad arrays are applicable to a case where a semiconductor in the vicinity of the connection wirings is not removed. The layouts of the connection pad arrays are applicable to a semiconductor device, such as a solid-stage imaging device or a semiconductor device having the above semiconductor integrated circuit, in which the connection conductor 68 and the through connection conductor 69 are penetrated through the semiconductor substrate and are buried via an insulation film without removing the semiconductor portion.

Figure 43:
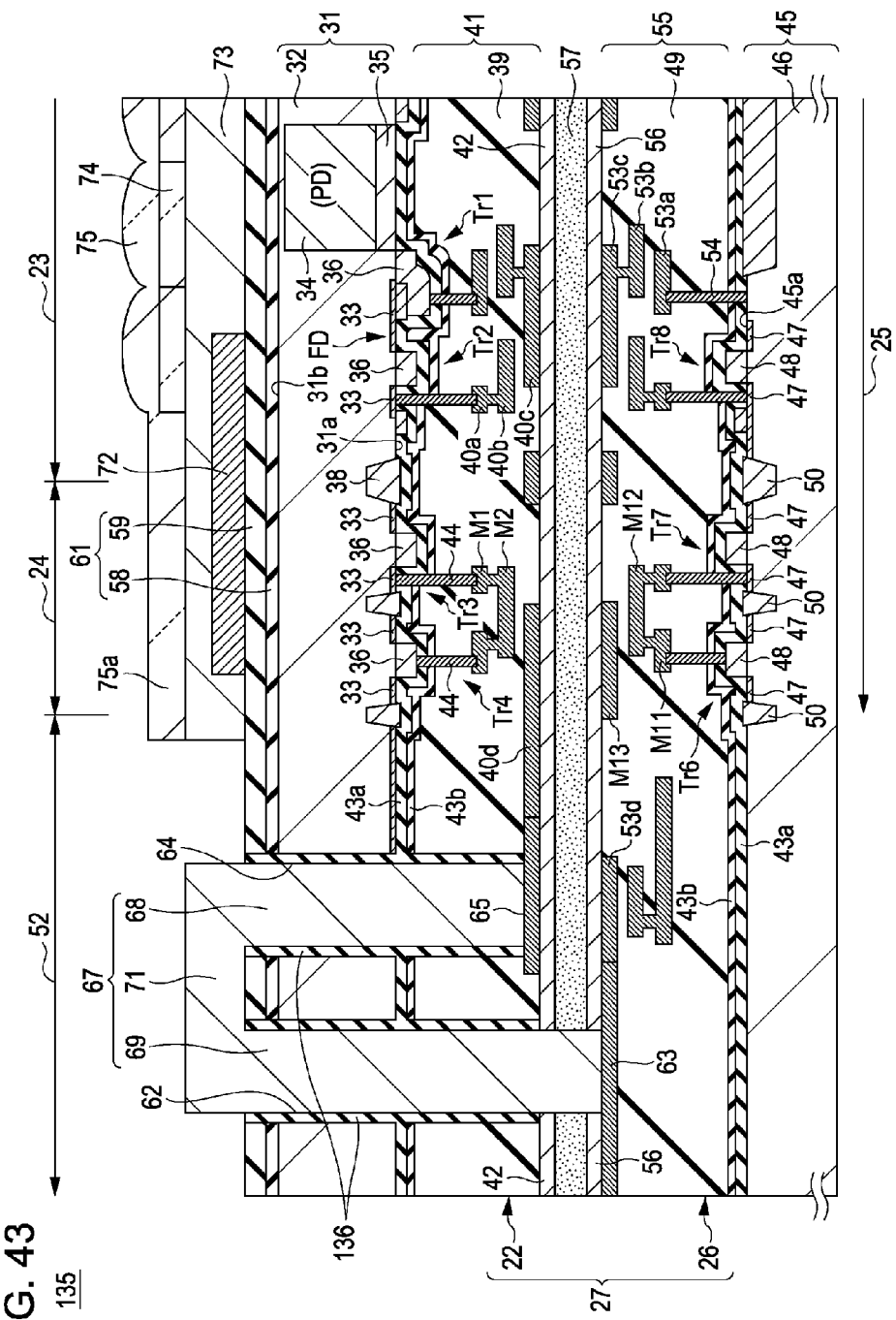
FIG. 43 is a diagram illustrating one embodiment of an overall configuration of a solid-state imaging device having the layout of the connection pads that is consistent with the present invention.
Figure 44:
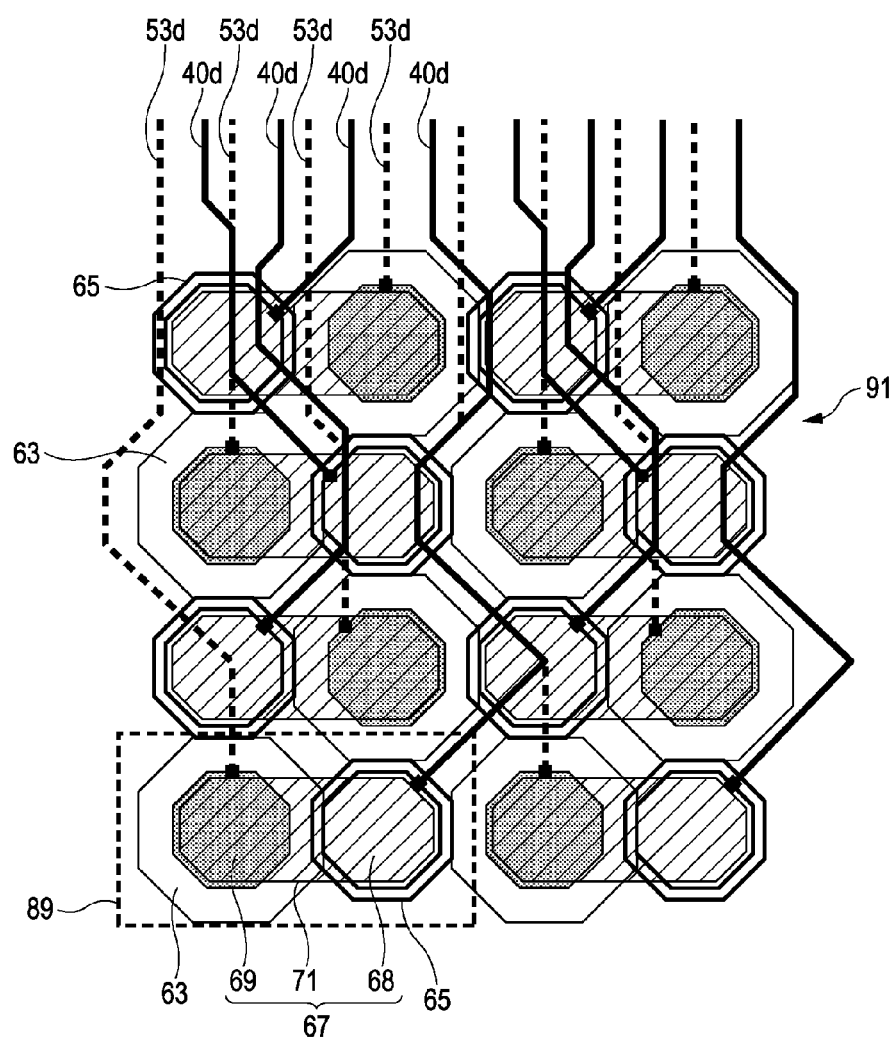
FIG. 44 is a schematic plan view illustrating one embodiment of the layout of the connection pads of the solid-state imaging device that is consistent with the present invention.

FIGS. 43 and 44 are diagrams illustrating an example of the solid-state imaging device in which the connection wirings are formed without removing the semiconductor portion and to which the connection pad layout is applied. In this example, a solid-state imaging device 135 has a configuration in which the semiconductor in the region of the connection wirings 67 shown in FIG. 16 in the above-described second embodiment is not removed. In this example, the connection hole 64 penetrated through the first semiconductor substrate 31 and reaching the first connection pad 65 and the through connection hole 62 penetrated through the first semiconductor chip section 22 including the semiconductor substrate 31 and reaching the second connection pad 63 are formed in the connection wiring region. The semiconductor substrate 31 and an insulation film 136 for insulation are formed on the inner surface of each of the connection hole 64 and the through connection hole 62. The connection wiring is formed in which the connection conductor 68 and the through connection conductor 69 are buried in the connection hole 65 and the through connection hole 62 and are connected to each other by the link conductor 71 so as to be connected to the first connection pad 65 and the second connection pad 63, respectively. Since the other configuration is the same as that described in the second embodiment, the same reference numerals are given to the corresponding members in FIG. 16 and repetition of the description thereof is omitted.

On the other hand, as shown in FIG. 44, the layout of the wiring connection portion including the connection pads 63 and 65 in the solid-state imaging device 135 of this example has the same structure as that in FIG. 31. That is, the connection pad array 91 is formed in which the connection pad pairs 89 of the octagonal connection pads 63 and 65 are densely arranged in four stages. Since the other detailed configuration is the same as that in FIG. 31, the same reference numerals are given to the corresponding members in FIG. 31 and repetition of the description thereof is omitted.

In the solid-state imaging device 135 of this example, the distance between the adjacent laying wirings 40d and the distance between the laying wirings 53d are increased, like the above description in FIG. 31. Accordingly, the adjacent coupling capacitance can be reduced.

Figure 45:
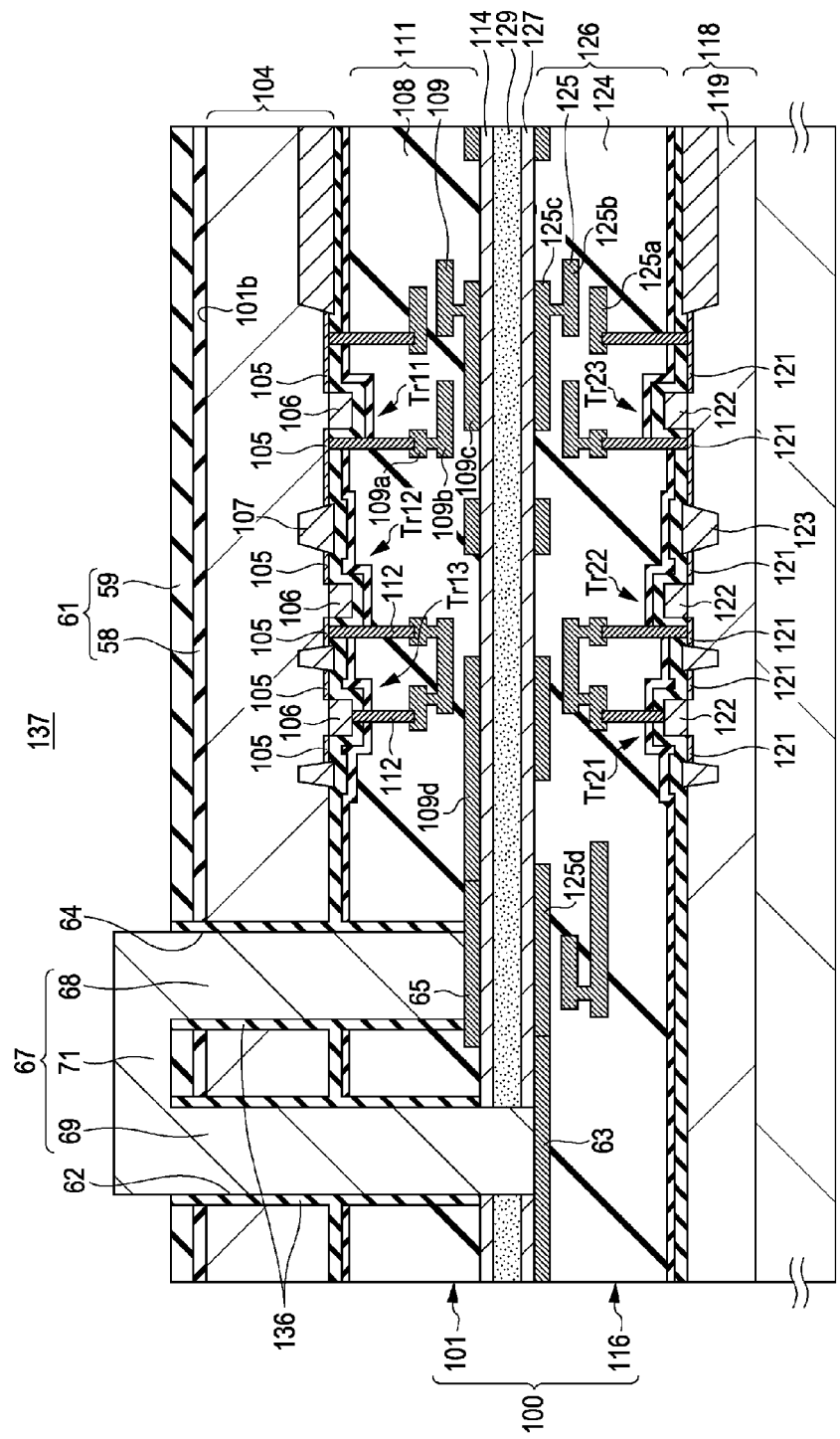
FIG. 45 is a diagram illustrating one embodiment of an overall configuration of a semiconductor device having the layout of the connection pads that is consistent with the present invention.
Figure 46:
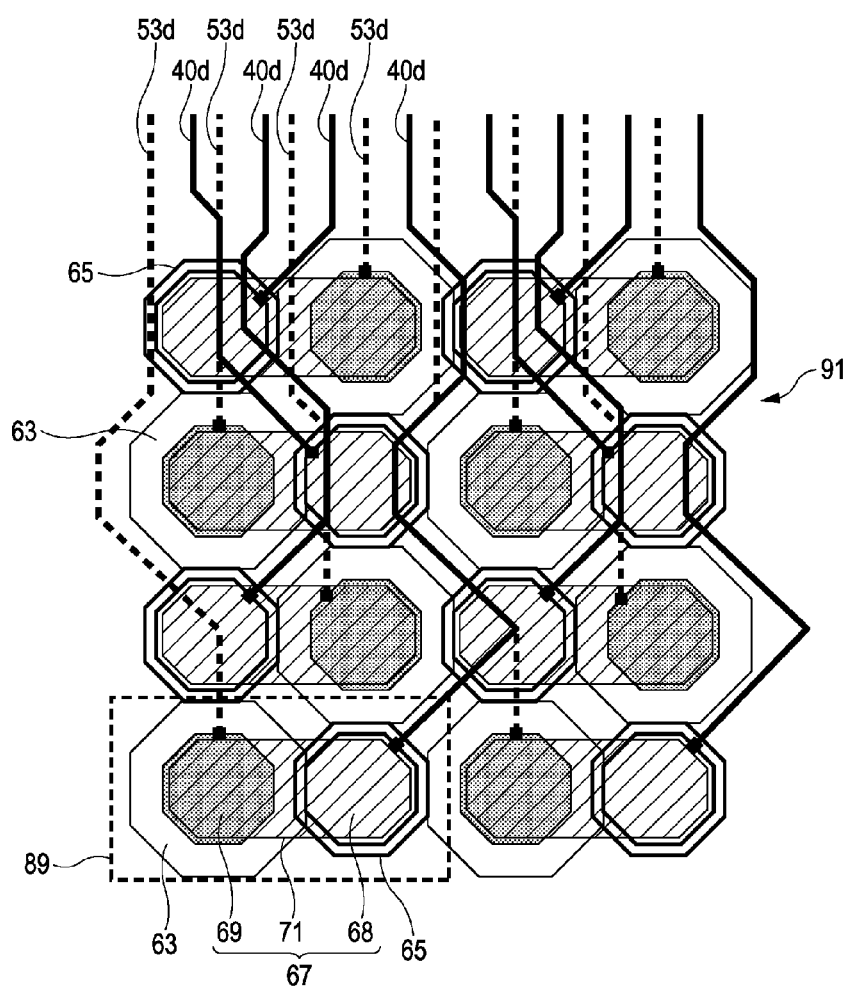
FIG. 46 is a schematic plan view illustrating one embodiment of the layout of the connection pads of the semiconductor device in FIG. 45.

FIGS. 45 and 46 are diagrams illustrating an example of the semiconductor device in which the connection wirings are formed without removing the semiconductor portion and which includes the semiconductor integrated circuit to which the connection pad layout is applied. In this example, a semiconductor device 137 has a configuration in which the semiconductor in the region, where the connection wirings 67 is formed, shown in FIG. 41 in the above-described ninth embodiment is not removed. In this example, the connection hole 64 penetrated through the first semiconductor substrate 31 and reaching the first connection pad 65 and the through connection hole 62 penetrated through the first semiconductor chip section 22 including the semiconductor substrate 31 and reaching the second connection pad 63 are formed in the connection wiring region. The semiconductor substrate 31 and the insulation film 136 for insulation are formed on the inner surface of each of the connection hole 64 and the through connection hole 62. The connection wiring is formed in which the connection conductor 68 and the through connection conductor 69 are buried in the connection hole 65 and the through connection hole 62 and are connected to each other by the link conductor 71 so as to be connected to the first connection pad 65 and the second connection pad 63, respectively. Since the other configuration is the same as that described in the sixth embodiment, the same reference numerals are given to the corresponding members in FIG. 41 and repetition of the description thereof is omitted.

On the other hand, as shown in FIG. 44, the layout of the wiring connection portion including the connection pads 63 and 65 in this example has the same structure as that in FIG. 31. That is, the connection pad array 91 is formed in which the connection pad pairs 89 of the octagonal connection pads 63 and 65 are densely arranged in four stages. Since the other detailed configuration is the same as that in FIG. 31, the same reference numerals are given to the corresponding members in FIG. 31 and repetition of the description thereof is omitted.

In the solid-state imaging device 137 of this example, the distance between the adjacent laying wirings 40d and the distance between the laying wirings 53d are increased, like the above description in FIG. 31. Accordingly, the adjacent coupling capacitance can be reduced.

In the solid-state imaging device in which the connection wirings are formed without removing the semiconductor portion and the semiconductor device having an integrated circuit, the layout according to the fifth embodiment (FIG. 36), the sixth embodiment (FIGS. 37 and 38), the seventh embodiment (FIG. 39), or the like is applicable as the layout of the connection pad.

In the above-described solid-state imaging devices according to the embodiments, it is necessary to stabilize the potential of the semiconductor substrate or the semiconductor well region where the pixel array 23 of the first semiconductor chip section 22 is formed. That is, it is necessary to stabilize variation in the potentials of the through connection conductor 69 and the connection conductor 68 when operating without variation in the potential (so-called substrate potential) of the semiconductor substrate or the semiconductor well region in the vicinities of the through connection conductor 69 and the connection conductor 68. In order to stabilize the substrate potential, in this example, a contact portion is formed in the semiconductor well region 32 by an impurity diffusion layer and the contact portion is connected to an electrode pad portion formed in the vicinity of a portion on the first semiconductor chip section 22 via the connection conductor 44 and the wiring 40. By supplying a fixed voltage such as a power voltage VDD or a ground voltage (0 V) to the electrode pad portion, the power voltage or the ground voltage (0 V) is applied to the semiconductor well region 32 via the contact portion, thereby stabilizing the substrate potential of the semiconductor well region. For example, when the semiconductor substrate or the semiconductor well region is of the n-type, the power voltage is supplied. When the semiconductor substrate or the semiconductor well region is of the p-type, the ground voltage is applied.

In the above-described solid-state imaging devices according to the embodiments, when the connection wirings 67 including the through connection conductor 69 and the connection conductor 68 are processed to be formed, protective diodes are installed in order to protect the transistors of the logic circuit against plasma damage. When the connection wirings 67 are formed, the connection holes 62 and 65 reaching the pads 63 and 65 are formed by plasma etching. However, particularly, the connection pads 63 in the logic circuit are charged with excessive plasma ions at the time of the plasma processing. When the transistors in the logic circuit are charged with the excessive plasma ions via the wirings 53, the transistors receive so-called plasma damage. The protective diodes serve as preventing the plasma damage.

In this embodiment, the protective diodes are formed in each logic circuit of each column circuit section of the column signal processing circuit 5. As described above, the laying wirings corresponding to the respective vertical signal lines are connected to the through connection conductor 69 and the connection conductor 68 of each connection wiring 67 via the connection pads 63 and 65, respectively. In the second semiconductor chip section 26, the protective diodes are formed in each column circuit section in the semiconductor substrate 45 in which the MOS transistors of the column circuit section are formed. The protective diodes are connected to the same laying wirings to which the gate electrodes of the MOS transistors of the column circuit section are connected. The protective diodes connected to the laying wirings are disposed closer to the connection pads 63 than the MOS transistors of the column circuit section. At the time of plasma processing, the charges caused by the excessive plasma ions charged in the connection pads 63 of the logic circuit flow to the protective diodes and thus do not damage the column circuit section. Accordingly, the plasma damage to the column circuit section can be prevented when the connection wirings 67 are processed. Moreover, the same protective diodes can be installed in order to prevent the plasma damage to the MOS transistors of another peripheral circuit as well as preventing the plasma damage to the column circuit section.

The solid-state image devices according to the above-described embodiments are applicable to a camera system such as a digital camera or a video camera or electronic apparatuses such as a portable phone with an image capturing function and other apparatuses with an imaging capturing function.

Figure 47:
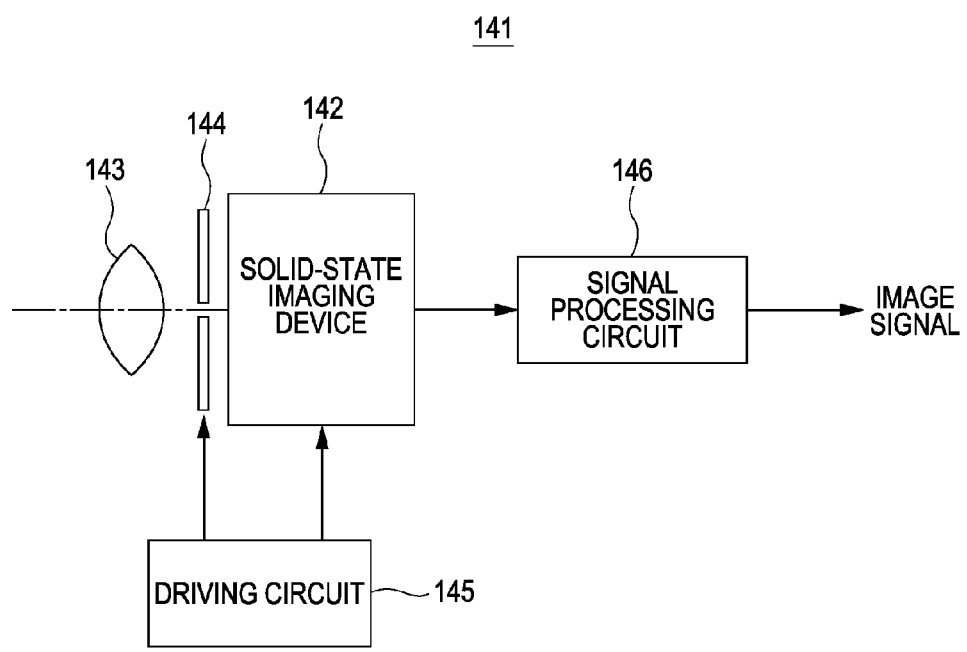
FIG. 47 is a diagram illustrating one embodiment of an overall configuration of an electronic apparatus that is consistent with the present invention.

FIG. 47 is a diagram illustrating a camera as an example of an electronic apparatus according to an eleventh embodiment of the invention. The camera according to this embodiment is a video camera capable of capturing a still image or a moving image. A camera 141 according to this embodiment includes a solid-state imaging device 142, an optical system 143 guiding incident light to a light-sensing portion of the solid-state imaging device 142, and a shutter device 144. The camera 141 further includes a driving circuit 145 driving the solid-state imaging device 142 and a signal processing circuit 146 processing signals output from the solid-state imaging device 142.

The solid-state imaging device 142 is one of the solid-state imaging devices according to the above-described embodiments. The optical system (optical lens) 143 forms an image on the image capturing surface of the solid-state imaging device 142 with image light (incident light) from a subject. Then, signal charges are accumulated in the solid-state imaging device 142 for a given time. The optical system 143 may be an optical lens system configured by a plurality of optical lenses. The shutter device 144 controls a light illumination time and a light block time for the solid-state imaging device 142. The driving circuit 145 supplies a driving signal to control the transmission operation of the solid-state imaging device 142 and the shutter operation of the shutter device 144. Based on the driving signal (timing signal) supplied from the driving circuit 145, the signal of the solid-state imaging device 142 is transmitted. The signal processing circuit 146 processes various kinds of signals. An image signal subjected to the signal processing is stored in a storage medium such a memory or output to a monitor.

In the electronic apparatus such as a camera according to the eleventh embodiment, the high-performance solid-state imaging device 142 can be realized. Accordingly, the electronic apparatus with a high reliability can be provided.

While various embodiments of the present invention have been described, it will be apparent to those of skill in the art that many more embodiments and implementations are possible that are within the scope of this invention. Accordingly, the present invention is not to be restricted except in light of the attached claims and their equivalents.

What is claimed is:

1. A semiconductor device, comprising:
a first semiconductor section including at least one first wiring layer;
a second semiconductor section including at least one second wiring layer, the first and second semiconductor sections being secured together;
a plurality of first conductive materials that extend through a device layer of the first semiconductor section to a connection point in the first wiring layer of the first semiconductor section, and a plurality of second conductive materials that extend through the first semiconductor section to a connection point in the second wiring layer of the second semiconductor section, wherein the first and second conductive materials are each arranged alternately in both of a first direction and a second direction across the first semiconductor substrate, the first and second directions being orthogonal to each other.

2. The semiconductor device of claim 1, wherein the first and second semiconductor sections are secured together with the respective first and second wiring layer sides of the first and second semiconductor sections facing each other.

3. The semiconductor device of claim 1, wherein the first semiconductor section and the second semiconductor section are secured by plasma bonding.

4. The semiconductor device of claim 1, wherein the first semiconductor section and the second semiconductor section are secured by an adhesive.

5. The semiconductor device of claim 1, wherein the first semiconductor section includes a pixel array.

6. The semiconductor device of claim 5, wherein the second semiconductor section includes a logic circuit.

7. The semiconductor device of claim 6, wherein the pixel array and the logic circuit are electrically connected to one another.

8. The semiconductor device of claim 7, wherein the first conductive materials connect an uppermost first wiring layer of the first semiconductor section and an uppermost second wiring layer of the second semiconductor section.

9. The semiconductor device according to claim 8, wherein a surface of the first conductive materials or the second conductive materials is connected by a trench on the first semiconductor section.

10. The semiconductor device according to claim 9, further comprising a pad connected to the first conductive material and the second conductive material.

11. The semiconductor device according to claim 10, wherein the pad is exposed at an upper side of the first semiconductor section.

12. The semiconductor device according to claim 9, wherein the trench is a Cu filled trench.

13. The semiconductor device according to claim 1,
the first wiring layer includes Cu,
the second wiring layer includes Cu.

14. The semiconductor device according to claim 1, further comprising an insulating layer covering at least part of the first wiring layer or the second wiring layer.

15. The semiconductor device according to claim 14, wherein the insulating layer is SiO.

16. The semiconductor device of claim 1, wherein the first conductive material and the second conductive material includes one of W, Al, and Au.

17. The semiconductor device of claim 7, wherein the pixel array includes a photodiode and a plurality of pixel transistors.

18. The semiconductor device of claim 7, wherein the logic circuit includes a control circuit.

19. The semiconductor device of claim 1, wherein the first conductive material and the second conductive material have substantively a same diameter.

20. The semiconductor device of claim 1, wherein the first semiconductor section has a thickness smaller than that of the second semiconductor section.

21. A semiconductor device, comprising:
a first semiconductor section including at least a first wiring layer, wherein the first semiconductor section includes a pixel array;
a second semiconductor section including at least a second wiring layer, wherein the first and second semiconductor sections are secured to one another;
a plurality of connection wirings, wherein each connection wiring in the plurality of connection wirings includes a first connection conductor interconnected to a connection pad included in the first wiring layer, a second connection conductor interconnected to a connection pad included in the second wiring layer, and a link conductor interconnecting the first and second connection conductors, and wherein the first connection conductors and the second connection conductors of the plurality of connection wirings are alternately arranged in horizontal and vertical directions of the pixel array.

22. A semiconductor device, comprising:
a first semiconductor section including a first wiring layer;
a second semiconductor section including a second wiring layer, the first and second semiconductor sections being secured together;
a plurality of first conductive materials that extend through a device layer of the first semiconductor section to a connection point in the first wiring layer of the first semiconductor section, and a plurality of second conductive materials that extend through the first semiconductor section to a connection point in the second wiring layer of the second semiconductor section, and a pad connected to at least the first conductive materials and at least the second conductive materials, wherein the first and second conductive materials are each arranged alternately in both of a first direction and a second direction across the first semiconductor substrate, the first and second directions being orthogonal to each other.

* * * * *